US012201014B2

(12) United States Patent
Zhang et al.

(10) Patent No.: US 12,201,014 B2
(45) Date of Patent: Jan. 14, 2025

(54) METAL COMPLEX, ELECTROLUMINESCENT DEVICE INCLUDING THE SAME, AND USE THEREOF

(71) Applicant: BEIJING SUMMER SPROUT TECHNOLOGY CO., LTD., Beijing (CN)

(72) Inventors: Cuifang Zhang, Beijing (CN); Nannan Lu, Beijing (CN); Zhihong Dai, Beijing (CN); Chi Yuen Raymond Kwong, Beijing (CN); Chuanjun Xia, Beijing (CN)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 663 days.

(21) Appl. No.: 17/150,305

(22) Filed: Jan. 15, 2021

(65) Prior Publication Data
US 2022/0131093 A1 Apr. 28, 2022

(30) Foreign Application Priority Data

Jan. 16, 2020 (CN) .......................... 202010048228.3

(51) Int. Cl.
| | | |
|---|---|---|
| *C09K 11/06* | (2006.01) | |
| *H10K 85/30* | (2023.01) | |
| *H10K 85/60* | (2023.01) | |
| *H10K 50/15* | (2023.01) | |
| *H10K 50/16* | (2023.01) | |
| *H10K 50/18* | (2023.01) | |

(52) U.S. Cl.
CPC ......... *H10K 85/342* (2023.02); *H10K 85/631* (2023.02); *H10K 85/6572* (2023.02); *H10K 50/15* (2023.02); *H10K 50/16* (2023.02); *H10K 50/18* (2023.02)

(58) Field of Classification Search
None
See application file for complete search history.

(56) References Cited

U.S. PATENT DOCUMENTS

| | | |
|---|---|---|
| 5,703,436 A | 12/1997 | Forrest et al. |
| 5,707,745 A | 1/1998 | Forrest et al. |
| 5,844,363 A | 12/1998 | Gu et al. |
| 6,097,147 A | 8/2000 | Baldo et al. |
| 6,303,238 B1 | 10/2001 | Thompson et al. |
| 7,279,704 B2 | 10/2007 | Walters et al. |
| 7,968,146 B2 | 6/2011 | Wagner et al. |
| 2003/0072964 A1 | 4/2003 | Kwong et al. |
| 2003/0096138 A1 | 5/2003 | Lecloux et al. |
| 2003/0230980 A1 | 12/2003 | Forrest et al. |
| 2004/0174116 A1 | 9/2004 | Lu et al. |
| 2004/0241495 A1 | 12/2004 | Kwong et al. |
| 2006/0008671 A1 | 1/2006 | Kwong et al. |
| 2006/0008673 A1 | 1/2006 | Kwong et al. |
| 2007/0259205 A1 | 11/2007 | Ionkin et al. |
| 2007/0278936 A1 | 12/2007 | Herron et al. |
| 2008/0001515 A1 | 1/2008 | Iwanaga et al. |
| 2008/0074033 A1 | 3/2008 | Ionkin et al. |
| 2008/0194853 A1 | 8/2008 | Kim et al. |
| 2008/0261076 A1 | 10/2008 | Kwong et al. |
| 2009/0104472 A1 | 4/2009 | Je et al. |
| 2010/0051869 A1 | 3/2010 | Chichak et al. |
| 2010/0090591 A1 | 4/2010 | Alleyne et al. |
| 2010/0270916 A1 | 10/2010 | Xia et al. |
| 2012/0119190 A1 | 5/2012 | Alleyne et al. |
| 2012/0181511 A1 | 7/2012 | Ma et al. |
| 2012/0217868 A1 | 8/2012 | Ma et al. |
| 2013/0146848 A1 | 6/2013 | Ma et al. |
| 2013/0299795 A1 | 11/2013 | Xia et al. |
| 2013/0328019 A1 | 12/2013 | Xia et al. |
| 2014/0203265 A1 | 7/2014 | Sakuma et al. |
| 2015/0001472 A1* | 1/2015 | Boudreault .......... H10K 85/342 546/4 |
| 2015/0053939 A1 | 2/2015 | Adamovich et al. |
| 2015/0171348 A1 | 6/2015 | Stoessel et al. |
| 2015/0188061 A1 | 7/2015 | Xia et al. |
| 2015/0214494 A1 | 7/2015 | Xia et al. |
| 2015/0236277 A1* | 8/2015 | Boudreault .......... H10K 85/342 257/40 |

(Continued)

FOREIGN PATENT DOCUMENTS

| | | |
|---|---|---|
| CN | 103159798 A | 6/2013 |
| CN | 103204880 A | 7/2013 |

(Continued)

OTHER PUBLICATIONS

Uoyama, Hiroki, et al., "Highly efficient organic light-emitting diodes from delayed fluorescence", Nature, vol. 492, Dec. 13, 2012.
Tang, C.W., et al., "Organic electroluminescent diodes", Appl. Phys Lett. 51 (12), Sep. 21, 1987.
Chinese Notice of First Review Opinion for Chinese Application No. 202010048228.3, dated May 13, 2022, 14 pages with translation.
Chinese Decision of Reexamination for Chinese Application No. 202010048228.3, dated Nov. 17, 2023, 2 pages with translation.
CN Office Action Mailed on Jan. 20, 2023 for CN Application No. 202010048228, 12 page(s).
CN Office Action, including Search Report Mailed on Jun. 29, 2023 for CN Application No. 202010048228, 16 page(s).
KR Office Action Mailed on Mar. 28, 2023 for KR Application No. 10-2021-0006003, 20 page(s).
KR Office Action Mailed on Oct. 11, 2023 for KR Application No. 10-2021-0006003, 17 page(s).

(Continued)

*Primary Examiner* — Robert S Loewe
(74) *Attorney, Agent, or Firm* — Workman Nydegger

(57) ABSTRACT

Provided are a metal complex, an electroluminescent device containing the same, and a use thereof. The metal complex has a structure of $M(L_a)_m(L_b)_n$ and can more effectively fine-tune a light-emitting color and adjust an emission peak width, thereby narrowing a full width at half maximum, making the light-emitting color more saturated, and improving device efficiency, current efficiency, and external quantum efficiency.

26 Claims, 1 Drawing Sheet

(56) References Cited

U.S. PATENT DOCUMENTS

| | | | |
|---|---|---|---|
| 2015/0287933 A1 | 10/2015 | Kottas et al. |
| 2015/0295187 A1 | 10/2015 | Boudreault et al. |
| 2015/0315222 A1 | 11/2015 | Boudreault et al. |
| 2015/0349273 A1 | 12/2015 | Hung et al. |
| 2015/0357587 A1 | 12/2015 | Kishino et al. |
| 2015/0364701 A1 | 12/2015 | Horiuchi et al. |
| 2016/0028023 A1 | 1/2016 | Boudreault |
| 2016/0359122 A1 | 1/2016 | Boudreault et al. |
| 2016/0093808 A1 | 3/2016 | Adamovich et al. |
| 2016/0104848 A1 | 4/2016 | Boudreault et al. |
| 2016/0111661 A1 | 4/2016 | Boudreault et al. |
| 2016/0190486 A1 | 6/2016 | Lin et al. |
| 2017/0018718 A1 | 1/2017 | Jang et al. |
| 2017/0084849 A1 | 3/2017 | Tsai et al. |
| 2017/0092880 A1 | 3/2017 | Boudreault et al. |
| 2017/0098788 A1 | 4/2017 | Lee et al. |
| 2017/0098789 A1 | 4/2017 | Boudreault et al. |
| 2017/0229663 A1 | 8/2017 | Tsai et al. |
| 2017/0288157 A1 | 10/2017 | Joseph et al. |
| 2017/0365799 A1 | 12/2017 | Ji et al. |
| 2017/0365800 A1 | 12/2017 | Tsai et al. |
| 2017/0365801 A1 | 12/2017 | Margulies et al. |
| 2018/0013077 A1 | 1/2018 | Boudreault et al. |
| 2018/0051007 A1 | 2/2018 | Jung et al. |
| 2018/0066180 A1 | 3/2018 | Huh et al. |
| 2018/0086775 A1 | 3/2018 | Hong et al. |
| 2018/0134954 A1 | 5/2018 | Tsai et al. |
| 2018/0190914 A1 | 7/2018 | Tsai et al. |
| 2018/0190915 A1 | 7/2018 | Ji et al. |
| 2018/0240988 A1 | 8/2018 | Boudreault et al. |
| 2018/0277774 A1 | 9/2018 | Boudreault et al. |
| 2018/0323382 A1* | 11/2018 | Boudreault .......... H10K 85/342 |
| 2018/0337348 A1 | 11/2018 | Jung et al. |
| 2019/0067598 A1 | 2/2019 | Li et al. |
| 2019/0077818 A1 | 3/2019 | Xia |
| 2019/0103574 A1 | 4/2019 | Xia |
| 2019/0127406 A1 | 5/2019 | Xia |
| 2019/0165283 A1 | 5/2019 | Boudreault et al. |
| 2019/0194234 A1 | 6/2019 | Xia |
| 2019/0237683 A1 | 8/2019 | Boudreault et al. |
| 2019/0248818 A1 | 8/2019 | Boudreault |
| 2019/0252619 A1 | 8/2019 | Tsai et al. |
| 2019/0252627 A1 | 8/2019 | Joseph et al. |
| 2019/0326525 A1 | 10/2019 | Kim et al. |
| 2020/0006675 A1 | 1/2020 | Ma et al. |
| 2020/0044166 A1* | 2/2020 | Cho .................... A61P 35/00 |
| 2020/0075870 A1* | 3/2020 | Boudreault .......... H10K 85/346 |
| 2020/0099000 A1 | 3/2020 | Zhang et al. |
| 2020/0251666 A1 | 8/2020 | Cai et al. |
| 2020/0308201 A1* | 10/2020 | Lee ................ H10K 85/6576 |
| 2020/0354391 A1 | 11/2020 | Zhang et al. |
| 2020/0358010 A1 | 11/2020 | Lu et al. |
| 2020/0358011 A1 | 11/2020 | Lu et al. |
| 2021/0115069 A1 | 4/2021 | Dai et al. |
| 2021/0242411 A1 | 8/2021 | Liu et al. |
| 2023/0107413 A1 | 4/2023 | Tsai et al. |

FOREIGN PATENT DOCUMENTS

| | | |
|---|---|---|
| CN | 104022232 A | 9/2014 |
| CN | 108191916 A | 6/2018 |
| CN | 109438521 A | 3/2019 |
| CN | 109467575 A | 3/2019 |
| CN | 109575083 | 4/2019 |
| CN | 109651444 A | 4/2019 |
| CN | 109721628 | 5/2019 |
| CN | 109956977 | 7/2019 |
| CN | 110016058 A | 7/2019 |
| CN | 110283216 | 9/2019 |
| CN | 111909214 A | 11/2020 |
| CN | 112679548 A | 4/2021 |
| EP | 2940098 | 4/2015 |
| EP | 2907820 | 8/2015 |
| EP | 3007244 | 4/2016 |
| JP | 10-158639 A | 6/1998 |
| JP | 2005-508437 A | 3/2005 |
| JP | 2008-532998 A | 8/2008 |
| JP | 2009-539768 A | 11/2009 |
| JP | 2010-516622 A | 5/2010 |
| JP | 2012-525405 A | 10/2012 |
| JP | 2013-121957 A | 6/2013 |
| JP | 2015-010093 A | 1/2015 |
| JP | 2015-530982 A | 10/2015 |
| JP | 2020-186234 A | 11/2020 |
| JP | 2020-186235 A | 11/2020 |
| JP | 2020-186236 A | 11/2020 |
| KR | 10-2006-0097320 A | 9/2006 |
| KR | 10-2009-0039464 A | 4/2009 |
| KR | 10-2011-0077350 A | 7/2011 |
| KR | 10-2013-0110934 A | 10/2013 |
| KR | 10-2016-0041771 A | 4/2016 |
| KR | 10-2017-0142949 A | 12/2017 |
| KR | 10-2018-0065353 A | 6/2018 |
| KR | 10-2019-0064478 A | 6/2019 |
| KR | 10-2020-0068559 A | 6/2020 |
| KR | 10-2020-0115010 A | 10/2020 |
| KR | 10-2020-0130660 A | 11/2020 |
| KR | 10-2020-0130661 A | 11/2020 |
| KR | 10-2020-0130667 A | 11/2020 |
| WO | 02/44189 A1 | 6/2002 |
| WO | 2006/095951 A1 | 9/2006 |
| WO | 2007/143201 A1 | 12/2007 |
| WO | 2018/084189 A1 | 5/2018 |
| WO | 2018/105986 A1 | 6/2018 |
| WO | 2018/124697 A1 | 7/2018 |

OTHER PUBLICATIONS

Kawanishi Y. et al., "Deuterium Compounds for Electronic Devices", Organic Square 36, 2011, p. 21.

Yoko Sugiyama, "Development of Deuterated Phosphorescent Probe", Taiyo Nippon Sanso Technical Report, No. 36, 2017, pp. 8. (English abstract available).

Chinese Notice of Grant for CN 202010048228.3, issued in the Chinese Patent office on Jan. 2, 2024 (English Translation Provided).

Korean Notice of Grant for KR10-2021-0006003, issued in the Korean Patent Office on Jun. 25, 2024 (English Translation Provided).

* cited by examiner

METAL COMPLEX, ELECTROLUMINESCENT DEVICE INCLUDING THE SAME, AND USE THEREOF

CROSS-REFERENCE TO RELATED APPLICATION(S)

This application claims the benefit of Chinese Patent Application No. CN 202010048228.3, filed Jan. 16, 2020, the disclosure of which is incorporated herein by reference in its entirety.

TECHNICAL FIELD

The present disclosure belongs to the field of organic electroluminescent materials and relates to a metal complex, an electroluminescent device including the same, and a use thereof.

BACKGROUND

Organic electronic devices include, but are not limited to, the following types: organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (Applied Physics Letters, 1987, 51 (12): 913-915). Once a bias is applied to the device, green light was emitted from the device. This device laid the foundation for the development of modern organic light-emitting diodes (OLEDs). State-of-the-art OLEDs may comprise multiple layers such as charge injection and transporting layers, charge and exciton blocking layers, and one or multiple emissive layers between the cathode and anode. Since the OLED is a self-emitting solid state device, it offers tremendous potential for display and lighting applications. In addition, the inherent properties of organic materials, such as their flexibility, may make them well suited for particular applications such as fabrication on flexible substrates.

The OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of the fluorescent OLED is only 25%. This limitation hindered the commercialization of OLED. In 1997, Forrest and Thompson reported phosphorescent OLED, which uses triplet emission from heavy metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. A small molecule refers to any organic or organometallic material that is not a polymer. The molecular weight of the small molecule can be large as long as it has well defined structure. Dendrimers with well-defined structures are considered as small molecules. Polymer OLEDs include conjugated polymers and non-conjugated polymers with pendant emitting groups. Small molecule OLED can become the polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of the OLED can be achieved by emitter structural design. An OLED may comprise one emitting layer or a plurality of emitting layers to achieve desired spectrum. In the case of green, yellow, and red OLEDs, phosphorescent emitters have successfully reached commercialization. Blue phosphorescent device still suffers from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

CN 110283216 A discloses a metal complex having a structure of

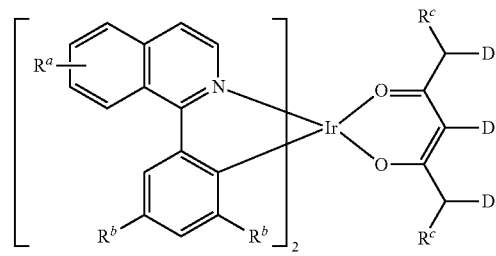

in which the C^N ligand is a 2-phenylisoquinoline-based structure and the dione ligand is a trideuterated ancillary ligand. Although the introduction of an isotope atom into the dione-based ancillary ligand improves the performance of the organic light-emitting material, it is difficult to ensure the number and positions of isotopes introduced during preparation, which makes it difficult to prepare such a material. In addition, application of a dione ligand without deuterium substitutions has not been disclosed or taught.

US20190237683A1 has disclosed a metal complex having a structure of

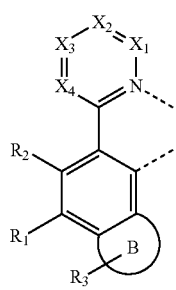

in which the ring B is an aromatic ring fused to the benzene ring. The metal complex includes an ancillary ligand having a structure of

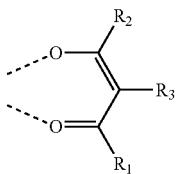

in which $R_1$ and $R_2$ are substituted or unsubstituted alkyl or substituted or unsubstituted cycloalkyl. Although the introduction of cycloalkyl-substituted alkylene into a dione-based ancillary ligand improves the performance of an organic light-emitting material, the disclosed C^N ligand has to contain a fused aromatic ring structure formed by fusing a benzene ring to the ring B. The use of a C^N ligand having a monocyclic (hetero) aromatic ring structure, such as a benzene ring structure, in combination with a dione-based ancillary ligand has not been disclosed or taught.

US 2019/0248818 A1 discloses a metal complex including a ligand having a structure of

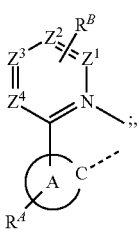

where at least two consecutive of $Z^1$ to $Z^4$ are C and are fused to a structure of

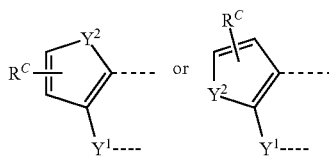

Apparently, the disclosed complex has to include a C^N ligand having a 6-membered-fused-5-membered aromatic heterocyclic ring structure. The use of a C^N ligand having a 6-membered-fused-6-membered aromatic heterocyclic ring structure, such as a quinoline ring or an isoquinoline ring, in combination with a dione-based ancillary ligand has not been disclosed or taught. The metal complexes formed by such ligands included in this patent have a relatively large full width at half maximum and a relatively high voltage, which limits the application of materials.

US 2019/0252619 A1 discloses a metal complex including a ligand having a structure of

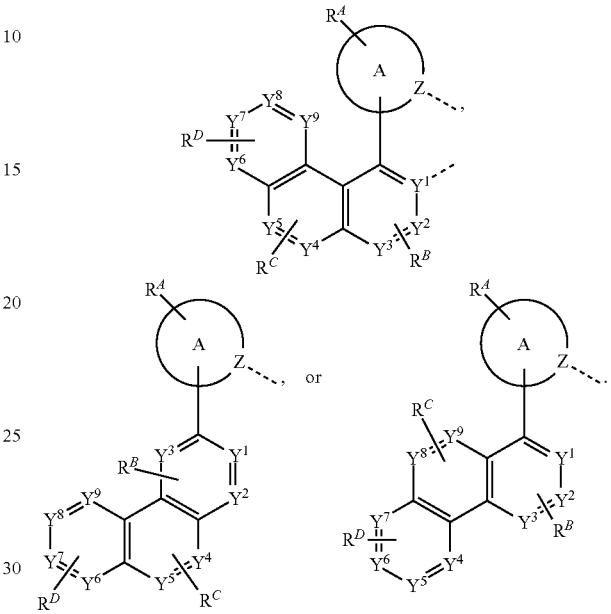

Apparently, the complex has to include a ligand having a phenanthrene or azaphenanthrene structure. The use of a C^N ligand having a monocyclic (hetero) aromatic ring structure, such as a benzene ring structure, in combination with a dione ancillary ligand has not been disclosed or taught. Such structures have too low light-emitting efficiency despite a relatively long service life.

US 2019/0252627 A1 disclosea a metal complex including a structure of

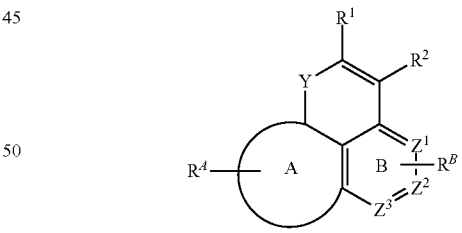

in which the ring A is a five- or six-membered carbocyclic or heterocyclic ring and Y is a single bond, O, S, Se, NR, CRR', SiRR', or GeRR'. Apparently, the disclosed complex has to include a ligand having a multi-fused ring structure such as acenaphthylene, heteroacenaphthylene, phenalene, heterophenalene, or similar structures. The use of a C^N ligand having a 6-membered-fused-6-membered aromatic heterocyclic ring structure, such as a quinoline ring or an isoquinoline ring, in combination with a dione-based ancillary ligand has not been disclosed or taught. The metal complexes included in this patent belong to infrared luminescent materials, which limits the application of such materials.

Ancillary ligands of phosphorescent materials can be used for fine-tuning the emission wavelength, improving material properties, and increasing the efficiency of materials. Existing ancillary ligands such as acetylacetone ligands, especially acetylacetone ligands containing branched alkyl branches, have achieved some effects in controlling the properties described above, but the performance of the phosphorescent materials needs to be further improved to meet the increasing requirements on the performance, especially to provide a more effective means of controlling the emission wavelength and a method for improving the overall performance of materials and devices.

These ligands currently reported can fine-tune the emission wavelength to a certain extent but have limitations in terms of more effectively fine-tuning an emission peak width and improving device efficiency. Therefore, it is desired in the art to develop materials capable of more effectively fine-tuning the emission peak width and improving the device efficiency.

SUMMARY

In view of the defects in the related art, an object of the present disclosure is to provide a metal complex, an electroluminescent device including the same, and a use thereof. The metal complex of the present disclosure can more effectively fine-tune the light-emitting color and adjust the emission peak width, thereby narrowing the full width at half maximum, making the light-emitting color more saturated, and improving device efficiency.

To achieve the object, the present disclosure adopts solutions described below.

A first object of the present disclosure is to provide a metal complex having a structure of $M(L_a)_m(L_b)_n$;

wherein, the metal M is a metal whose relative atomic mass is greater than 40, $L_a$ and $L_b$ are the first ligand and the second ligand of the metal complex, and $L_a$ and $L_b$ can be optionally joined to form a multidentate ligand;

m is 1 or 2, n is 1 or 2, and m+n equals an oxidation state of the metal M;

when m is 2, both of $L_a$ are identical or different; when n is 2, both of $L_b$ are identical or different;

the first ligand $L_a$ has a structure represented by Formula 1:

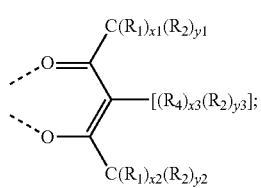

Formula 1 wherein,
x1=0, 1, 2, or 3, y1=0, 1, 2, or 3, and x1+y1=3;
x2=0, 1, 2, or 3, y2=0, 1, 2, or 3, and x2+y2=3;
x3=0 or 1, y3=0 or 1, and x3+y3=1; and
y1+y2+y3≥1;

$R_1$ is, at each occurrence identically or differently, selected from hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, or a combination thereof, $R_2$ is, at each occurrence identically or differently, selected from -L-$R_3$, wherein L is, at each occurrence identically or differently, selected from a single bond, a substituted or unsubstituted alkylene group having 1 to 20 carbon atoms, a substituted or unsubstituted cycloalkylene group having 3 to 20 ring carbon atoms, a substituted or unsubstituted heteroalkylene group having 1 to 20 carbon atoms, a substituted or unsubstituted arylene group having 6 to 30 carbon atoms, or a substituted or unsubstituted heteroarylene group having 3 to 30 carbon atoms; and $R_3$ represents substituted or unsubstituted cycloalkyl having 3 to 20 ring carbon atoms;

$R_4$ is, at each occurrence identically or differently, selected from hydrogen, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, or a combination thereof, wherein adjacent substituents $R_1$, $R_4$ can be optionally joined to form a ring;

$L_b$ is, at each occurrence identically or differently, selected from a structure represented by Formula 2, Formula 3, or Formula 4:

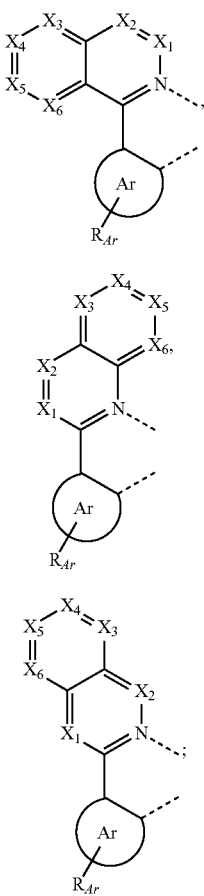

Formula 2

Formula 3

Formula 4 wherein, $X_1$ and $X_2$ are, at each occurrence identically or differently, selected from $CR_x$ or N; and $X_3$, $X_4$, $X_5$, and $X_6$ are, at each occurrence identically or differently, selected from $CR_y$ or N; wherein adjacent substituents $R_x$ can be optionally joined to form a ring, and adjacent substituents $R_y$ can be optionally joined to form a ring;

wherein, the ring Ar is a five-membered aromatic ring, a six-membered aromatic ring, a five-membered heteroaromatic ring, or a six-membered heteroaromatic ring;

wherein, $R_{Ar}$ represents mono-substitution, multi-substitution, or no substitution;

$R_x$, $R_y$, and $R_{Ar}$ are, at each occurrence identically or differently, selected from hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, or a combination thereof, and wherein when a substituent $R_{Ar}$ is selected from a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted amino group having 0 to 20 carbon atoms, a sulfanyl group, or a substituted or unsubstituted aryloxy group having 6 to 30 carbon atoms, adjacent substituents $R_{Ar}$ can be optionally joined to form a ring.

A second object of the present disclosure is to provide a compound formulation including the metal complex described in the first object.

A third object of the present disclosure is to provide an electroluminescent device including an anode, a cathode, and an organic layer disposed between the anode and the cathode, where the organic layer includes the metal complex described in the first object.

A fourth object of the present disclosure is to provide a use of the electroluminescent device described in the third object, where the electroluminescent device is applied to any one of an electronic device, an electronic element module, an organic light-emitting device, or a lighting panel.

Compared with the related art, the present disclosure has beneficial effects described below:

The metal complex provided by the present disclosure can more effectively fine-tune the light-emitting color and adjust the emission peak width, thereby narrowing the full width at half maximum, making the light-emitting color more saturated, improving the device efficiency, current efficiency (CE), and external quantum efficiency (EQE).

DETAILED DESCRIPTION

Figure 1:
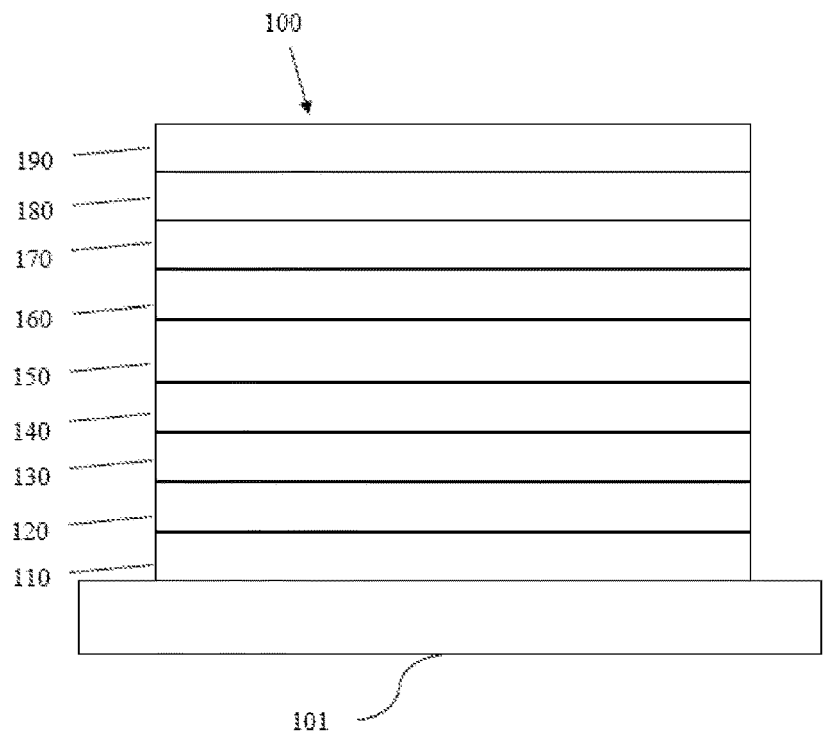
FIG. 1 is a schematic diagram of an organic light-emitting apparatus 100 that may include a metal complex and a compound formulation disclosed by the present disclosure.

The technical solutions of the present disclosure are further described below through specific embodiments. Those skilled in the art should understand that the examples described herein are used for a better understanding of the present disclosure and should not be construed as specific limitations to the present disclosure.

In a specific embodiment, the present disclosure provides a metal complex having a structure of $M(L_a)_m(L_b)_n$;

wherein, the metal M is a metal whose relative atomic mass is greater than 40, $L_a$ and $L_b$ are the first ligand and the second ligand of the metal complex, and $L_a$ and $L_b$ can be optionally joined to form a multidentate ligand;

m is 1 or 2, n is 1 or 2, and m+n equals an oxidation state of the metal M;

when m is 2, both of $L_a$ are identical or different; when n is 2, both of $L_b$ are identical or different;

the first ligand $L_a$ has a structure represented by Formula 1:

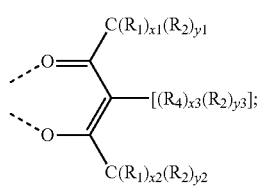

Formula 1 wherein,
x1=0, 1, 2, or 3, y1=0, 1, 2, or 3, and x1+y1=3;
x2=0, 1, 2, or 3, y2=0, 1, 2, or 3, and x2+y2=3;
x3=0 or 1, y3=0 or 1, and x3+y3=1; and
y1+y2+y3≥1;

$R_1$ is, at each occurrence identically or differently, selected from hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, or a combination thereof, $R_2$ is, at each occurrence identically or differently, selected from -L-$R_3$, wherein L is, at each occurrence identically or differently, selected from a single bond, a substituted or unsubstituted alkylene group having 1 to 20 carbon atoms, a substituted or unsubstituted cycloalkylene group having 3 to 20 ring carbon atoms, a substituted or unsubstituted heteroalkylene group having 1 to 20 carbon atoms, a substituted or unsubstituted arylene group having 6 to 30 carbon atoms, or a substituted or unsubstituted heteroarylene group having 3 to 30 carbon atoms; and $R_3$ represents substituted or unsubstituted cycloalkyl having 3 to 20 ring carbon atoms;

$R_4$ is, at each occurrence identically or differently, selected from hydrogen, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, or a combination thereof, wherein adjacent substituents $R_1$, $R_4$ can be optionally joined to form a ring;

$L_b$ is, at each occurrence identically or differently, selected from a structure represented by Formula 2, Formula 3, or Formula 4:

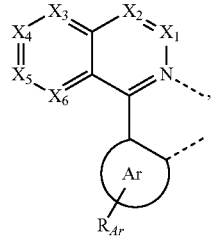

Formula 2

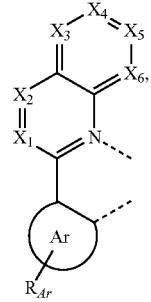

Formula 3

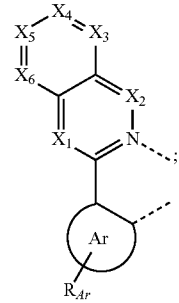

Formula 4 wherein, $X_1$ and $X_2$ are, at each occurrence identically or differently, selected from $CR_x$ or N; and $X_3$, $X_4$, $X_5$, and $X_6$ are, at each occurrence identically or differently, selected from $CR_y$ or N; wherein adjacent substituents $R_x$ can be optionally joined to form a ring, and adjacent substituents $R_y$ can be optionally joined to form a ring;

wherein, the ring Ar is a five-membered aromatic ring, a six-membered aromatic ring, a five-membered heteroaromatic ring, or a six-membered heteroaromatic ring;

wherein, $R_{Ar}$ represents mono-substitution, multi-substitution, or no substitution;

$R_x$, $R_y$, and $R_{Ar}$ are, at each occurrence identically or differently, selected from hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, or a combination thereof, and wherein when a substituent $R_{Ar}$ is selected from a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted amino group having 0 to 20 carbon atoms, a sulfanyl group, or a substituted or unsubstituted aryloxy group having 6 to 30 carbon atoms, adjacent substituents $R_{Ar}$ can be optionally joined to form a ring.

In this embodiment, the expressions that "adjacent substituents $R_x$ can be optionally joined to form a ring" and "adjacent substituents $R_y$ can be optionally joined to form a ring" are intended to mean that adjacent substituents $R_x$ can be joined to form a ring or may not be joined to form a ring, adjacent substituents $R_y$ can be joined to form a ring or may not be joined to form a ring, and substituents $R_x$ and $R_y$ are not joined to form a ring.

In this embodiment, the expression that "when the substituent $R_{Ar}$ is selected from a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted amino group having 0 to 20 carbon atoms, a sulfanyl group, or a substituted or unsubstituted aryloxy group having 6 to 30 carbon atoms, adjacent substituents $R_{Ar}$ can be optionally joined to form a ring" is intended to mean that only when the substituent $R_{Ar}$ is selected from alkyl, cycloalkyl, heteroalkyl, arylalkyl, alkoxy, amino, sulfanyl, or aryloxy, can adjacent substituents $R_{Ar}$ be joined to form a ring, and when the substituent $R_{Ar}$ is selected from other substituents, adjacent substituents $R_{Ar}$ are not joined to form a ring. Apparently, when the substituent $R_{Ar}$ is selected from alkyl, cycloalkyl, heteroalkyl, arylalkyl, alkoxy, amino, sulfanyl, or aryloxy, adjacent substituents $R_{Ar}$ may not be joined to form a ring.

In this embodiment, the expression that "adjacent substituents $R_1$, $R_4$ can be optionally joined to form a ring" is intended to mean that when multiple substituents $R_1$ are present, adjacent substituents $R_1$ can be optionally joined to form a ring, and when substituents $R_1$ and $R_4$ are present at the same time, $R_1$ and $R_4$ can be optionally joined to form a ring. Apparently, these substituents may not be joined to form a ring.

In some specific embodiments, the metal M is selected from Ir, Rh, Re, Os, Pt, Au, or Cu.

In a specific embodiment, the metal M is selected from Ir or Pt.

In a specific embodiment, the metal M is selected from Ir.

In the present disclosure, when a substituent is selected from hydrogen, the hydrogen refers to its isotope protium (H) rather than other isotopes deuterium or tritium.

In some specific embodiments, $R_1$ and $R_4$ are, at each occurrence identically or differently, selected from hydrogen, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, or a combination thereof. In these embodiments, when the substituent is selected from hydrogen, the hydrogen refers to its isotope protium (H) rather than other isotopes deuterium or tritium.

In a specific embodiment of the present disclosure, in Formulas 2 to 4, at least one of $X_1$, $X_2$, $X_3$, $X_4$, $X_5$, and $X_6$ is N.

In a specific embodiment of the present disclosure, in Formulas 2 to 4, one of $X_1$, $X_2$, $X_3$, $X_4$, $X_5$, and $X_6$ is N.

In a specific embodiment of the present disclosure, in Formulas 2 to 4, one of $X_1$ and $X_2$ is N.

In a specific embodiment of the present disclosure, in Formulas 2 to 4, $X_1$ and $X_2$ are, at each occurrence identically or differently, selected from $CR_x$, and $X_3$, $X_4$, $X_5$, and $X_6$ are, at each occurrence identically or differently, selected from $CR_y$.

In a specific embodiment of the present disclosure, in Formulas 2 to 4, $X_1$ and $X_2$ are, at each occurrence identically or differently, selected from $CR_x$ or N; and $X_3$, $X_4$, $X_5$, and $X_6$ are, at each occurrence identically or differently, selected from $CR_y$ or N; wherein adjacent substituents $R_x$ are not joined to form a ring, and adjacent substituents $R_y$ are not joined to form a ring.

In a specific embodiment of the present disclosure, in Formulas 2 to 4, the ring Ar is a six-membered aromatic ring.

In a specific embodiment of the present disclosure, in Formulas 2 to 4, the ring Ar is a benzene ring.

In a specific embodiment of the present disclosure, the ligand $L_b$ is, at each occurrence identically or differently, selected from following structures:

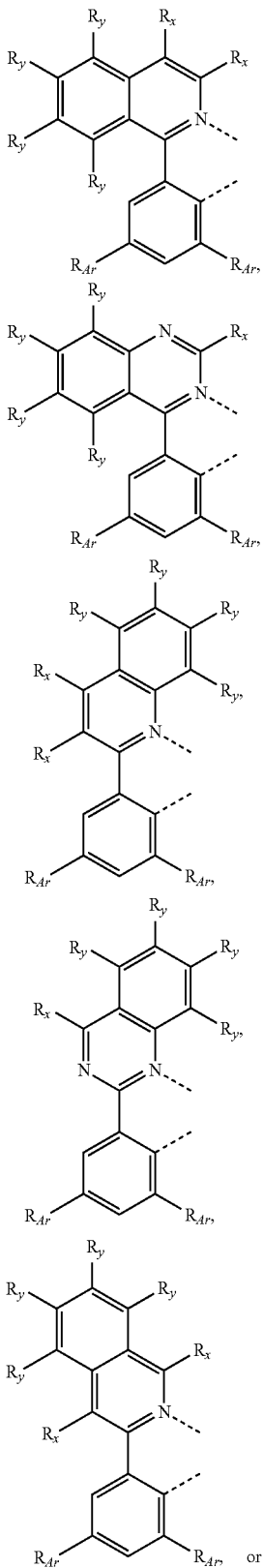

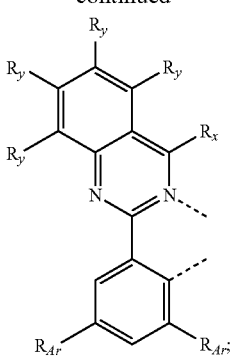

wherein $R_x$ and $R_y$ are, at each occurrence identically or differently, selected from hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted alkylsilyl group having 3 to 20 carbon atoms, a substituted or unsubstituted arylsilyl group having 6 to 20 carbon atoms, a cyano group, or a combination thereof; and wherein $R_{Ar}$ is, at each occurrence identically or differently, selected from hydrogen, deuterium, halogen, a substituted or unsubstituted alkyl group having 1 to 20 carbon atoms, a substituted or unsubstituted heteroalkyl group having 1 to 20 carbon atoms, a substituted or unsubstituted aryl group having 6 to 30 carbon atoms, or a combination thereof.

In a specific embodiment of the present disclosure, the ligand $L_b$ is, at each occurrence identically or differently, selected from following structures:

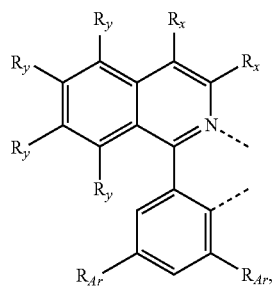

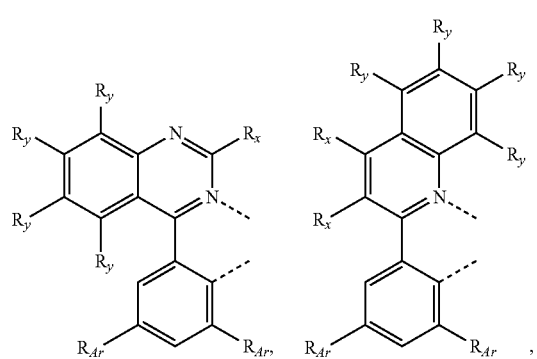

-continued

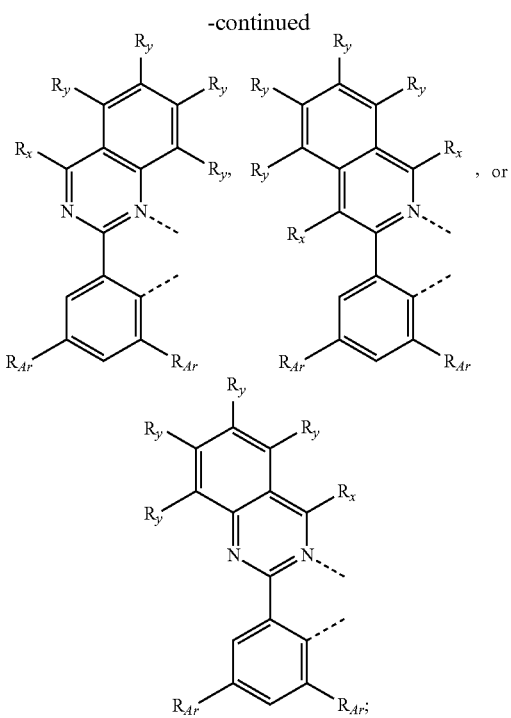

wherein $R_x$ and $R_y$ are selected from hydrogen, deuterium, methyl, isopropyl, isobutyl, cyclopentyl, 4,4-dimethylcyclohexyl, 4,4-diethylcyclohexyl, 4-oxocyclohexyl, trimethylsilyl, dimethylisopropylsilyl, dimethylphenylsilyl, cyano, or a combination thereof; and at least one of $R_x$ or $R_y$ is not hydrogen; and wherein $R_{Ar}$ is selected from hydrogen, deuterium, methyl, isopropyl, t-butyl, cyclopentyl, cyclohexyl, phenyl, or a combination thereof, and at least one $R_{Ar}$ is not hydrogen.

In a specific embodiment of the present disclosure, L is, at each occurrence identically or differently, selected from a single bond, a substituted or unsubstituted alkylene group having 1 to 20 carbon atoms, or a substituted or unsubstituted cycloalkylene group having 3 to 20 ring carbon atoms.

In a specific embodiment of the present disclosure, L is, at each occurrence identically or differently, selected from a single bond, methylene, or ethylene.

In a specific embodiment of the present disclosure, $R_3$ is, at each occurrence identically or differently, selected from a substituted or unsubstituted cycloalkyl group having 3 to 6 ring carbon atoms.

In a specific embodiment of the present disclosure, $R_3$ is, at each occurrence identically or differently, selected from cyclopropyl, cyclobutyl, cyclopentyl, or cyclohexyl.

In a specific embodiment of the present disclosure, y1 is 1, y2 is 0, and y3 is 0; y1 is 1, y2 is 1, and y3 is 0; y1 is 0, y2 is 0, and y3 is 1; y1 is 2, y2 is 0, and y3 is 0; y1 is 2, y2 is 1, and y3 is 0; or y1 is 2, y2 is 2, and y3 is 0.

In another specific embodiment of the present disclosure, $L_a$ is, at each occurrence identically or differently, selected from the group consisting of $L_{a1}$ to $L_{a1430}$, wherein the specific structures of $L_{a1}$ to $L_{a1430}$ are referred to claim 12.

In another specific embodiment of the present disclosure, $L_b$ is, at each occurrence identically or differently, selected from the group consisting of $L_{b1}$ to $L_{b531}$, wherein the specific structures of $L_{b1}$ to $L_{b531}$ are referred to claim 13.

In another specific embodiment of the present disclosure, hydrogen in $L_{b1}$ to $L_{b531}$ may be partially or fully substituted with deuterium.

In another specific embodiment of the present disclosure, the metal complex is selected from the group consisting of Metal complex 1 to Metal complex 180, wherein Metal complex 1 to Metal complex 180 each have a structure of $Ir(L_a)(L_b)_2$, wherein two $L_b$ are identical, and the specific structures of Metal complex 1 to Metal complex 180 are referred to claim 14.

In another specific embodiment of the present disclosure, the metal complex is selected from the group consisting of Metal complex 181 to Metal complex 205, wherein Metal complex 181 to Metal complex 205 each have a structure of $Ir(L_a)(L_b)_2$, wherein two $L_b$ are different, and the specific structures of Metal complex 181 to Metal complex 205 are referred to claim 14.

Definition of Terms of Substituents

Halogen or halide—as used herein includes fluorine, chlorine, bromine, and iodine.

Alkyl—contemplates both straight and branched chain alkyl groups. Examples of the alkyl group include methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 2-methylpentyl group, 1-pentylhexyl group, 1-butylpentyl group, 1-heptyloctyl group, and 3-methylpentyl group. Additionally, the alkyl group may be optionally substituted. The carbons in the alkyl chain can be replaced by other hetero atoms. Of the above, preferred are methyl group, ethyl group, propyl group, isopropyl group, n-butyl group, s-butyl group, isobutyl group, t-butyl group, n-pentyl group, and neopentyl group.

Cycloalkyl—as used herein contemplates cyclic alkyl groups. Preferred cycloalkyl groups are those containing 4 to 10 ring carbon atoms and includes cyclobutyl, cyclopentyl, cyclohexyl, 4-methylcyclohexyl, 4,4-dimethylcylcohexyl, 1-adamantyl, 2-adamantyl, 1-norbornyl, 2-norbornyl and the like. Additionally, the cycloalkyl group may be optionally substituted. The carbons in the ring can be replaced by other hetero atoms.

Alkenyl—as used herein contemplates both straight and branched chain alkene groups. Preferred alkenyl groups are those containing 2 to 15 carbon atoms. Examples of the alkenyl group include vinyl group, allyl group, 1-butenyl group, 2-butenyl group, 3-butenyl group, 1,3-butandienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl1-butenyl group, and 3-phenyl-1-butenyl group. Additionally, the alkenyl group may be optionally substituted.

Alkynyl—as used herein contemplates both straight and branched chain alkyne groups. Preferred alkynyl groups are those containing 2 to 15 carbon atoms. Additionally, the alkynyl group may be optionally substituted.

Aryl or aromatic group—as used herein includes noncondensed and condensed systems. Preferred aryl groups are those containing six to sixty carbon atoms, preferably six to twenty carbon atoms, more preferably six to twelve carbon atoms. Examples of the aryl group include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Additionally, the aryl group may be optionally substituted. Examples of the non-condensed aryl group include phenyl group, biphenyl-2-yl group, biphenyl-3-yl group, biphenyl-4-yl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 4'-methylbiphenylyl group, 4"-t-butyl p-terphenyl-4-yl group, o-cumenyl group, m-cumenyl group, p-cumenyl group, 2,3-xylyl group, 3,4-xylyl group, 2,5-xylyl group, mesityl group, and m-quarterphenyl group.

Heterocyclic group or heterocycle—as used herein includes aromatic and non-aromatic cyclic groups. Heteroaromatic also means heteroaryl. Preferred non-aromatic heterocyclic groups are those containing 3 to 7 ring atoms which include at least one hetero atom such as nitrogen, oxygen, and sulfur. The heterocyclic group can also be an aromatic heterocyclic group having at least one heteroatom selected from nitrogen atom, oxygen atom, sulfur atom, and selenium atom.

Heteroaryl—as used herein includes noncondensed and condensed hetero-aromatic groups that may include from one to five heteroatoms. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—it is represented by —O-Alkyl. Examples and preferred examples thereof are the same as those described above. Examples of the alkoxy group having 1 to 20 carbon atoms, preferably 1 to 6 carbon atoms include methoxy group, ethoxy group, propoxy group, butoxy group, pentyloxy group, and hexyloxy group. The alkoxy group having 3 or more carbon atoms may be linear, cyclic or branched.

Aryloxy—it is represented by —O-Aryl or —O-heteroaryl. Examples and preferred examples thereof are the same as those described above. Examples of the aryloxy group having 6 to 40 carbon atoms include phenoxy group and biphenyloxy group.

Arylalkyl—as used herein contemplates an alkyl group that has an aryl substituent. Additionally, the arylalkyl group may be optionally substituted. Examples of the arylalkyl group include benzyl group, 1-phenylethyl group, 2-phenylethyl group, 1-phenylisopropyl group, 2-phenylisopropyl group, phenyl-t-butyl group, alpha.-naphthylmethyl group, 1-alpha.-naphthylethyl group, 2-alpha-naphthylethyl group, 1-alpha-naphthylisopropyl group, 2-alpha-naphthylisopropyl group, beta-naphthylmethyl group, 1-beta-naphthylethyl group, 2-beta-naphthylethyl group, 1-beta-naphthylisopropyl group, 2-beta-naphthylisopropyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro-2-phenylisopropyl group. Of the above, preferred are benzyl group, p-cyanobenzyl group, m-cyanobenzyl group, o-cyanobenzyl group, 1-phenylethyl group, 2-phenylethyl group, 1-phenylisopropyl group, and 2-phenylisopropyl group.

The term "aza" in azadibenzofuran, aza-dibenzothiophene, etc. means that one or more of the C—H groups in the respective aromatic fragment are replaced by a nitrogen atom. For example, azatriphenylene encompasses dibenzo[f,h]quinoxaline, dibenzo[f,h]quinoline and other analogues with two or more nitrogens in the ring system. One of ordinary skill in the art can readily envision other nitrogen analogs of the aza-derivatives described above, and all such analogs are intended to be encompassed by the terms as set forth herein.

In the present disclosure, unless otherwise defined, when any term of the group consisting of substituted alkyl, substituted cycloalkyl, substituted heteroalkyl, substituted arylalkyl, substituted alkoxy, substituted aryloxy, substituted alkenyl, substituted aryl, substituted heteroaryl, substituted alkylsilyl, substituted arylsilyl, substituted amine, substituted acyl, substituted carbonyl, substituted carboxylic acid group, substituted ester group, substituted sulfinyl, substituted sulfonyl and substituted phosphino is used, it means that any group of alkyl, cycloalkyl, heteroalkyl, arylalkyl, alkoxy, aryloxy, alkenyl, aryl, heteroaryl, alkylsilyl, arylsilyl, amine, acyl, carbonyl, carboxylic acid group, ester group, sulfinyl, sulfonyl and phosphino may be substituted with one or more groups selected from the group consisting of deuterium, a halogen, an unsubstituted alkyl group having 1 to 20 carbon atoms, an unsubstituted cycloalkyl group having 3 to 20 ring carbon atoms, an unsubstituted heteroalkyl group having 1 to 20 carbon atoms, an unsubstituted arylalkyl group having 7 to 30 carbon atoms, an unsubstituted alkoxy group having 1 to 20 carbon atoms, an unsubstituted aryloxy group having 6 to 30 carbon atoms, an unsubstituted alkenyl group having 2 to 20 carbon atoms, an unsubstituted aryl group having 6 to 30 carbon atoms, an unsubstituted heteroaryl group having 3 to 30 carbon atoms, an unsubstituted alkylsilyl group having 3 to 20 carbon atoms, an unsubstituted arylsilyl group having 6 to 20 carbon atoms, an unsubstituted amino group having 0 to 20 carbon atoms, an acyl group, a carbonyl group, a carboxylic acid group, an ester group, a cyano group, an isocyano group, a sulfanyl group, a sulfinyl group, a sulfonyl group and a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In the compounds mentioned in the present disclosure, multiple substitutions refer to a range that includes a double substitution, up to the maximum available substitutions. When a substitution in the compounds mentioned in the present disclosure represents multiple substitutions (including di, tri, tetra substitutions etc.), that means the substituent may exist at a plurality of available substitution positions on its linking structure, the substituents present at a plurality of available substitution positions may be the same structure or different structures.

In the present disclosure, the defined range of the number of atoms in a group, such as 3 to 30 carbon atoms or 6 to 20 carbon atoms, refers to that the number of atoms in the group includes each integer within the given numerical range, where when referring to a substituted or unsubstituted group having a defined numerical range of carbon atoms or a substituted or unsubstituted group having a defined numerical range of ring atoms, the "defined numerical range" of atoms refers to the selectable range of the number of carbon atoms or ring atoms when the group is unsubstituted. For example, when referring to "a substituted or unsubstituted alkyl group having 1 to 20 carbon atoms", it means that the alkyl group has 1 to 20 carbon atoms when unsubstituted. In another example, when referring to "a substituted or unsubstituted cycloalkyl group having 3 to 20 ring carbon atoms", it means that the cycloalkyl group has 3 to 20 ring carbon atoms when unsubstituted.

In the compounds mentioned in the present disclosure, adjacent substituents in the compounds cannot connect to form a ring unless otherwise explicitly defined, for example, adjacent substituents can be optionally joined to form a ring. In the compounds mentioned in the present disclosure, adjacent substituents can be optionally joined to form a ring, including both the case where adjacent substituents can be joined to form a ring, and the case where adjacent substituents are not joined to form a ring. When adjacent substituents can be optionally joined to form a ring, the ring formed may be monocyclic or polycyclic, as well as alicyclic, heteroalicyclic, aromatic or heteroaromatic. In such expression, adjacent substituents may refer to substituents bonded to the same atom, substituents bonded to carbon atoms which are directly bonded to each other, or substituents bonded to carbon atoms which are more distant from each other. Preferably, adjacent substituents refer to substituents bonded to the same carbon atom and substituents bonded to carbon atoms which are directly bonded to each other.

The expression that adjacent substituents can be optionally joined to form a ring is also intended to mean that two substituents bonded to the same carbon atom are joined to each other via a chemical bond to form a ring, which can be exemplified by the following formula:

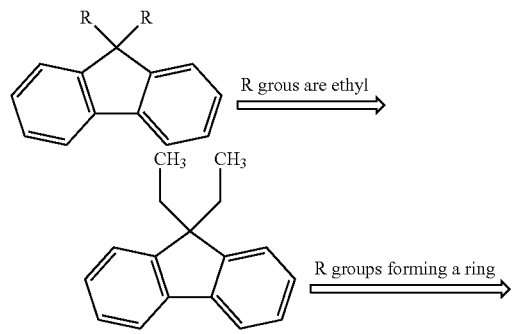

The expression that adjacent substituents can be optionally joined to form a ring is also intended to mean that two substituents bonded to carbon atoms which are directly bonded to each other are joined to each other via a chemical bond to form a ring, which can be exemplified by the following formula:

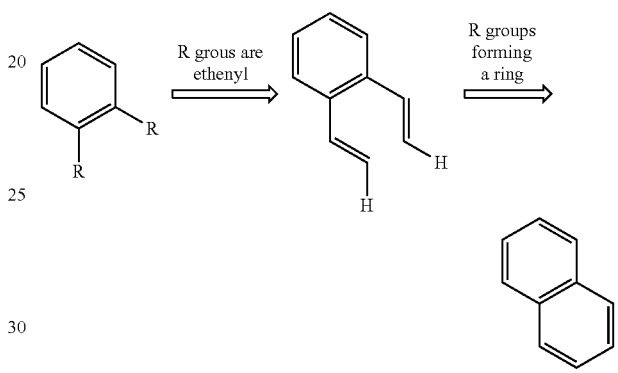

Furthermore, the expression that adjacent substituents can be optionally joined to form a ring is also intended to mean that, in the case where one of the two substituents bonded to carbon atoms which are directly bonded to each other represents hydrogen, the second substituent is bonded at a position at which the hydrogen atom is bonded, thereby forming a ring. This is exemplified by the following formula:

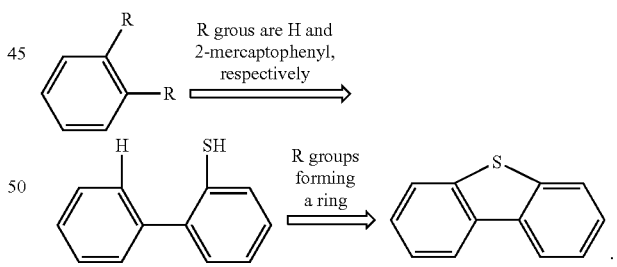

Based on the same inventive concept, the present disclosure further provides a compound formulation including any one of the metal complexes described above.

That is, the metal complex having the structure of $M(L_a)_m(L_b)_n$ provided by the present disclosure may be combined with other components to obtain a compound formulation, and such combination can be used together.

Based on the same inventive concept, the present disclosure further provides an electroluminescent device including an anode, a cathode, and an organic layer disposed between the anode and the cathode, wherein the organic layer includes the metal complex described in the first object.

In a specific embodiment, the organic layer is a light-emitting layer and the metal complex is a light-emitting material.

In a specific embodiment, the electroluminescent device emits red light.

In another specific embodiment, the electroluminescent device emits white light.

In a specific embodiment, the light-emitting layer further includes at least one host material.

In a specific embodiment, the metal complex is doped as a doped material in the light-emitting layer at a weight percentage of 1‰ to 20%, for example, 2‰, 3‰, 5‰, 8‰, 1%, 2%, 3%, 5%, 8%, 12%, 15%, 18%, or the like.

In another specific embodiment, the light-emitting layer further includes at least one host material; wherein the at least one host material comprises at least one chemical group selected from the group consisting of: benzene, pyridine, pyrimidine, triazine, carbazole, azacarbazole, indolocarbazole, dibenzothiophene, aza-dibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene, azaphenanthrene, and combinations thereof.

OLEDs can be fabricated on various types of substrates such as glass, plastic, and metal foil. FIG. 1 schematically shows an organic light emitting device 100 without limitation. The figures are not necessarily drawn to scale. Some of the layers in the figures can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, the contents of which are incorporated by reference herein in its entirety.

More examples for each of these layers are available. For example, a flexible and transparent substrate-anode combination is disclosed in U.S. Pat. No. 5,844,363, which is incorporated by reference herein in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference herein in its entirety. Examples of host materials are disclosed in U.S. Pat. No. 6,303,238 to Thompson et al., which is incorporated by reference herein in its entirety. An example of an n-doped electron transport layer is BPhen doped with Li at a molar ratio of 1:1, as disclosed in U.S. Patent Application Publication No. 2003/0230980, which is incorporated by reference herein in its entirety. U.S. Pat. Nos. 5,703,436 and 5,707,745, which are incorporated by reference herein in their entireties, disclose examples of cathodes including composite cathodes having a thin layer of metal such as Mg:Ag with an overlying transparent, electrically-conductive, sputter-deposited ITO layer. The theory and use of blocking layers are described in more detail in U.S. Pat. No. 6,097,147 and U.S. Patent Application Publication No. 2003/0230980, which are incorporated by reference herein in their entireties. Examples of injection layers are provided in U.S. Patent Application Publication No. 2004/0174116, which is incorporated by reference herein in its entirety. A description of protective layers may be found in U.S. Patent Application Publication No. 2004/0174116, which is incorporated by reference herein in its entirety.

The layered structure described above is provided by way of non-limiting examples. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have two layers of different emitting materials to achieve desired emission spectrum.

In one embodiment, an OLED may be described as having an "organic layer" disposed between a cathode and an anode. This organic layer may comprise a single layer or multiple layers.

Figure 2:
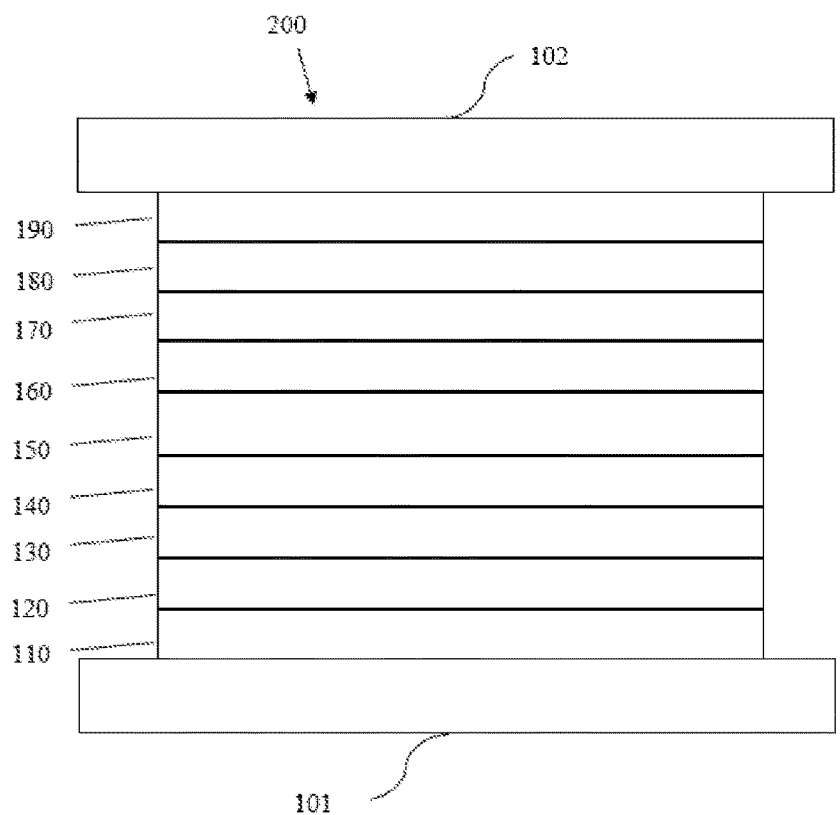
FIG. 2 is a schematic diagram of another organic light-emitting apparatus 200 that may include a metal complex and a compound formulation disclosed by the present disclosure.

An OLED can be encapsulated by a barrier layer. FIG. 2 schematically shows an organic light emitting device 200 without limitation. FIG. 2 differs from FIG. 1 in that the organic light emitting device include a barrier layer 102, which is above the cathode 190, to protect it from harmful species from the environment such as moisture and oxygen. Any material that can provide the barrier function can be used as the barrier layer such as glass or organic-inorganic hybrid layers. The barrier layer should be placed directly or indirectly outside of the OLED device. Multilayer thin film encapsulation was described in U.S. Pat. No. 7,968,146, which is incorporated by reference herein in its entirety.

Devices fabricated in accordance with embodiments of the present disclosure can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from the substrate. There may be other layers between the first and second layers, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta E_{S-T}$). Organic, non-metal containing, donor-acceptor luminescent materials may be able to achieve this. The emission in these materials is generally characterized as a donor-acceptor charge-transfer (CT) type emission. The spatial separation of the HOMO and LUMO in these donor-acceptor type compounds generally results in small $\Delta E_{S-T}$. These states may involve CT states. Generally, donor-acceptor luminescent materials are constructed by connecting an electron donor moiety such as amino- or carbazole-derivatives and an electron acceptor moiety such as N-containing six-membered aromatic rings.

Combination with Other Materials

The materials described in the present disclosure for a particular layer in an organic light emitting device can be used in combination with various other materials present in the device. The combinations of these materials are described in more detail in U.S. Pat. App. No. 20160359122 at paragraphs 0132-0161, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, dopants disclosed herein may be used in combination with a wide variety of hosts, transport layers, blocking layers, injection layers, electrodes and other layers that may be present. The combination of these materials is described in detail in paragraphs 0080-0101 of U.S. Pat. App. No. 2015/0349273, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatograph-mass spectrometry produced by SHIMADZU, gas chromatograph-mass spectrometry produced by SHIMADZU, differential Scanning calorimeters produced by SHIMADZU, fluorescence spectrophotometer produced by SHANGHAI LENGGUANG TECH., electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this present disclosure.

Based on the same inventive concept, the present disclosure further provides a use of the electroluminescent device described above, where the electroluminescent device is applied to an electronic device, an electronic element module, an organic light-emitting device, or a lighting panel.

Material Synthesis Example

The method for preparing a compound in the present disclosure is not limited herein. Typically, the following compounds are used as examples without limitations, and synthesis routes and preparation methods thereof are described below.

Synthesis Example 1: Synthesis of Metal Complex 54

Step 1: Synthesis of 2-cyclohexyl-N-methoxy-N-methylacetamide

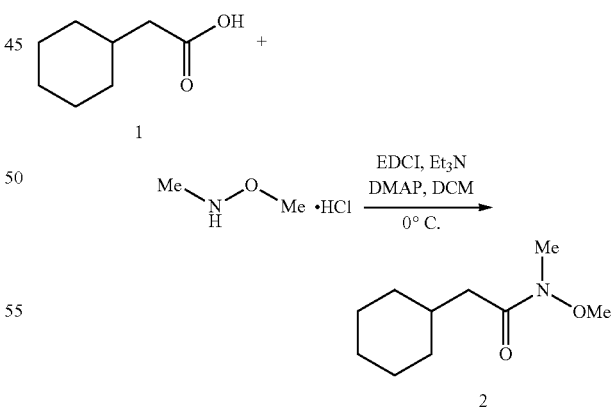

10 g (1 eq, 70 mmol) of raw material 1 was dissolved in 200 mL of dichloromethane and stirred at 0° C. 8.88 g of dimethyl hydroxylamine hydrochloride (1.3 eq, 91 mmol), 9.42 g of Et$_3$N (1.33 eq, 93 mmol), 17.44 g of 1-ethyl-3(3-dimethylpropylamino)carbodiimide (EDCI) (1.3 eq, 91 mmol), and 0.86 g of 4-dimethylaminopyridine (DMAP) (0.1 eq, 7 mmol) were separately added in sequence and the mixture was stirred for 15 h (overnight). The reaction system was slowly warmed to room temperature. The reaction solution was cooled to 0° C., and 100 mL of 1M/L HCl was added slowly to quench the reaction. The reaction solution was diluted with water, and allowed to stand still. Layers were separated, and then were extracted with dichloromethane (100 mL×2). The organic phase was washed with a saturated sodium carbonate aqueous solution and dried over saturated sodium chloride and anhydrous magnesium sulfate. The organic solvent was removed in vacuum to obtain 2-cyclohexyl-N-methoxy-N-methylacetamide (Intermediate 2) as a light yellow liquid. The crude product was used directly in the next step without purification.

Step 2: Synthesis of 1-cyclohexyl-2-acetone

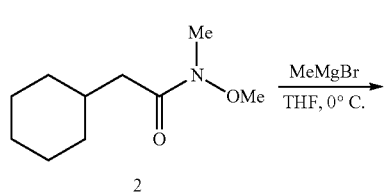

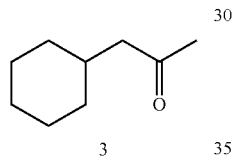

13 g of Intermediate 2 (1 eq, 70 mmol) was dissolved in 110 mL of ultra-dry tetrahydrofuran, and the system was cooled to 0° C. and purged with nitrogen three times. 35 mL of 3M/L MeMgBr (1.5 eq, 105 mmol) was slowly added dropwise to the system which was then stirred at 0° C. for 2 h. TLC showed that Intermediate 2 completely disappeared, and a saturated NH$_4$Cl aqueous solution was slowly added dropwise to the system. The system was diluted with water, and allowed to stand still. Layers were separated, and then were extracted with dichloromethane (100 mL×2) and dried over saturated sodium chloride and anhydrous magnesium sulfate. The organic solvent was removed in vacuum at a low temperature (<10° C.) to obtain 1-cyclohexyl-2-acetone (Intermediate 3) as a light yellow liquid (with a crude yield of 83% over two steps). The crude product was used directly in the next step without purification.

Step 3: Synthesis of 2-cyclohexylacetyl Chloride

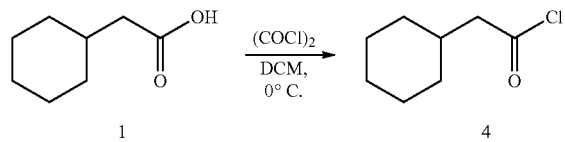

2.24 g (1 eq, 15.78 mmol) of raw material 1 was dissolved in 60 mL of dichloromethane and stirred at 0° C. 0.15 mL of DMF was added to the system and 3.05 g of oxalyl chloride (COCl)$_2$ (1.5 eq, 23.67 mmol) was slowly added. The reaction generated plenty of bubbles and was slowly warmed to room temperature. When no bubbles were generated, the solvents were removed in vacuum to give 2.34 g of 2-cyclohexylacetyl chloride (Intermediate 4) with a yield of 93%, which was stored under nitrogen protection (should not be stored for a long time and would better be used directly in the reaction in the next step).

Step 4: Synthesis of (Z)-1,5-dicyclohexyl-2,4-pentanedione

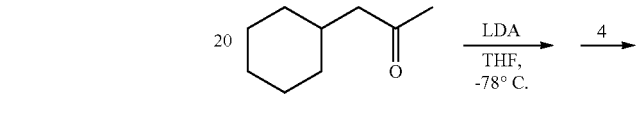

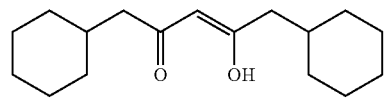

Intermediate 3 (1.7 g, 1 eq, 12.14 mmol) was dissolved in 70 mL of ultra-dry THF and cooled to −78° C. LDA (1.05 eq, 12.75 mmol) was slowly added dropwise in a nitrogen atmosphere and stirred at −78° C. for 30 min. The solution of Intermediate 4 (14.57 mmol) in THF was added to the reaction system, slowly warmed to room temperature, and stirred for 6 h. TLC showed that Intermediate 4 completely disappeared, and a saturated NH$_4$Cl aqueous solution was slowly added dropwise to the system. The system was diluted with water, and allowed to stand still. Layers were separated, and then were extracted with ethyl acetate (50 mL×2), washed with a saturated sodium chloride solution, and dried over anhydrous magnesium sulfate. The organic solvent was removed in vacuum. The residue was purified through silica gel column chromatography (petroleum ether: ethyl acetate, gradient elution from 200:1 to 150:1 (volume ratio)) to give 1.28 g of (Z)-1,5-dicyclohexyl-2,4-pentanedione (Intermediate 5) as a yellow transparent liquid, with a crude yield of 40%. The crude yellow transparent liquid was distilled under reduced pressure and a distillate was collected at 200° C. to give 1.12 g of (Z)-1,5-dicyclohexyl-2,4-pentanedione (Intermediate 5) as a colorless transparent liquid, with a yield of 35%.

Step 5: Synthesis of Metal Complex 54

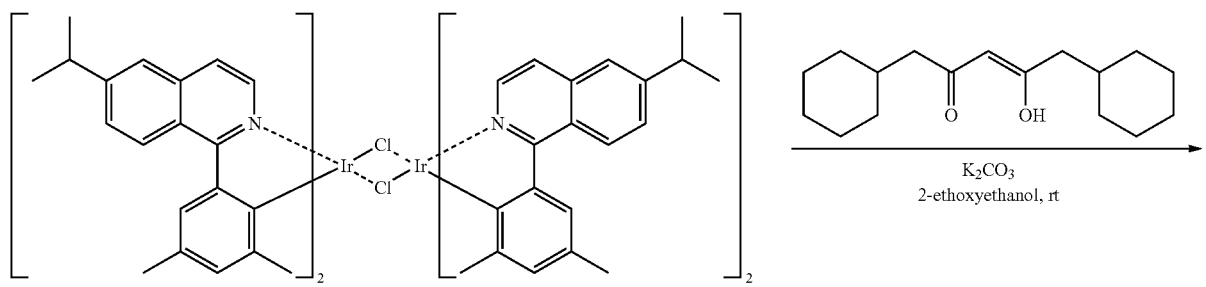

Compound A

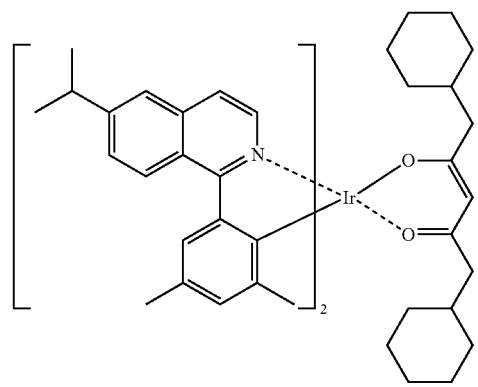

Metal complex 54

1.21 g (1 eq, 0.78 mmol) of raw material, Compound A, was added to a 100 mL round-bottom flask, 1.08 g of K₂CO₃ (10 eq, 7.8 mmol) and 1.03 g of (Z)-1,5-dicyclohexyl-2,4-pentanedione (Intermediate 5) (5 eq, 3.9 mmol) were added, and 20 mL of solvent was added. The reaction system was purged with nitrogen three times at room temperature, stirred at room temperature and under nitrogen protection for 24 h, and filtered through Celite. The solid was washed with ethanol until the washing liquid was colorless. Ethanol adsorbed to the solid was removed through suction filtration. Under vacuum filtration, the red solid on the Celite was dissolved in 200 mL of dichloromethane. 20 mL of ethanol was added to the flask, dichloromethane was removed in vacuum, the product was precipitated from the remaining ethanol and filtered, and ethanol adsorbed to the solid was removed completely through suction filtration. The above dichloromethane-ethanol step was repeated and the resulting red solid was collected. The red solid was refluxed in acetonitrile at 80° C. for 2 h, filtered while it was hot, and washed twice with a mixed solvent of EA:MeCN=1:2 to give 1.2 g of Metal complex 54 as a solid with a yield of 78%. The product was confirmed as the target product with a molecular weight of 1004.5.

Synthesis Example 2: Synthesis of Metal Complex 126

Step 1: Synthesis of 1,7-dicyclohexylheptane-3,5-dione

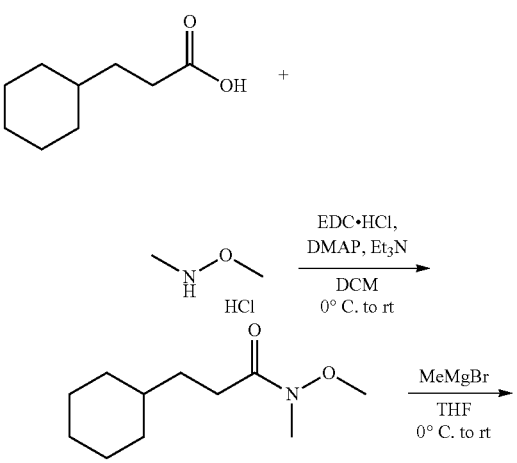

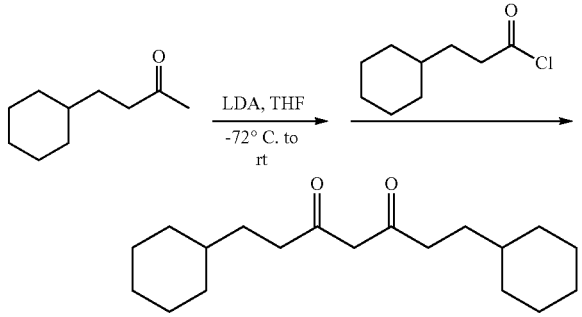

3-Cyclohexylpropionic acid (10 g, 64 mmol, 1 eq), dimethyl hydroxylamine hydrochloride (8.12 g, 83.2 mmol, 1.3 eq), DMAP (782 mg, 6.4 mmol, 10 mol %), and DCM (160 mL) were added to a 500 mL three-necked flask and cooled at 0° C. 1-Ethyl-3(3-dimethylpropylamino)carbodiimide (EDC·HCl) (15.95 g, 83.2 mmol, 1.3 eq) was added portionwise. The reaction was naturally warmed overnight. After TLC monitored that the reaction was completed, 2 N HCl (45 mL) was added, and the organic phase was separated, washed with a saturated sodium carbonate solution and then saturated brine, dried over anhydrous Na$_2$SO$_4$, filtered, and concentrated to give 3-cyclohexyl-N-methoxy-N-methylpropionamide (13 g, colorless liquid). The solution of Weinreb amide (13 g, 64 mmol, 1 eq) above in THF (240 mL) was cooled at 0° C., a methylmagnesium bromide solution (32 mL, 96 mmol, 1.5 eq) was added dropwise under nitrogen protection, and the system was naturally warmed to room temperature and reacted for 24 h. A saturated ammonium chloride aqueous solution was added to quench the reaction until it was clear. The organic phase was separated, dried over anhydrous Na$_2$SO$_4$, filtered, and concentrated to give 4-cyclohexylbutan-2-one (6 g, colorless liquid). The solution of 4-cyclohexylbutan-2-one (1.48 g, 9.6 mmol, 1 eq) in THF (24 mL) was cooled at −72° C., LDA (4.8 mL, 9.6 mmol, 1 eq) was added dropwise under nitrogen protection, and the system was reacted for 30 min. The prepared 3-cyclohexylpropionyl chloride was added dropwise, and after the dropwise addition, the system was naturally warmed and reacted overnight. A saturated ammonium chloride aqueous reaction was added to quench the reaction until it was clear. The organic phase was separated, dried over anhydrous Na$_2$SO$_4$, filtered, concentrated, and subjected to column chromatography by using petroleum ether as the eluent to give 1,7-dicyclohexylheptane-3,5-dione (Intermediate 6) (1 g, with a yield of 5.4% over three steps, colorless solid).

Step 2: Synthesis of Metal Complex 126

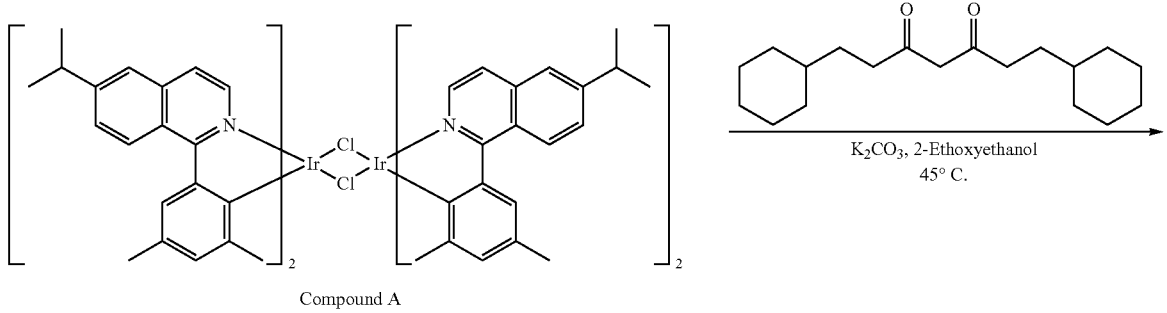

Compound A

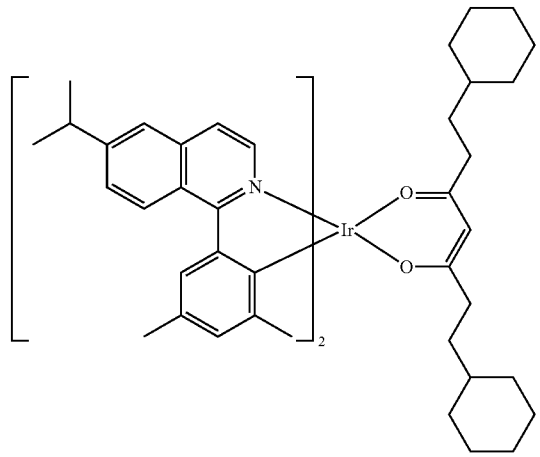

Metal complex 126

The raw material Compound A (559 mg, 0.36 mmol, 1 eq), 1,7-dicyclohexylheptane-3,5-dione (Intermediate 6) (321 mg, 1.1 mmol, 3 eq), K$_2$CO$_3$ (498 mg, 3.6 mmol, 10 eq), and 2-ethoxyethanol (12 mL) were mixed in a 100 mL single-necked flask. The mixture was reacted overnight at 45° C. under nitrogen protection. After TLC monitored that the reaction was completed, the reaction was cooled to room temperature. The reaction solution was filtered through Celite, the filter cake was washed with an appropriate amount of EtOH, and the crude product was dissolved with DCM into a 250 mL eggplant-shaped flask. EtOH (about 20 mL) was added thereto, and DCM was removed through rotary evaporation at normal temperature. The solids were precipitated, filtered, and washed with EtOH to give the product Metal complex 126 (520 mg with a yield of 46%). The product was confirmed as the target product with a molecular weight of 1032.5.

Synthesis Example 3: Synthesis of Metal Complex 11

Step 1: Synthesis of 2-cyclobutyl-N-methoxy-N-methylacetamide

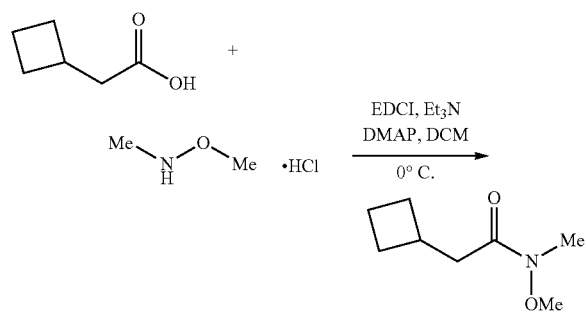

2-Cyclobutylacetic acid (5.0 g, 43.8 mmol, 1 eq), dimethyl hydroxylamine hydrochloride (5.5 g, 56.9 mmol, 1.3 eq), and DMAP (0.54 g, 4.4 mmol, 0.1 eq) were dissolved in 110 mL of dichloromethane. The reaction system was stirred at 0° C., EDCI (10.9 g, 56.9 mmol, 1.3 eq) and Et$_3$N (5.9 g, 58.3 mmol, 1.33 eq) were added in sequence and stirred overnight, and the reaction system was slowly warmed to room temperature. After TLC detected that the reaction was completed, the reaction solution was cooled to 0° C., and 1 M/L HCl was slowly added to quench the reaction. The reaction solution was diluted with water, and allowed to stand still. Layers were separated, and then were extracted with dichloromethane. The organic phases were combined and dried through rotary evaporation to give 2-cyclobutyl-N-methoxy-N-methylacetamide (Intermediate 7) as a light yellow liquid (6.8 g, 99%). The crude product was directly used in the next step without purification.

Step 2: Synthesis of 1-cyclobutylacetone

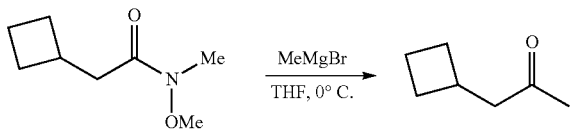

2-Cyclobutyl-N-methoxy-N-methylacetamide (Intermediate 7) (6.8 g, 43.8 mmol, 1 eq) was dissolved in 125 mL of ultra-dry tetrahydrofuran, and the system was purged with nitrogen three times and cooled to 0° C. MeMgBr (21.9 mL, 3 M/L, 65.7 mmol, 1.5 eq) was slowly added dropwise to the system which was then stirred overnight. After TLC detected that the raw materials were reacted completely, a saturated NH$_4$Cl aqueous solution was slowly added dropwise to the system to quench the reaction. The THF layer was separated, the aqueous phase was extracted with dichloromethane, and the organic phases were combined, dried, and subjected to rotary evaporation to give the product 1-cyclobutylacetone (Intermediate 8) (4.23 g, 86.2%). The crude product was directly used in the next step without purification.

Step 3: Synthesis of 2-cyclobutylacetyl Chloride

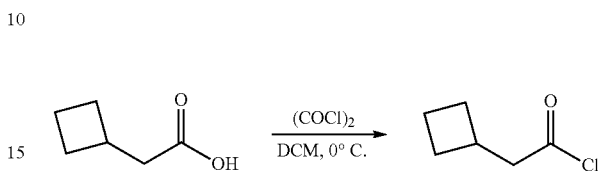

2-Cyclobutylacetic acid (5.0 g, 43.8 mmol, 1 eq) was dissolved in 30 mL of dichloromethane and stirred at 0° C. 0.5 mL of DMF was added to the system, and oxalyl chloride (COCl)$_2$ (3.8 mL, 45.2 mmol, 1.5 eq) was slowly added. The reaction generated plenty of bubbles and was slowly warmed to room temperature until no bubbles were generated. The solvent was removed through rotary evaporation to give 5.5 g of 2-cyclobutylacetyl chloride (Intermediate 9) with a yield of 95%, which was directly used in the next step.

Step 4: Synthesis of 1,5-dicyclobutyl-2,4-pentanedione

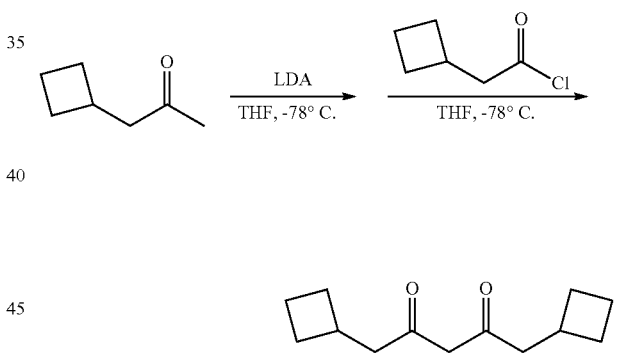

1-Cyclobutylacetone (Intermediate 8) (4.23 g, 37.7 mmol, 1 eq) was dissolved in 125 mL of ultra-dry THF, and the system was purged with nitrogen and cooled to −78° C. Lithium diisopropylamide (LDA) (22.6 mL, 2.0 M, 45.2 mmol, 1.2 eq) was slowly added dropwise and stirred at −78° C. for 30 min. 2-Cyclobutylacetyl chloride (Intermediate 9) (43.8 mmol, 1.16 eq) was added to the reaction system, slowly warmed to room temperature, and stirred overnight. TLC detected that 1-cyclobutylacetone (Intermediate 8) completely disappeared. A saturated NH$_4$Cl aqueous solution was slowly added dropwise to the system to quench the reaction. Layers were separated, and the aqueous phase was extracted with ethyl acetate. The organic phases were combined and dried, and the organic solvent was removed through rotary evaporation. The residue was separated through column chromatography to give the product 1,5-dicyclobutylpentane-2,4-dione (Intermediate 10) (3.8 g, 48.6%).

Step 5: Synthesis of Metal Complex 11

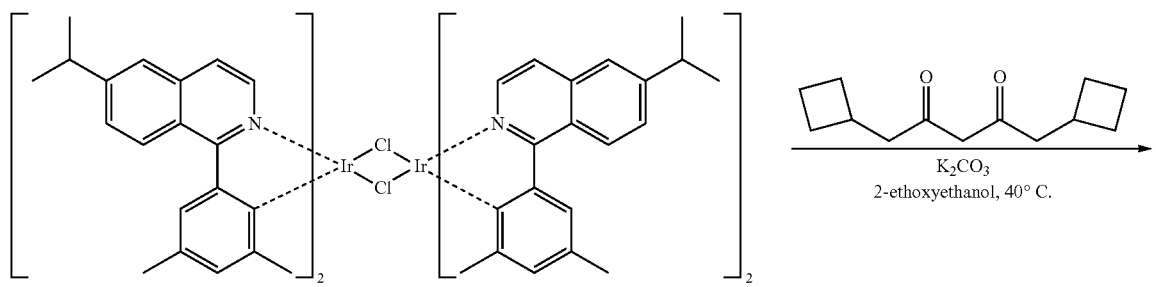

Compound A

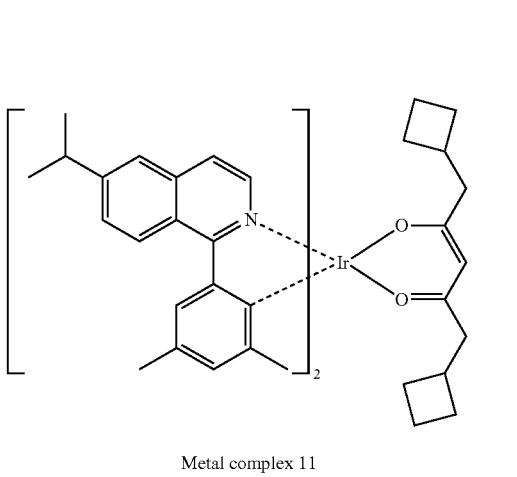

Metal complex 11

The raw material Compound A (1.3 g, 0.84 mmol, 1 eq), 1,5-dicyclobutyl-2,4-pentanedione (Intermediate 10) (700 mg, 3.36 mmol, 4 eq), and potassium carbonate (1.16 g, 8.4 mmol, 10 eq) were dissolved in 24 mL of 2-ethoxyethanol, purged with nitrogen three times, and stirred at 40° C. for 24 h. The precipitate was filtered through Celite and washed with ethanol. The resulting solid was added with dichloromethane and the filtrate was collected. Then ethanol was added and the resulting solution was concentrated but not to dryness. The solution was filtered to give a crude product which was washed with acetonitrile for further purification to obtain Metal complex 11 (1.45 g, 92.5%). The product was confirmed as the target product with a molecular weight of 948.4.

Synthesis Example 4: Synthesis of Metal Complex 30

Step 1: Synthesis of 2-cyclopentyl-N-methoxy-N-methylacetamide

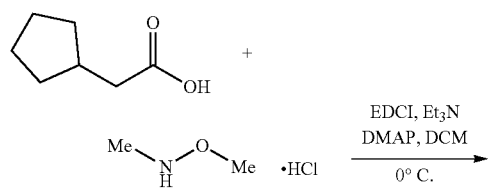

-continued

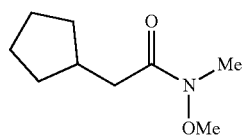

2-Cyclopentylacetic acid (10 g, 78.0 mmol), dimethyl hydroxylamine hydrochloride (9.9 g, 101.4 mmol), and DMAP (0.953 g, 7.8 mmol) were dissolved in 195 mL of dichloromethane. The reaction system was stirred at 0° C., EDCI (19.4 g, 101.4 mmol) and Et$_3$N (10.5 g, 103.7 mmol) were added in sequence and stirred overnight, and the reaction system was slowly warmed to room temperature. After TLC detected that the reaction was completed, the reaction solution was cooled to 0° C., and 1 M/L HCl was slowly added to quench the reaction. The reaction solution was diluted with water, and allowed to stand still. Layers were separated, and then were extracted with dichloromethane. The organic phases were combined and dried through rotary evaporation to give 2-cyclopentyl-N-methoxy-N-methylacetamide (Intermediate 11) as a light yellow liquid (13.3 g, 99%). The crude product was directly used in the next step without purification.

Step 2: Synthesis of 1-cyclopentylacetone

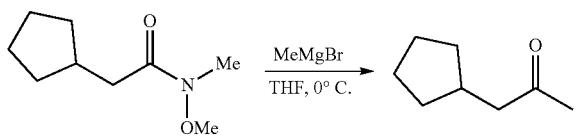

2-Cyclopentyl-N-methoxy-N-methylacetamide (Intermediate 11) (13.3 g, 78 mmol) was dissolved in 220 mL of ultra-dry tetrahydrofuran, and the system was purged with nitrogen three times and cooled to 0° C. MeMgBr (39 mL, 3 M/L, 117 mmol) was slowly added dropwise to the system which was then stirred overnight. After TLC detected that the raw materials were reacted completely, a saturated $NH_4Cl$ aqueous solution was slowly added dropwise to the system to quench the reaction. Layers were separated, and the aqueous phase was extracted with dichloromethane. The organic phases were combined, dried, and subjected to rotary evaporation to give 1-cyclopentylacetone (Intermediate 12) (9.34 g, 95%). The crude product was directly used in the next step without purification.

Step 3: Synthesis of 2-cyclopentylacetyl Chloride

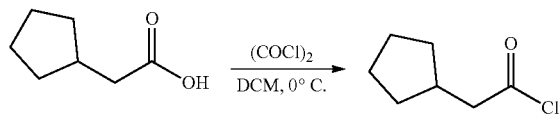 [SMILES: O=C(O)CC1CCCC1 ; "(COCl)2" ; O=C(Cl)CC1CCCC1]

2-Cyclopentylacetic acid (5.87 g, 45.8 mmol) was dissolved in 27 mL of dichloromethane and stirred at 0° C. 0.5 mL of DMF was added to the system, and oxalyl chloride $(COCl)_2$ (4.2 mL, 49.7 mmol) was slowly added. The reaction generated plenty of bubbles and was slowly warmed to room temperature until no bubbles were generated. The solvent was removed through rotary evaporation to give 6.24 g of 2-cyclopentylacetyl chloride (Intermediate 13) with a yield of 93%, which was directly used in the next step.

Step 4: Synthesis of 1,5-dicyclopentyl-2,4-pentanedione

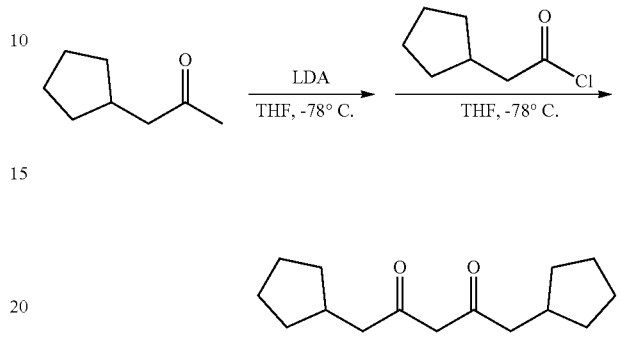

1-Cyclopentylacetone (Intermediate 12) (4.81 g, 38.2 mmol) was dissolved in 127 mL of ultra-dry THF, and the system was vacuumed, purged with nitrogen, and cooled to −78° C. LDA (21 mL, 2.0 M, 42.0 mmol) was slowly added dropwise and stirred at −78° C. for 30 min. 2-Cyclopentylacetyl chloride (Intermediate 13) (45.8 mmol) was added to the reaction system, slowly warmed to room temperature, and stirred overnight. TLC detected that 1-cyclopentylacetone (Intermediate 12) completely disappeared. A saturated $NH_4Cl$ aqueous solution was slowly added dropwise to the system to quench the reaction. Layers were separated, and the aqueous phase was extracted with ethyl acetate. The organic phases were combined and dried, and the organic solvent was removed through rotary evaporation. The residue was separated through column chromatography to give 1,5-dicyclopentyl-2,4-pentanedione (Intermediate 14) (3 g, 33.57%).

Step 5: Synthesis of Metal Complex 30

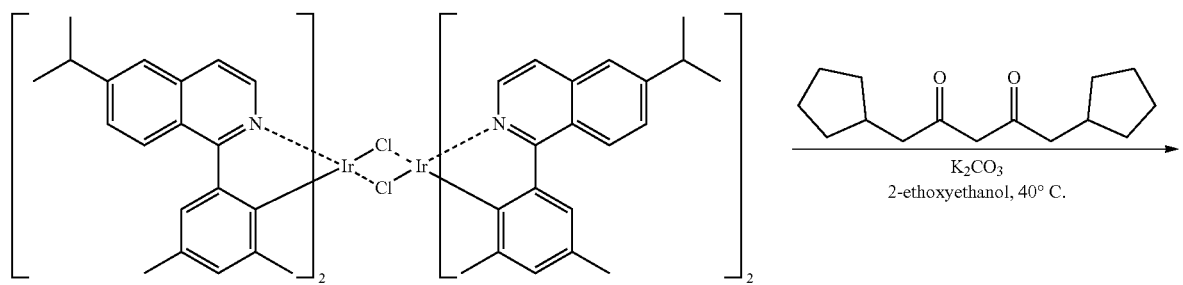

Compound A

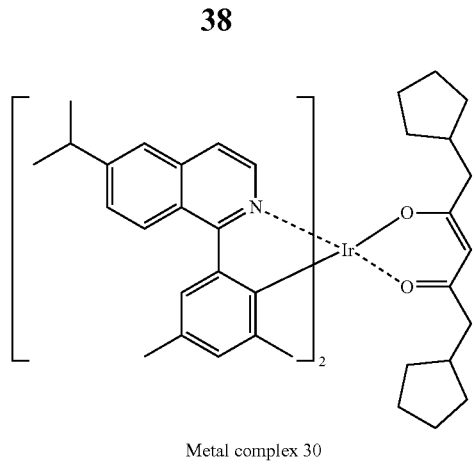

Metal complex 30

The raw material Compound A (844 mg, 0.54 mmol), 1,5-dicyclopentylpentane-2,4-dione (Intermediate 14) (524 mg, 2.17 mmol), and potassium carbonate (749 mg, 5.4 mmol) were dissolved in 15 mL of 2-ethoxyethanol, purged with nitrogen three times, and stirred at 40° C. for 24 h. The precipitate was filtered through Celite and washed with ethanol. The resulting solid was added with dichloromethane and the filtrate was collected. Then ethanol was added and the resulting solution was concentrated but not to dryness. The solution was filtered to give a crude product which was washed with acetonitrile for further purification to obtain Metal complex 30 (960 mg, 92%). The product was confirmed as the target product with a molecular weight of 976.5.

Those skilled in the art will appreciate that the above preparation methods are merely illustrative. Those skilled in the art can obtain other compound structures of the present disclosure through the modifications of the preparation methods.

Device Example

This example provides an electroluminescent device which is prepared by a method described below.

Device Example 1

First, a glass substrate having an Indium Tin Oxide (ITO) anode with a thickness of 120 nm was cleaned and then treated with oxygen plasma and UV ozone. After the treatment, the substrate was dried in a glovebox to remove moisture. Next, the substrate was mounted on a substrate holder and placed in a vacuum chamber. Organic layers specified below were sequentially deposited through vacuum thermal evaporation on the ITO anode at a rate of 0.2 to 2 Angstroms per second at a vacuum degree of about $10^{-8}$ torr. Compound HI was used as a hole injection layer (HIL) with a thickness of 100 Å. Compound HT was used as a hole transporting layer (HTL) with a thickness of 400 Å. Compound EB was used as an electron blocking layer (EBL) with a thickness of 50 Å. Metal complex 54 of the present disclosure was doped in a host compound RH to be used as an emissive layer (EML) with a thickness of 400 Å. Compound HB was used as a hole blocking layer (HBL) with a thickness of 50 Å. On the HBL, a mixture of Compound ET and 8-hydroxyquinolinolato-lithium (Liq) was deposited as an electron transporting layer (ETL) with a thickness of 350 Å. Finally, Liq with a thickness of 1 nm was deposited as an electron injection layer, and Al with a thickness of 120 nm was deposited as a cathode. The device was transferred back to the glovebox and encapsulated with a glass lid and a moisture getter to complete the device.

Device Example 2

The preparation method in Device Example 2 was the same as that in Device Example 1, except that Metal complex 54 of the present disclosure in Device Example 1 was substituted with Metal complex 126 of the present disclosure.

Device Example 3

The preparation method in Device Example 3 was the same as that in Device Example 1, except that Metal complex 54 of the present disclosure in Device Example 1 was substituted with Metal complex 30 of the present disclosure.

Device Example 4

The preparation method in Device Example 4 was the same as that in Device Example 1, except that Metal complex 54 of the present disclosure in Device Example 1 was substituted with Metal complex 11 of the present disclosure.

Device Comparative Example 1

The preparation method in Device Comparative Example 1 was the same as that in Device Example 1, except that Metal complex 54 of the present disclosure in Device Example 1 was substituted with Compound RD.

The structures and thicknesses of layers of the devices are shown in the following table. The layers using more than one material were obtained by doping different compounds at weight proportions as recorded.

Since Comparative Example 1 has best performance when the doping proportion is 3%, the present disclosure performs comparisons and analyzes at a doping proportion of 3%. However, the present disclosure is not limited to a doping proportion of 3%.

TABLE 1

Device structures in device examples and a comparative example

| Device No. | HIL | HTL | EBL | EML | HBL | ETL |
|---|---|---|---|---|---|---|
| Comparative Example 1 | Compound HI (100 Å) | Compound HT (400 Å) | Compound EB (50 Å) | Compound RH: Compound RD (97: 3) (400 Å) | Compound HB (50 Å) | Compound ET: Liq (40: 60) (350 Å) |
| Example 1 | Compound HI (100 Å) | Compound HT (400 Å) | Compound EB (50 Å) | Compound RH: Metal complex 54 (97: 3) (400 Å) | Compound HB (50 Å) | Compound ET: Liq (40: 60) (350 Å) |
| Example 2 | Compound HI (100 Å) | Compound HT (400 Å) | Compound EB (50 Å) | Compound RH: Metal complex 126 (97: 3) (400 Å) | Compound HB (50 Å) | Compound ET: Liq (40: 60) (350 Å) |
| Example 3 | Compound HI (100 Å) | Compound HT (400 Å) | Compound EB (50 Å) | Compound RH: Metal complex 30 (97: 3) (400 Å) | Compound HB (50 Å) | Compound ET: Liq (40: 60) (350 Å) |
| Example 4 | Compound HI (100 Å) | Compound HT (400 Å) | Compound EB (50 Å) | Compound RH: Metal complex 11 (97: 3) (400 Å) | Compound HB (50 Å) | Compound ET: Liq (40: 60) (350 Å) |

The structures of the materials used in the devices are shown as follows:

Compound HI

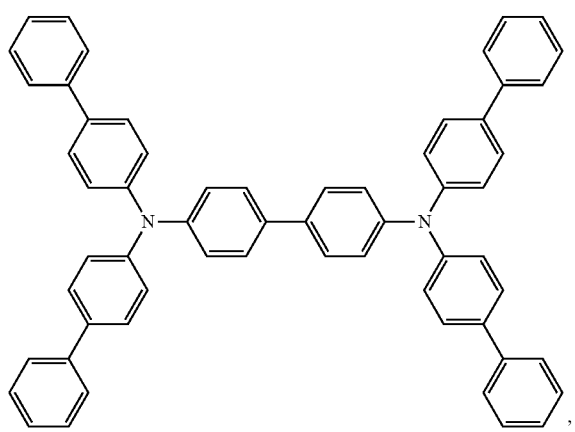

Compound HT

Compound Liq

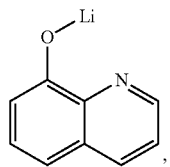

Compound EB

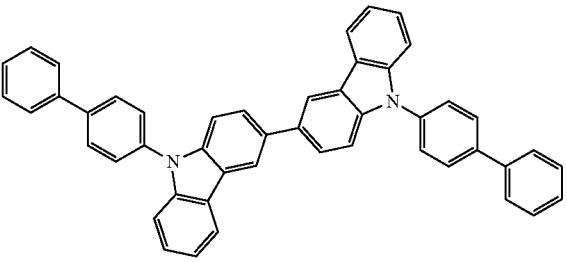

Compound RH

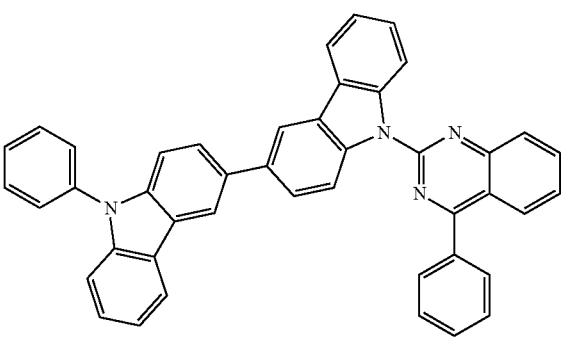

-continued

Compound HB

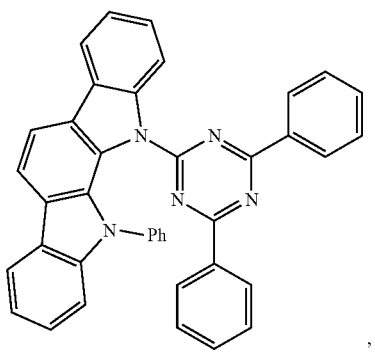

Compound ET

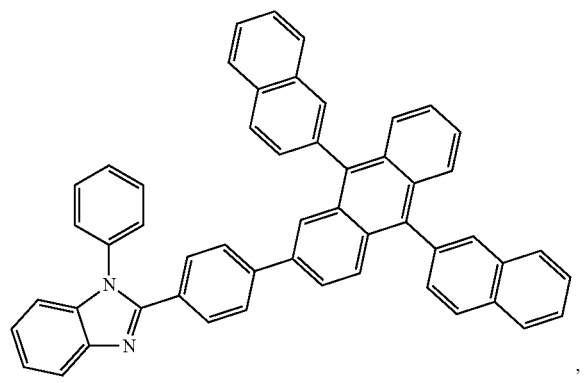

Compound RD

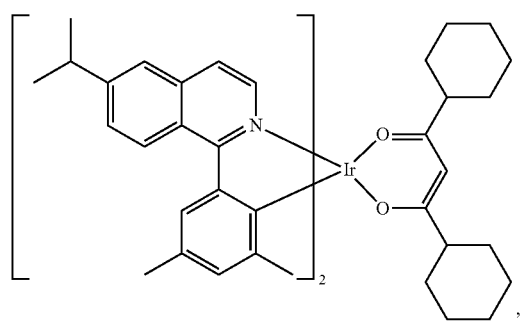

Metal complex 54

[structure]

-continued

Metal complex 126

[structure]

Metal complex 30

[structure]

Metal complex 11

[structure]

Performance Test:

Current-voltage-luminance (IVL) characteristics of the devices were measured. Table 2 shows data on CIE and data on the maximum emission wavelength ($\lambda_{max}$), the full width at half maximum (FWHM), current efficiency (CE), and external quantum efficiency (EQE), which were measured at 1000 nits. The performance test results are shown in Table 2.

TABLE 2

| | Device data | | | | |
|---|---|---|---|---|---|
| Device No. | CIE (x, y) | $\lambda_{max}$ (nm) | FWHM (nm) | CE (cd/A) | EQE (%) |
| Comparative Example 1 | (0.684, 0.315) | 625 | 54.7 | 19.05 | 23.61 |
| Example 1 (Metal complex 54) | (0.682, 0.317) | 625 | 52.1 | 20.09 | 23.86 |
| Example 2 (Metal complex 126) | (0.683, 0.316) | 625 | 54.3 | 20.02 | 24.27 |
| Example 3 (Metal complex 30) | (0.683, 0.316) | 625 | 52.7 | 20.66 | 24.96 |

TABLE 2-continued

| | Device data | | | | |
|---|---|---|---|---|---|
| Device No. | CIE (x, y) | $\lambda_{max}$ (nm) | FWHM (nm) | CE (cd/A) | EQE (%) |
| Example 4 (Metal complex 11) | (0.684, 0.315) | 626 | 53.4 | 19.95 | 24.44 |

DISCUSSION

It can be seen from Table 2 that $\lambda_{max}$ of the compounds can be maintained basically unchanged by changing cycloalkyl substituents on a dione ancillary ligand and the number of carbon atoms between a cycloalkyl group and a carbonyl group, so as to fine-tune the light-emitting color of the devices. Compared with the comparative example having the full width at half maximum of 54.7 nm, the examples have full width at half maximums within the range of 52.1 nm to 54.3 nm. It can be seen that the full width at half maximum (FWHM) of the examples is narrowed to different degrees, such that the devices using the metal complexes of the present disclosure have the more saturated light-emitting color. The current efficiency of the comparative example is 19.05 cd/A. According to the data in the table, the current efficiency of all the four examples is greater than 19.05 cd/A. Meanwhile, the external quantum efficiency of all the four examples is greater than that of the comparative example which is 23.61%. Therefore, the current efficiency (CE) and the external quantum efficiency (EQE) of the device using the metal complex of the present disclosure are improved compared with those of Comparative Example 1, embodying the uniqueness and importance of the present disclosure.

The applicant has stated that although the metal complex, the electroluminescent device including the same, and the use thereof in the present disclosure are described through the examples described above, the present disclosure is not limited to the examples described above, which means that the implementation of the present disclosure does not necessarily depend on the examples described above. It should be apparent to those skilled in the art that any improvements made to the present disclosure, equivalent substitutions of various raw materials of the product, the addition of adjuvant ingredients, and the selection of specific manners, etc. in the present disclosure all fall within the protection scope and the scope of disclosure of the present disclosure.

What is claimed is:

1. A metal complex having a structure of $M(L_a)_m(L_b)_n$; wherein,

M is a metal whose atomic mass is greater than 40, $L_a$ and $L_b$ are the first ligand and the second ligand of the metal complex, and $L_a$ and $L_b$ can be optionally joined to form a multidentate ligand;

m is 1 or 2, n is 1 or 2, and m+n equals an oxidation state of the metal M;

when m is 2, both of $L_a$ are identical or different; when n is 2, both of $L_b$ are identical or different;

the first ligand $L_a$ has a structure represented by Formula 1:

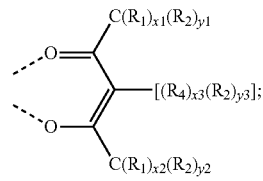

Formula 1 wherein,
x1=0, 1, or 2, y1=1, 2, or 3, and x1+y1=3;
x2=0, 1, or 2, y2=1, 2, or 3, and x2+y2=3;
x3=0 or 1, y3=0 or 1, and x3+y3=1; and
y1+y2+y3≥2;

$R_1$ is, at each occurrence identically or differently, selected from hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, or a combination thereof, wherein at least one of $R_1$ is, at each occurrence identically or differently, selected from hydrogen, deuterium;

$R_2$ is, at each occurrence identically or differently, selected from -L-$R_3$, wherein L is, at each occurrence identically or differently, selected from a single bond, a substituted or unsubstituted alkylene group having 1 to 20 carbon atoms, a substituted or unsubstituted cycloalkylene group having 3 to 20 ring carbon atoms, a substituted or unsubstituted heteroalkylene group having 1 to 20 carbon atoms, a substituted or unsubstituted arylene group having 6 to 30 carbon atoms, or a substituted or unsubstituted heteroarylene group having 3 to 30 carbon atoms; and $R_3$ represents substituted or unsubstituted cycloalkyl having 3 to 20 ring carbon atoms;

$R_4$ is, at each occurrence identically or differently, selected from hydrogen, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, or a combination thereof;

wherein, adjacent substituents $R_1$ and $R_4$ can be optionally joined to form a ring;

$L_b$ is, at each occurrence identically or differently, selected from a structure represented by Formula 2, Formula 3, or Formula 4:

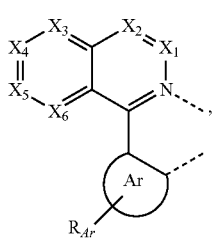

Formula 2

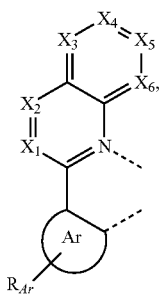

Formula 3

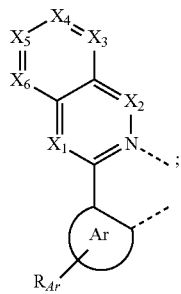

Formula 4 wherein, $X_1$ and $X_2$ are, at each occurrence identically or differently, selected from $CR_x$ or N; and $X_3$, $X_4$, $X_5$, and $X_6$ are, at each occurrence identically or differently, selected from $CR_y$ or N; wherein adjacent substituents $R_x$ can be optionally joined to form a ring, and adjacent substituents $R_y$ can be optionally joined to form a ring;

wherein, the ring Ar is a five-membered aromatic ring, a six-membered aromatic ring, a five-membered heteroaromatic ring, or a six-membered heteroaromatic ring;

wherein, $R_{Ar}$ represents mono-substitution, multi-substitution, or no substitution;

$R_x$ and $R_y$ are, at each occurrence identically or differently, selected from hydrogen, deuterium, halogen, a substituted or unsubstituted alkyl group having 1 to 20 carbon atoms, a substituted or unsubstituted heteroalkyl group having 1 to 20 carbon atoms, a substituted or unsubstituted arylalkyl group having 7 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, an acyl group, a carbonyl group, a carboxylic acid group, an ester group, a cyano group, an isocyano group, a sulfanyl group, a sulfinyl group, a sulfonyl group, a phosphino group, or a combination thereof; and when $R_x$ or $R_y$ is substituted alkyl, substituted heteroalkyl, substituted arylalkyl, substituted alkenyl, substituted aryl, substituted heteroaryl, substituted alkylsilyl, substituted arylsilyl, it means that any group of the alkyl, heteroalkyl, arylalkyl, alkenyl, aryl, heteroaryl, alkylsilyl, and arylsilyl is substituted with one or more groups selected from the group consisting of deuterium, a halogen, an unsubstituted alkyl group having 1 to 20 carbon atoms, an unsubstituted heteroalkyl group having 1 to 20 carbon atoms, an unsubstituted arylalkyl group having 7 to 30 carbon atoms, an unsubstituted alkenyl group having 2 to 20 carbon atoms, an unsubstituted aryl group having 6 to 30 carbon atoms, an unsubstituted heteroaryl group having 3 to 30 carbon atoms, an unsubstituted alkylsilyl group having 3 to 20 carbon atoms, an unsubstituted arylsilyl group having 6 to 20 carbon atoms, an acyl group, a carbonyl group, a carboxylic acid group, an ester group, a cyano group, an isocyano group, a sulfanyl group, a sulfinyl group, a sulfonyl group, a phosphino group, and combinations thereof;

$R_{Ar}$ is, at each occurrence identically or differently, selected from hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, an acyl group, a carbonyl group, a carboxylic acid group, an ester group, a cyano group, an isocyano group, a sulfanyl group, a sulfinyl group, a sulfonyl group, a phosphino group, or a combination thereof; and wherein when a substituent $R_{Ar}$ is selected from a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a sulfanyl group, adjacent substituents $R_{Ar}$ can be optionally joined to form a ring.

2. The metal complex of claim 1, wherein the metal M is selected from Ir, Rh, Re, Os, Pt, Au, or Cu.

3. The metal complex of claim 1, wherein $R_1$ and $R_4$ are, at each occurrence identically or differently, selected from hydrogen, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, or a combination thereof, wherein at least one of $R_1$ is, at each occurrence identically or differently, selected from hydrogen.

4. The metal complex of claim 1, wherein at least one of $X_1$, $X_2$, $X_3$, $X_4$, $X_5$, and $X_6$ is N.

5. The metal complex of claim 4, wherein one of $X_1$ and $X_2$ is N.

6. The metal complex of claim 1, wherein $X_1$ and $X_2$ are, at each occurrence identically or differently, selected from $CR_x$, and $X_3$, $X_4$, $X_5$, and $X_6$ are, at each occurrence identically or differently, selected from $CR_y$.

7. The metal complex of claim 1, wherein adjacent substituents $R_x$ are not joined to form a ring, and adjacent substituents $R_y$ are not joined to form a ring.

8. The metal complex of claim 1, wherein the ring Ar is a six-membered aromatic ring.

9. The metal complex of claim 8, wherein the ring Ar is a benzene ring.

10. The metal complex of claim 1, wherein the ligand $L_b$ is, at each occurrence identically or differently, selected from following structures:

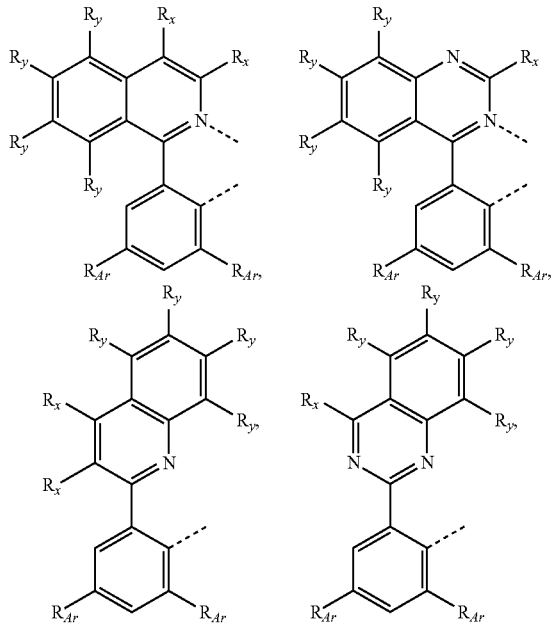

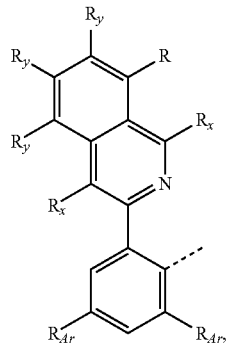

or

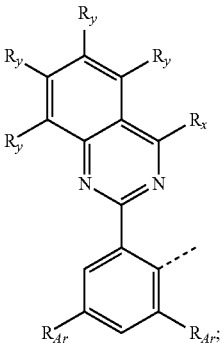

wherein $R_x$ and $R_y$ are, at each occurence identically or differently, selected from hydrogen, deuterium, halogen, unsubstituted alkyl group having 1 to 20 carbon atoms, a substituted or unsubstituted alkylsilyl group having 3 to 20 carbon atoms, a substituted or unsubstituted arylsilyl group having 6 to 20 carbon atoms, a cyano group, or a combination thereof; and $R_{Ar}$ is, at each occurrence identically or differently, selected from hydrogen, deuterium, halogen, a substituted or unsubstituted alkyl group having 1 to 20 carbon atoms, a substituted or unsubstituted heteroalkyl group having 1 to 20 carbon atoms, a substituted or unsubstituted aryl group having 6 to 30 carbon atoms, or a combination thereof.

11. The metal complex of claim 10, wherein $R_x$ and $R_y$ are selected from hydrogen, deuterium, methyl, isopropyl, isobutyl, trimethylsilyl, dimethylisopropylsilyl, dimethylphenylsilyl, cyano, or a combination thereof, and at least one of $R_x$ and $R_y$ is not hydrogen.

12. The metal complex of claim 1, wherein L is, at each occurrence identically or differently, selected from a single bond, a substituted or unsubstituted alkylene group having 1 to 20 carbon atoms, or a substituted or unsubstituted cycloalkylene group having 3 to 20 ring carbon atoms.

13. The metal complex of claim 12, wherein L is, at each occurrence identically or differently, selected from a single bond, methylene, or ethylene.

14. The metal complex of claim 1, wherein $R_3$ is, at each occurrence identically or differently, selected from a substituted or unsubstituted cycloalkyl group having 3 to 10 ring carbon atoms.

15. The metal complex of claim 14, wherein $R_3$ is, at each occurrence identically or differently, selected from cyclopropyl, cyclobutyl, cyclopentyl, or cyclohexyl.

16. The metal complex of claim 1, wherein y1 is 1, y2 is 1, and y3 is 0; y1 is 2, y2 is 1, and y3 is 0; or y1 is 2, y2 is 2, and y3 is 0.

17. The metal complex of claim 1, wherein $L_a$ is, at each occurrence identically or differently, selected from the group consisting of following structures:

L$_{a9}$
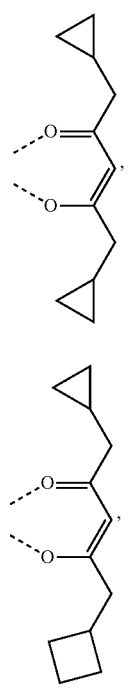
L$_{a15}$
L$_{a21}$
L$_{a22}$
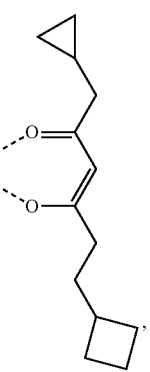
L$_{a24}$
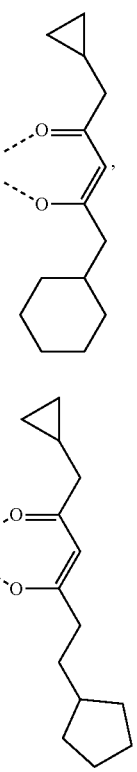
L$_{a25}$
L$_{a29}$
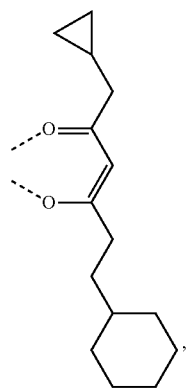
L$_{a37}$
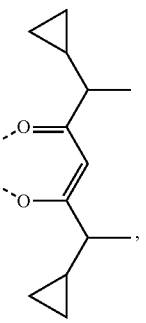

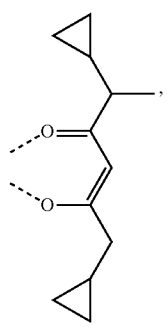
L_{a45}
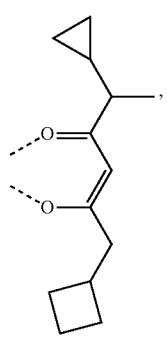
L_{a51}
L_{a56}
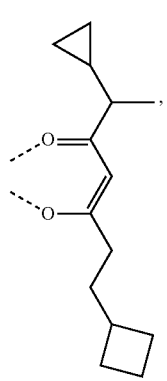
L_{a57}
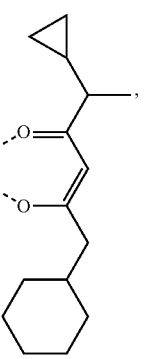
L_{a60}
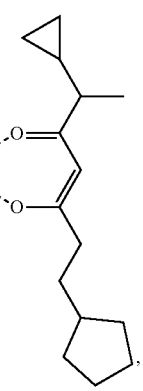
L_{a61}
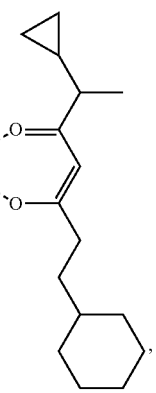
L_{a65}
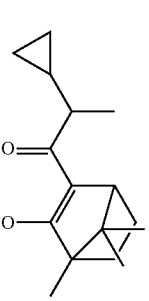
L_{a71}

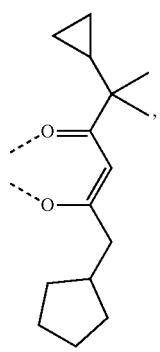
$L_{a83}$
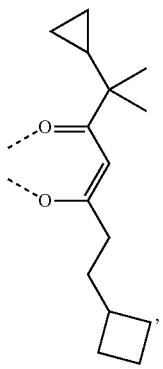
$L_{a84}$
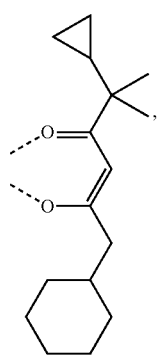
$L_{a86}$
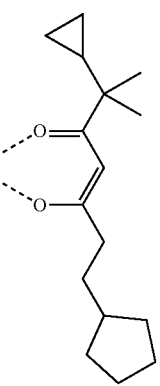
$L_{a87}$
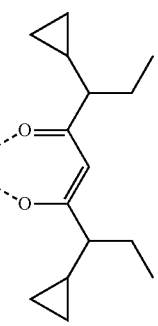
$L_{a97}$
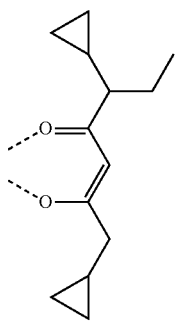
$L_{a104}$
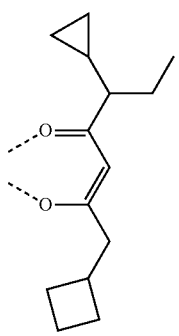
$L_{a110}$
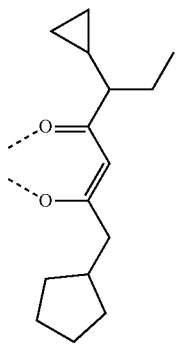
$L_{a116}$

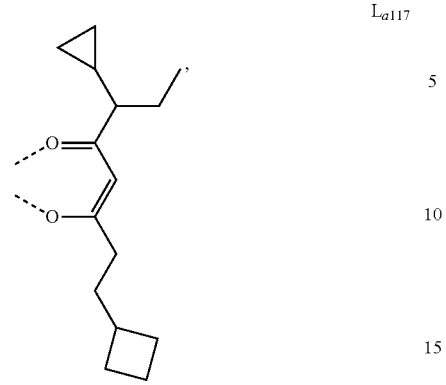
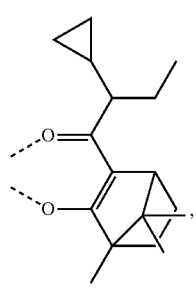
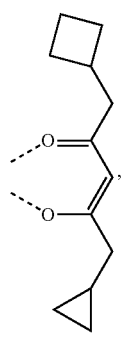
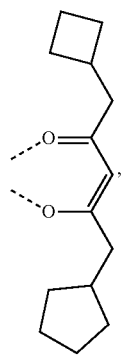

L<sub>a152</sub>
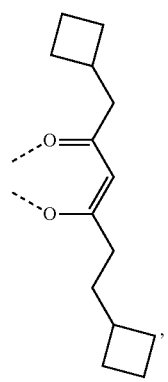
L<sub>a154</sub>
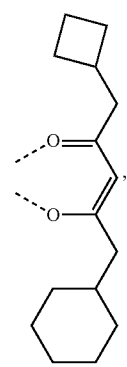
L<sub>a155</sub>
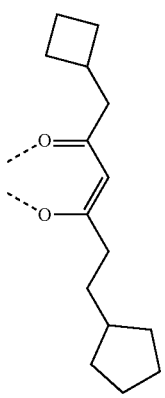
L<sub>a158</sub>
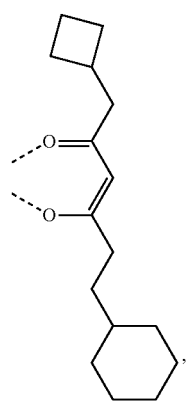
L<sub>a159</sub>
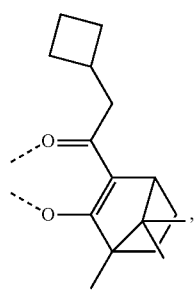
L<sub>a166</sub>
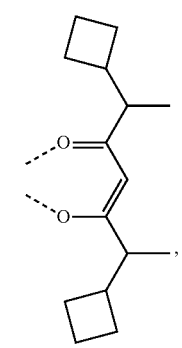
L<sub>a174</sub>
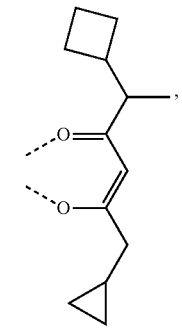
L<sub>a180</sub>
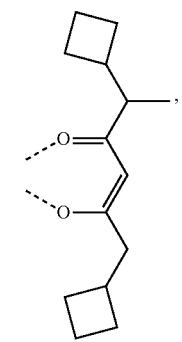

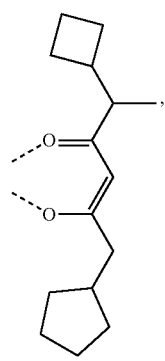 L<sub>a186</sub>
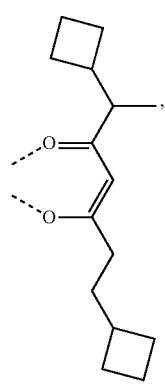 L<sub>a187</sub>
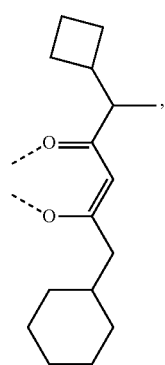 L<sub>a189</sub>
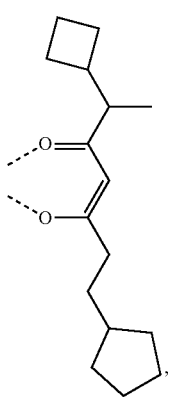 L<sub>a190</sub>
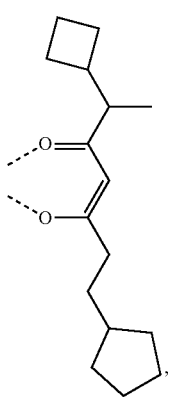 L<sub>a193</sub>
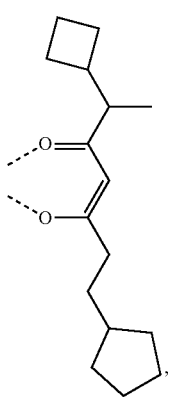 L<sub>a194</sub>
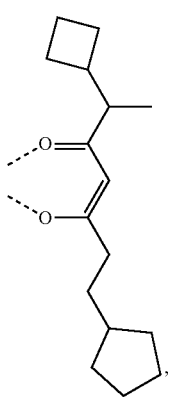 L<sub>a211</sub>
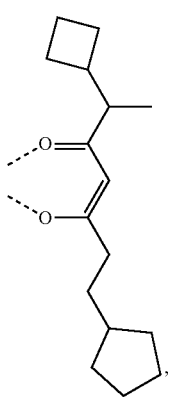 L<sub>a212</sub>

L_{a214}
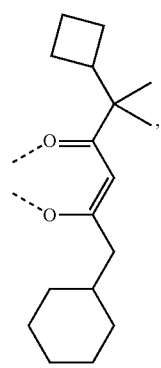
L_{a215}
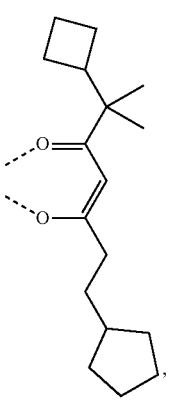
L_{a218}
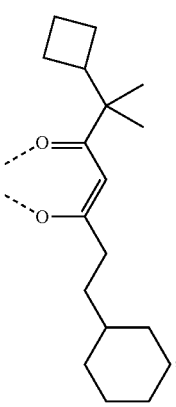
L_{a226}
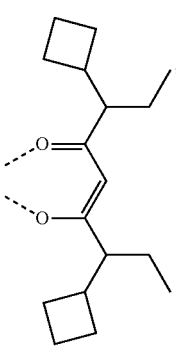
L_{a234}
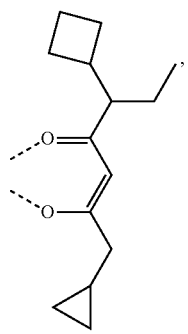
L_{a240}
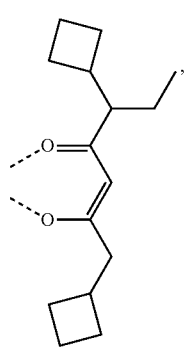
L_{a246}
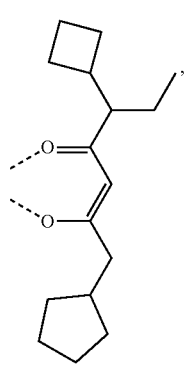
L_{a247}
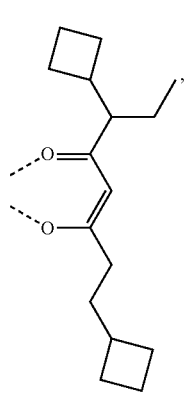

-continued
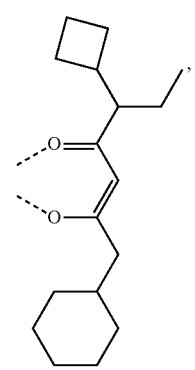
L_{a249}
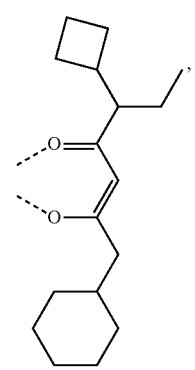
L_{a250}
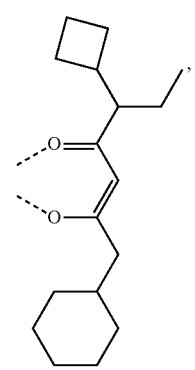
L_{a253}
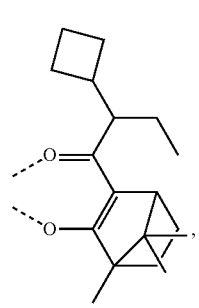
L_{a254}
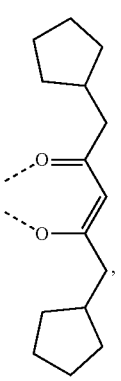
L_{a261}
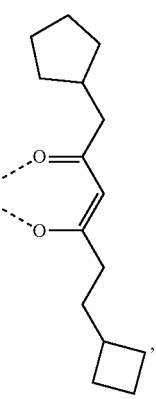
L_{a279}
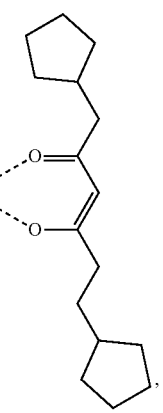
L_{a281}
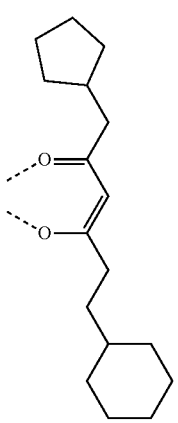
L_{a284}

L_{a285}
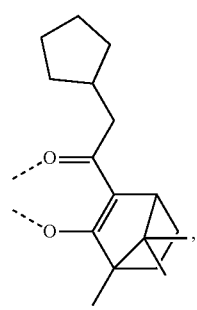
L_{a292}
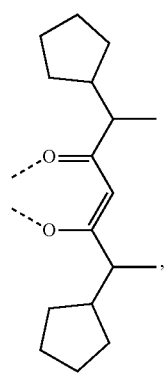
L_{a300}
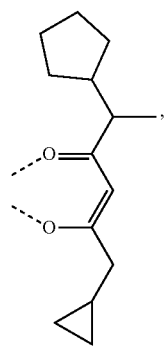
L_{a306}
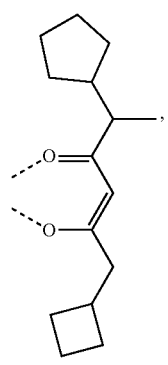
L_{a312}
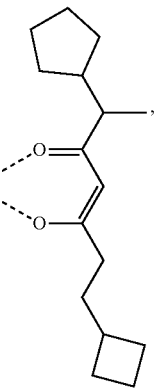
L_{a314}
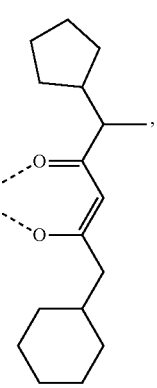
L_{a315}
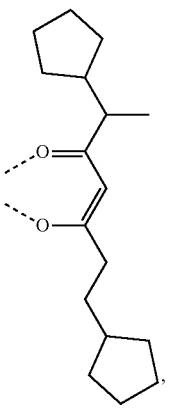
L_{a318}
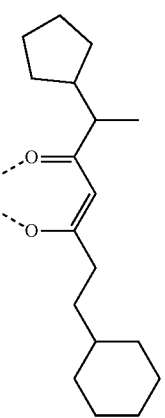

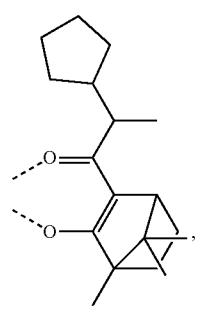
L_a319
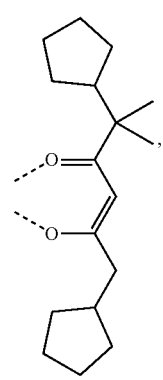
L_a336
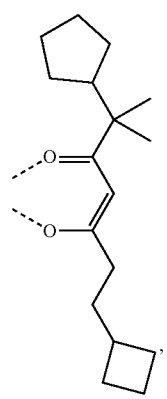
L_a337
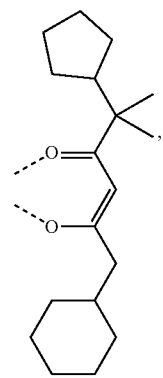
L_a338
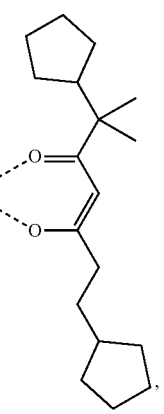
L_a339
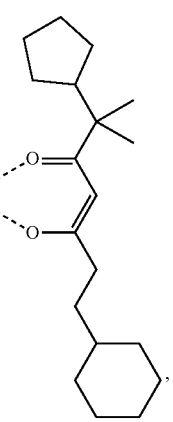
L_a342
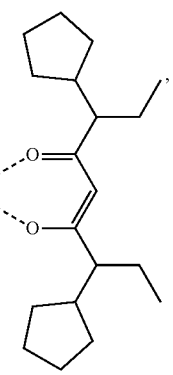
L_a352
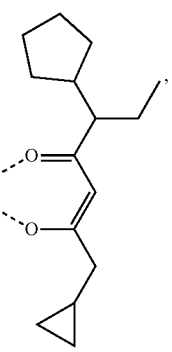
L_a359

L_{a365}
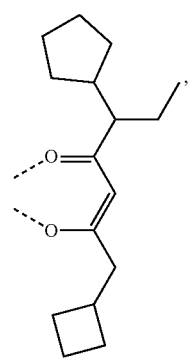
L_{a371}
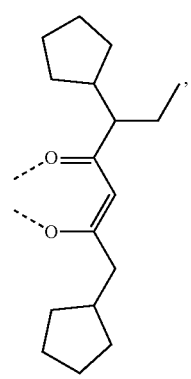
L_{a372}
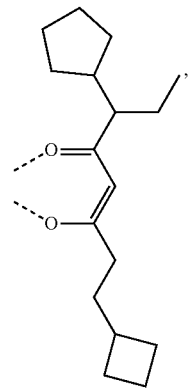
L_{a374}
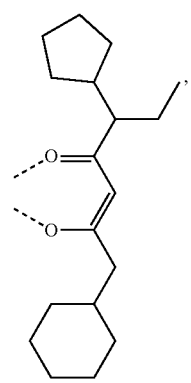
L_{a375}
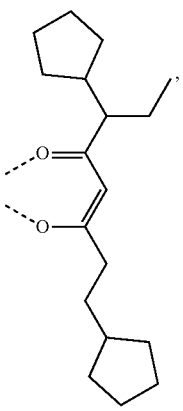
L_{a378}
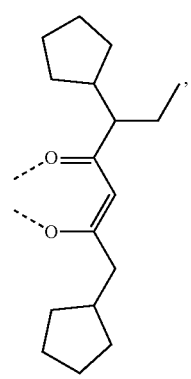
L_{a379}
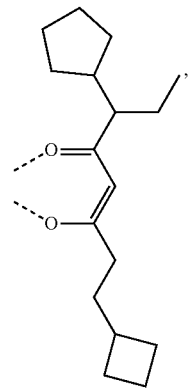
L_{a403}
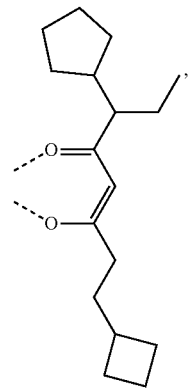

L<sub>a405</sub>
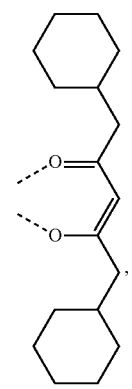
L<sub>a406</sub>
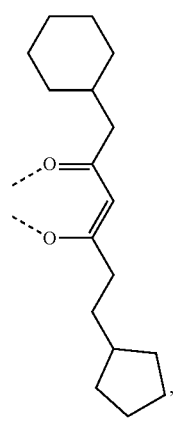
L<sub>a409</sub>
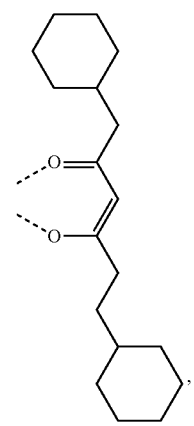
L<sub>a410</sub>
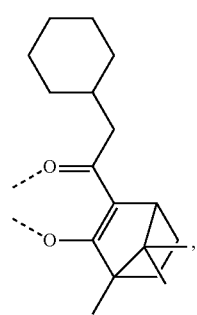
L<sub>a418</sub>
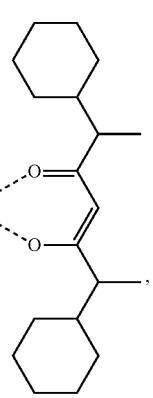
L<sub>a425</sub>
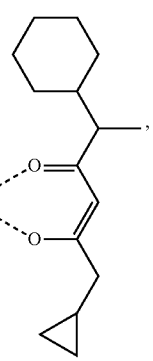
L<sub>a431</sub>
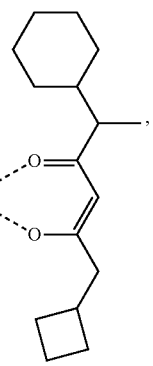
L<sub>a437</sub>
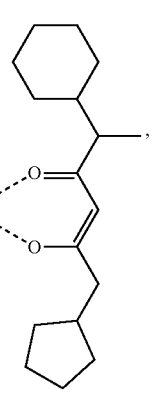

L$_{a438}$
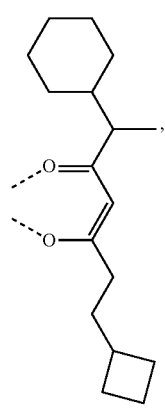
L$_{a440}$
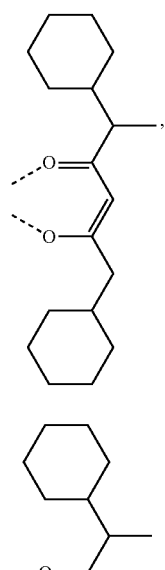
L$_{a441}$
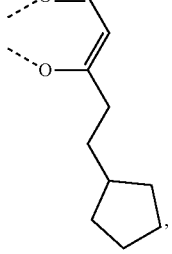
L$_{a444}$
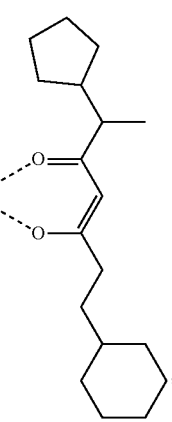
L$_{a445}$
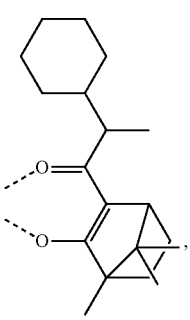
L$_{a462}$
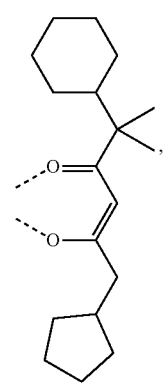
L$_{a463}$
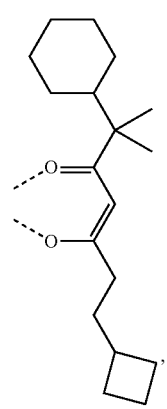
L$_{a465}$
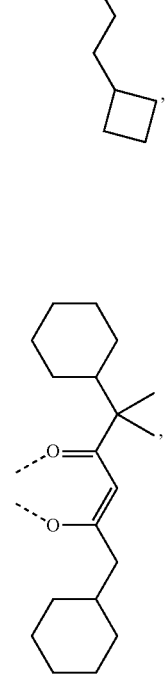

L_a446
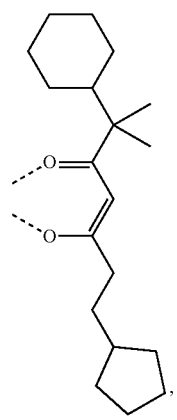
L_a469
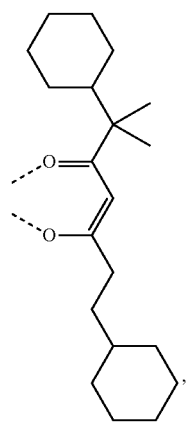
L_a478
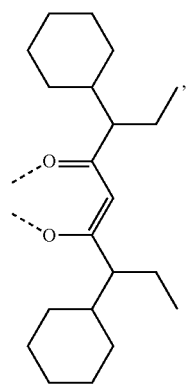
L_a485
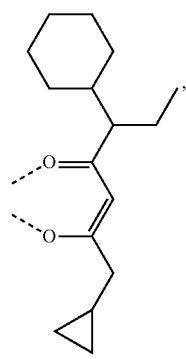
L_a491
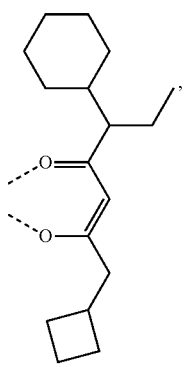
L_a497
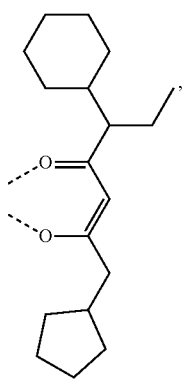
L_a498
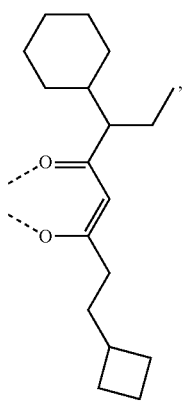
L_a500

L_{a501}
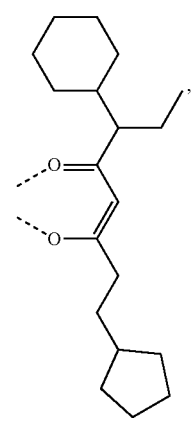
L_{a504}
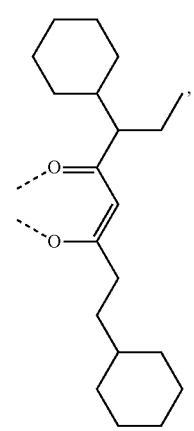
L_{a505}
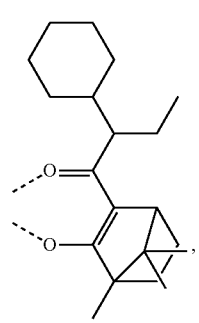
L_{a513}
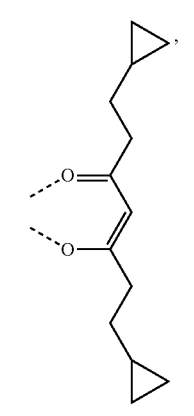
L_{a520}
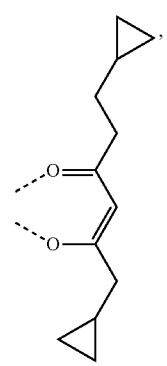
L_{a527}
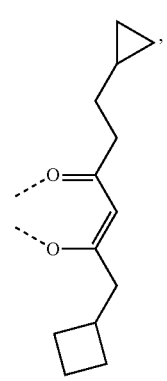
L_{a533}
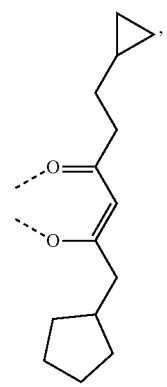
L_{a534}
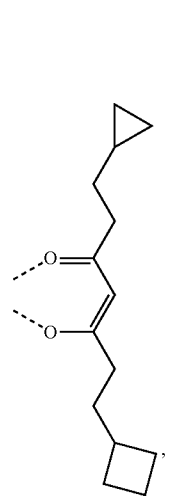

L_{a536}
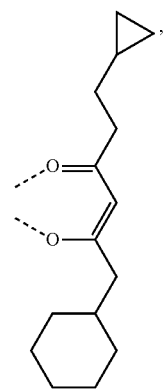
L_{a537}
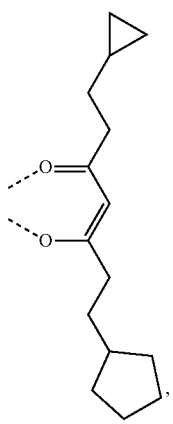
L_{a540}
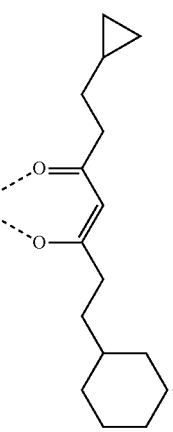
L_{a541}
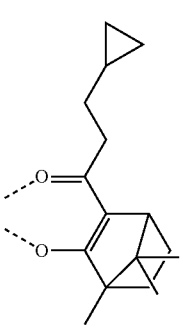
L_{a549}
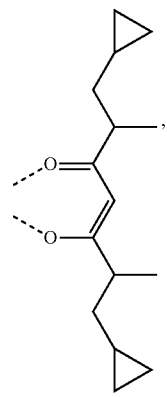
L_{a556}
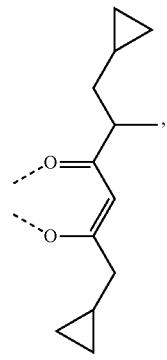
L_{a562}
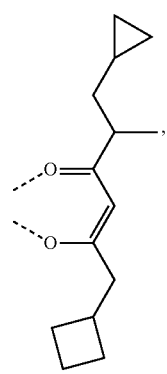
L_{a568}
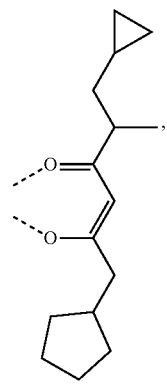

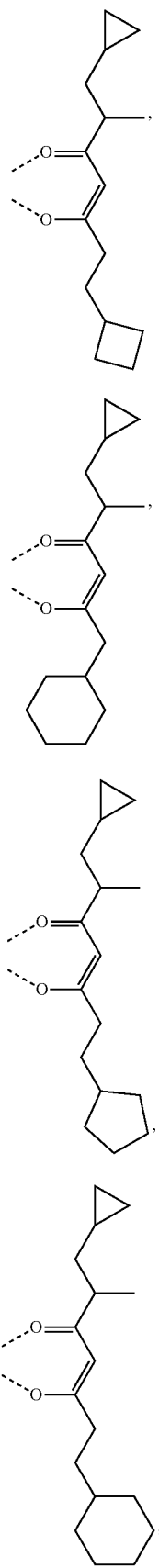
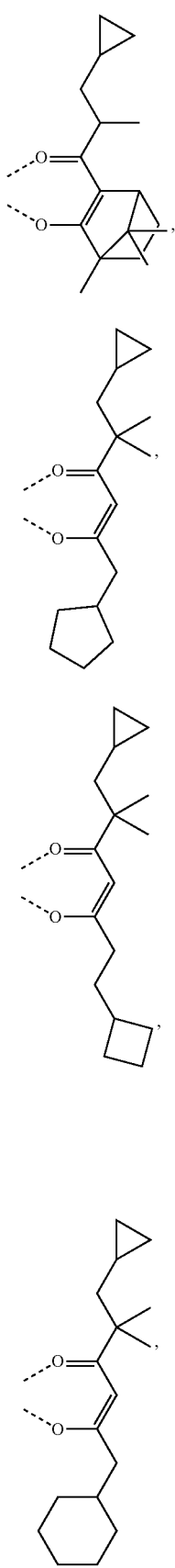

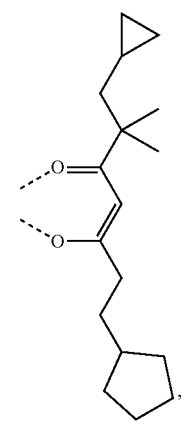
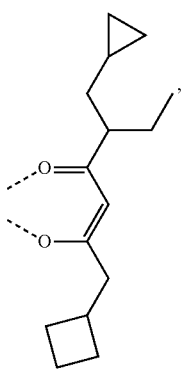

L<sub>a632</sub>
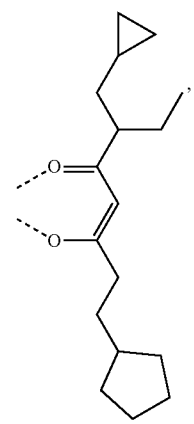
L<sub>a635</sub>
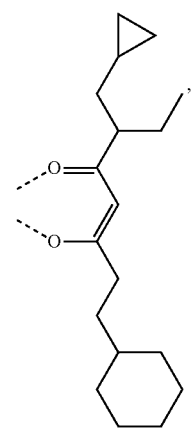
L<sub>a636</sub>
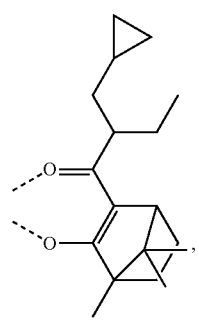
L<sub>a651</sub>
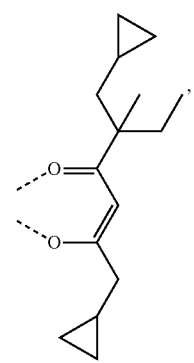
L<sub>a657</sub>
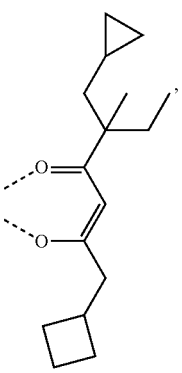
L<sub>a663</sub>
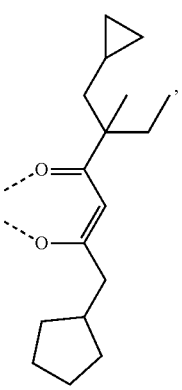
L<sub>a664</sub>
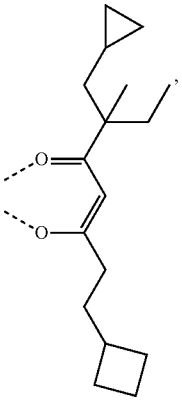
L<sub>a666</sub>
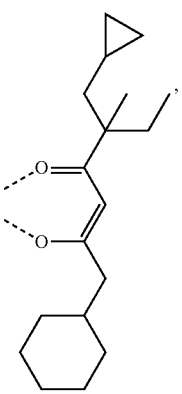

L_{a667}
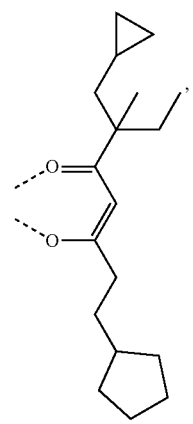
L_{a670}
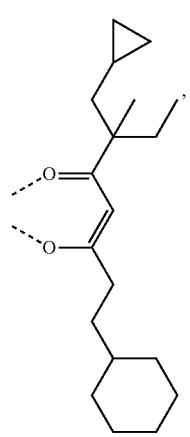
L_{a695}
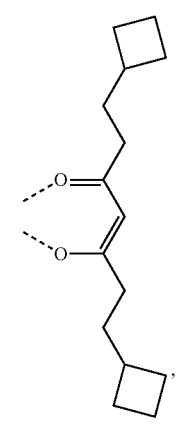
L_{a697}
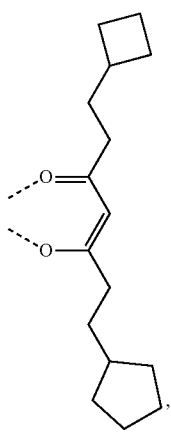
L_{a700}
L_{a701}
L_{a709}

L<sub>a716</sub>
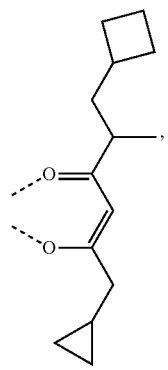
L<sub>a722</sub>
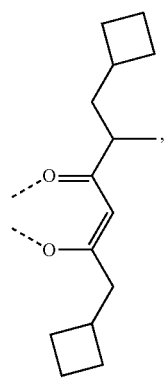
L<sub>a728</sub>
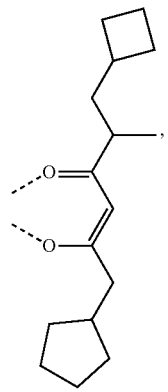
L<sub>a729</sub>
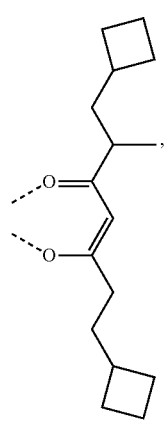
L<sub>a731</sub>
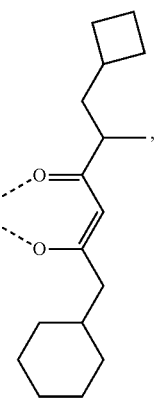
L<sub>a732</sub>
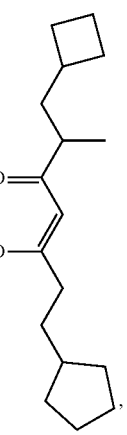
L<sub>a735</sub>
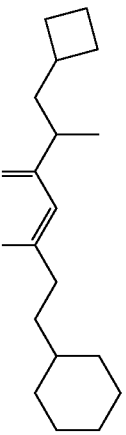
L<sub>a736</sub>
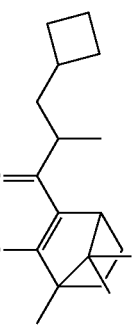

L_{a753}
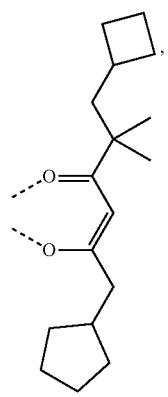
L_{a754}
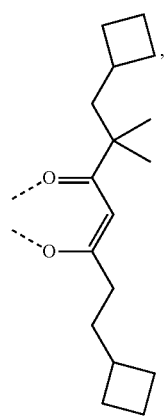
L_{a756}
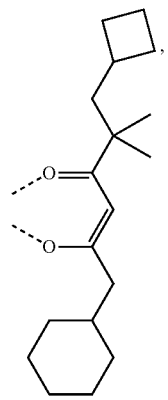
L_{a757}
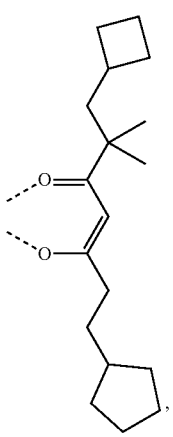
L_{a760}
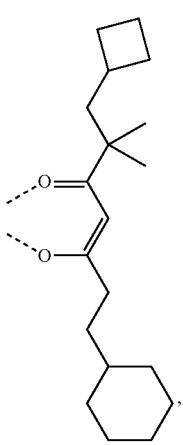
L_{a769}
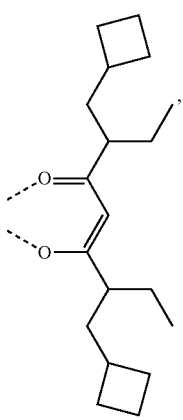
L_{a776}
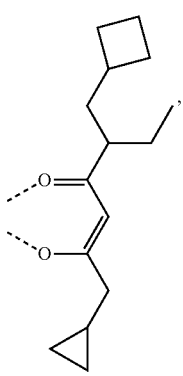
L_{a782}
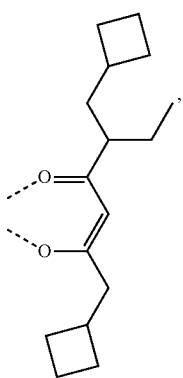

L<sub>a788</sub>
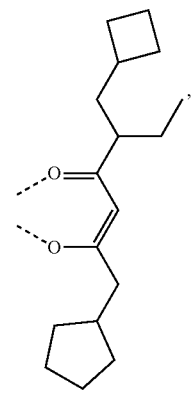
L<sub>a789</sub>
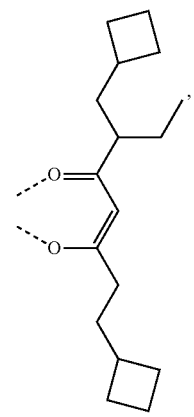
L<sub>a791</sub>
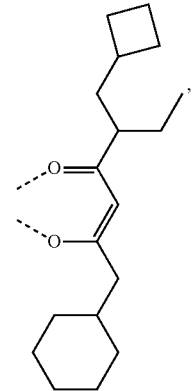
L<sub>a792</sub>
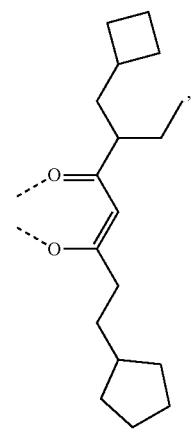
L<sub>a795</sub>
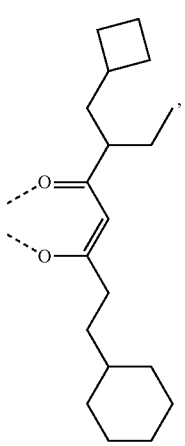
L<sub>a796</sub>
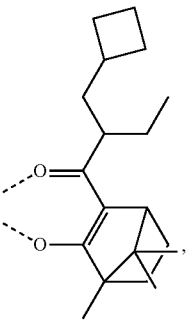
L<sub>a811</sub>
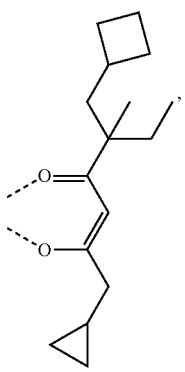
L<sub>a817</sub>
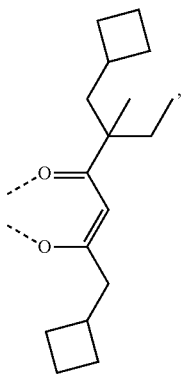

-continued
L_{a823}
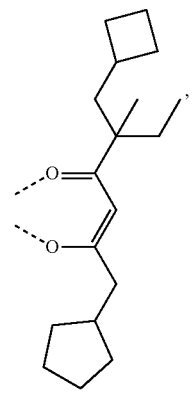
L_{a824}
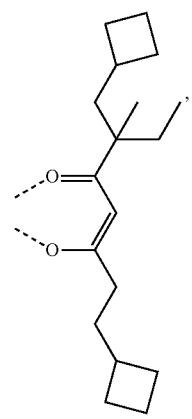
L_{a826}
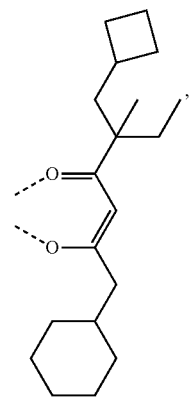
L_{a827}
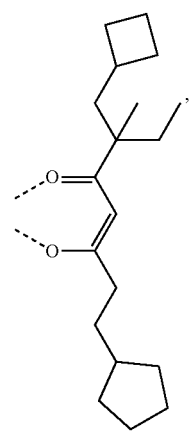
-continued
L_{a830}
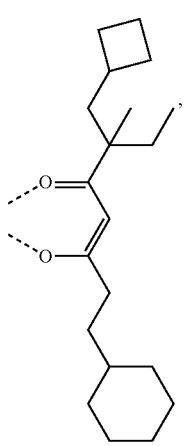
L_{a839}
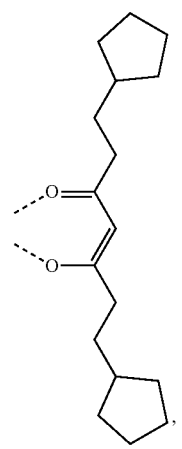
L_{a859}
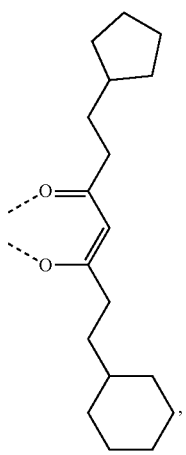

L_a860
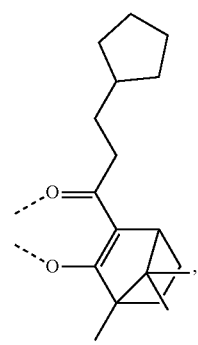
L_a868
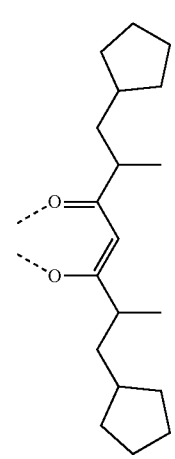
L_a875
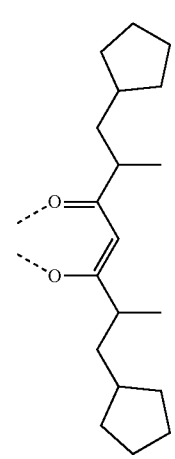
L_a881
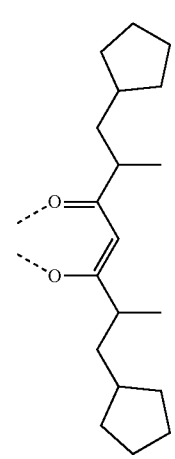
L_a887
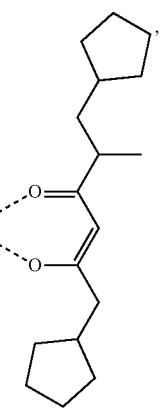
L_a888
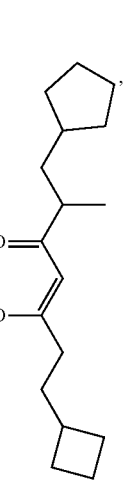
L_a890
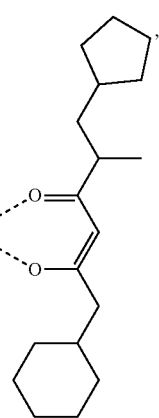

L_{a891}
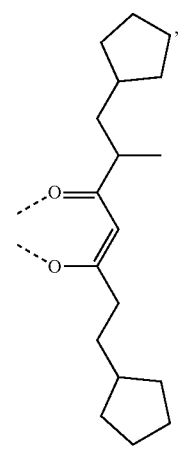
L_{a894}
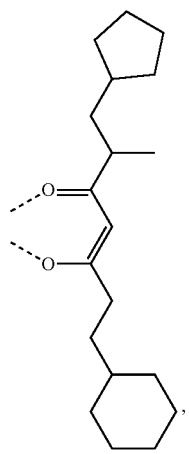
L_{a895}
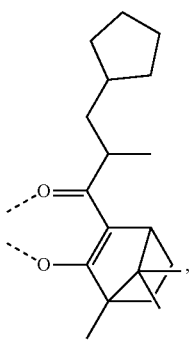
L_{a907}
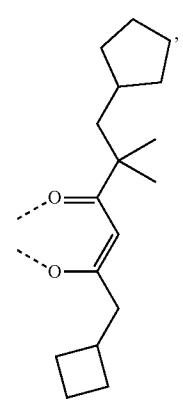
L_{a913}
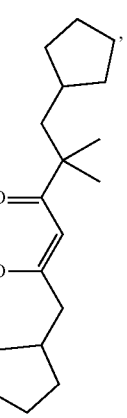
L_{a914}
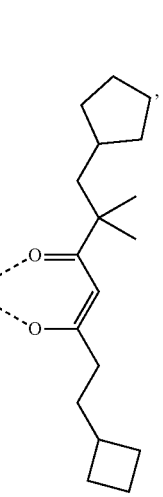
L_{a916}
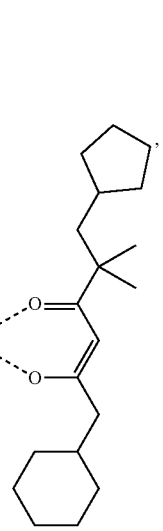

-continued
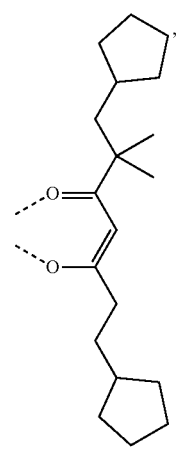
L_{a917}
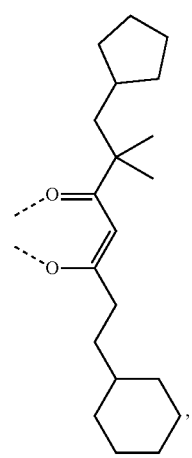
L_{a920}
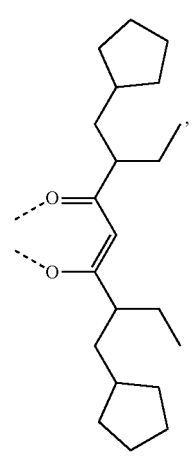
L_{a929}
-continued
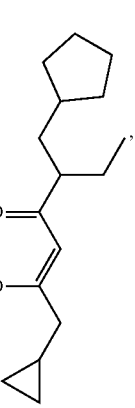
L_{a936}
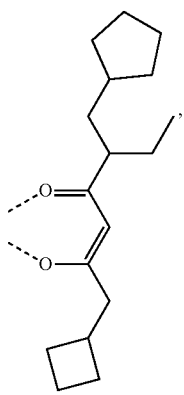
L_{a942}
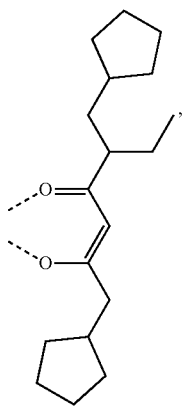
L_{a948}
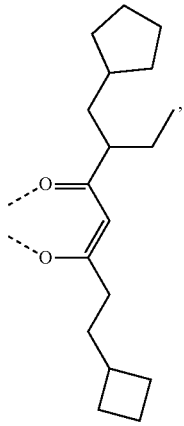
L_{a949}

L<sub>a951</sub>
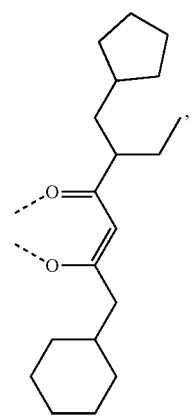
L<sub>a952</sub>
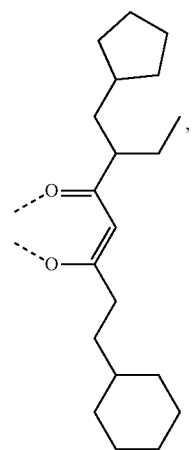
L<sub>a955</sub>
L<sub>a956</sub>
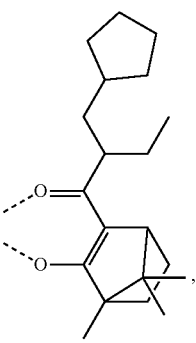
L<sub>a971</sub>
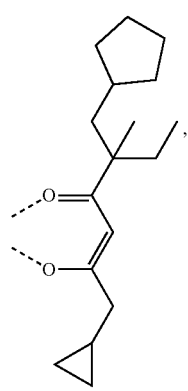
L<sub>a977</sub>
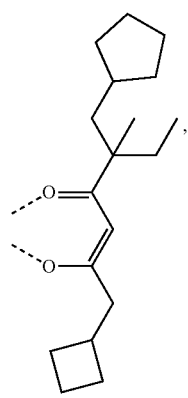
L<sub>a983</sub>
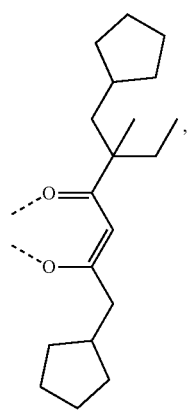

L$_{a984}$
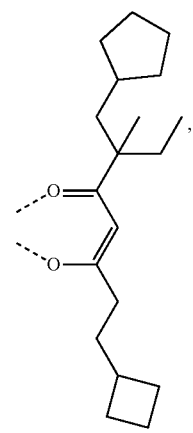
L$_{a991}$
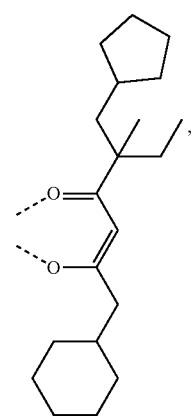
L$_{a992}$
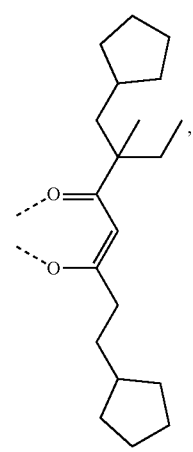
L$_{a995}$
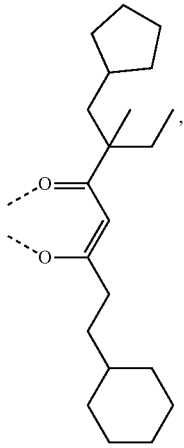
L$_{a1018}$
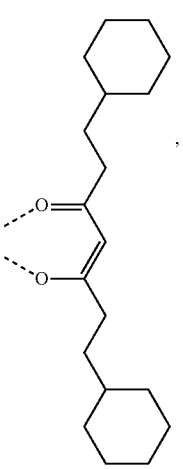
L$_{a1027}$
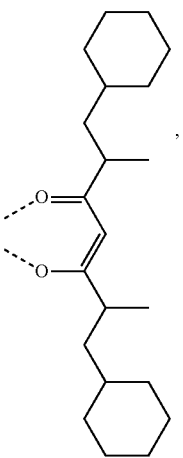

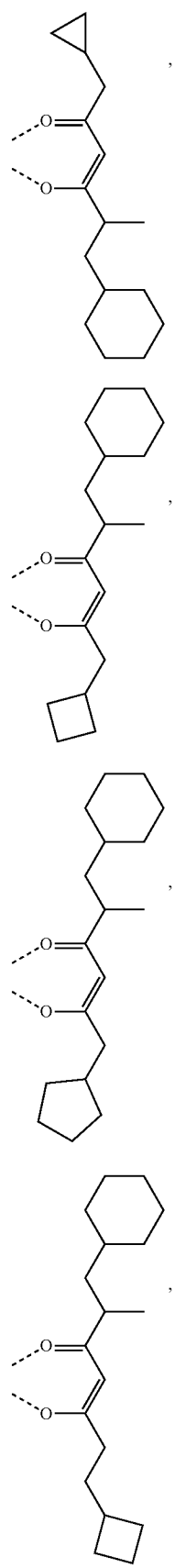
L_{a1034}
L_{a1040}
L_{a1046}
L_{a1047}
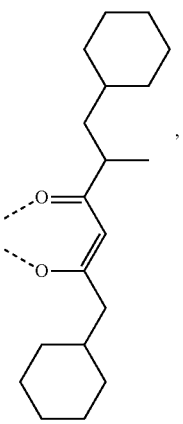
L_{a1054}
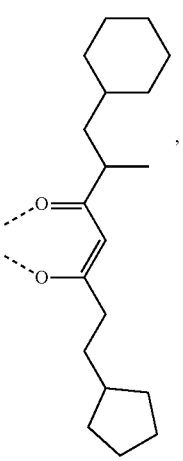
L_{a1055}
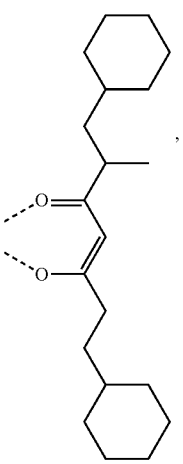
L_{a1058}

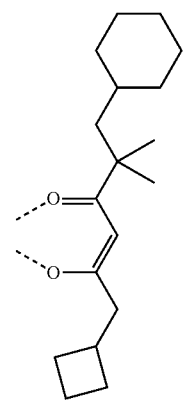
$L_{a1066}$
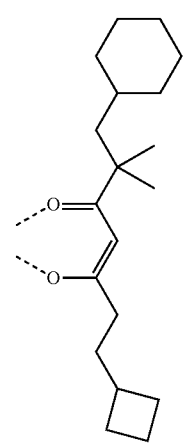
$L_{a1072}$
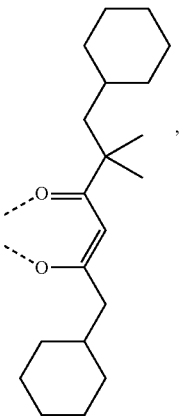
$L_{a1075}$
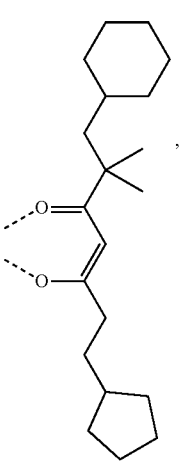
$L_{a1076}$
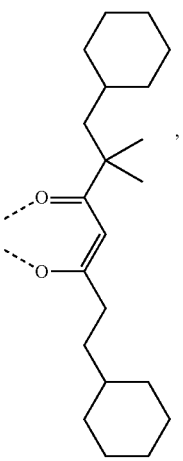
$L_{a1079}$
$L_{a1073}$ L_{a1088}
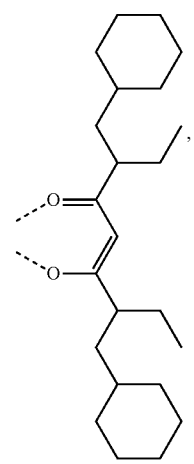
L_{a1095}
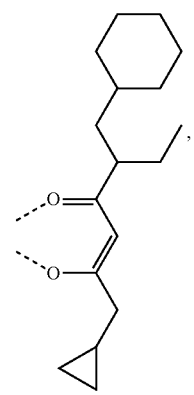
L_{a1101}
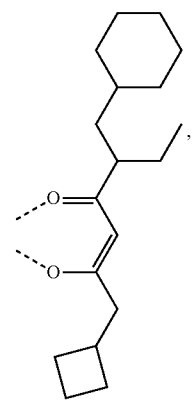
L_{a1107}
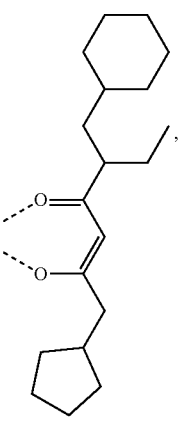
L_{a1108}
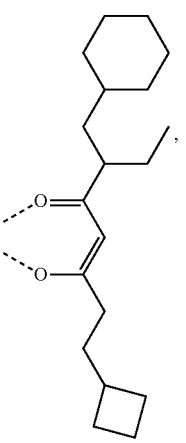
L_{a1115}
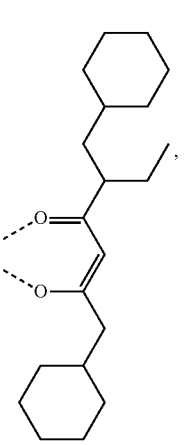

-continued
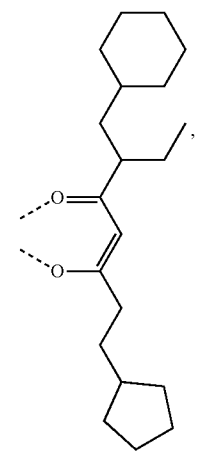 L_a1116
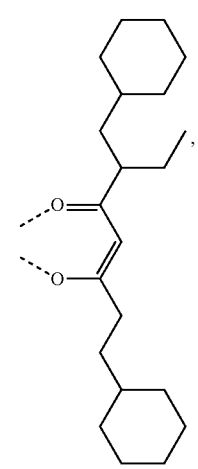 L_a1119
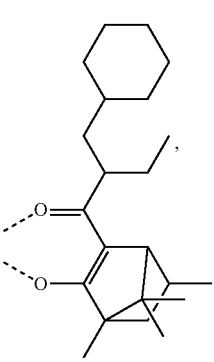 L_a1120
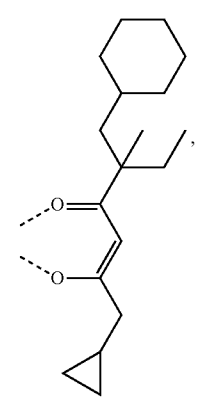 L_a1130
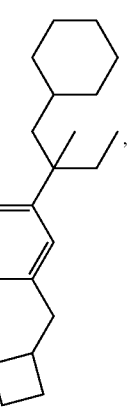 L_a1136
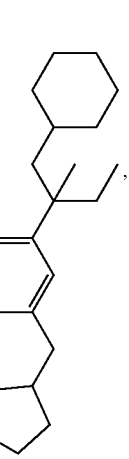 L_a1142
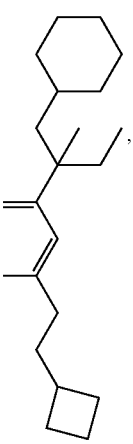 L_a1143

L_{a1150}
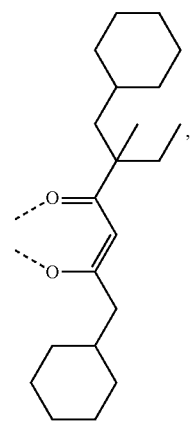
L_{a1151}
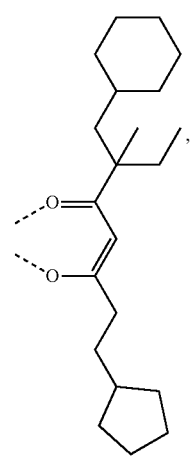
L_{a1154}
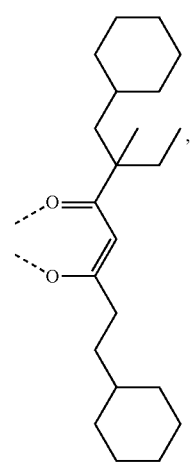
L_{a1164}
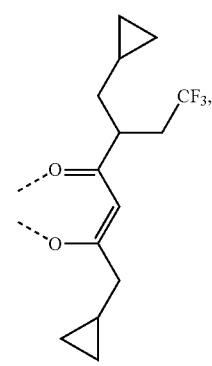
L_{a1170}
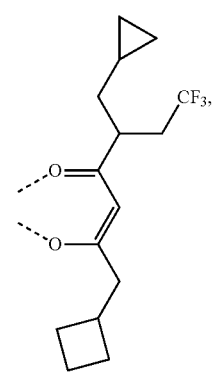
L_{a1176}
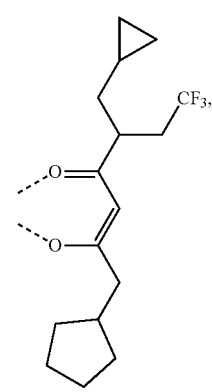
L_{a1177}
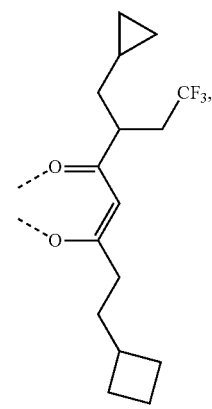

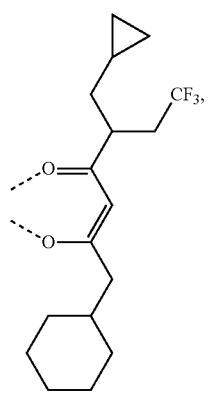 $L_{a1179}$
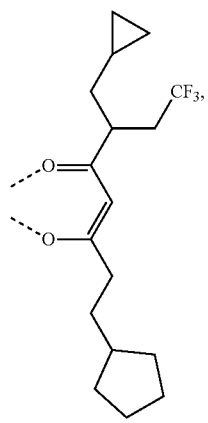 $L_{a1180}$
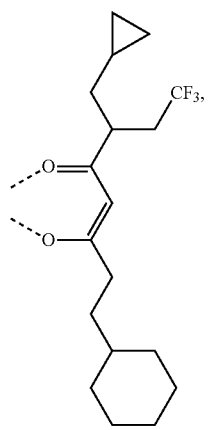 $L_{a1183}$
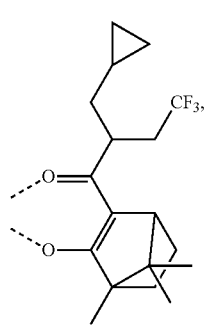 $L_{a1184}$
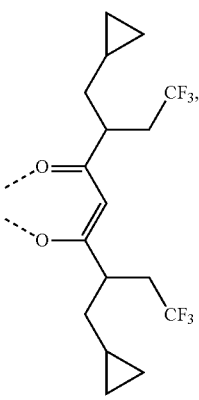 $L_{a1185}$
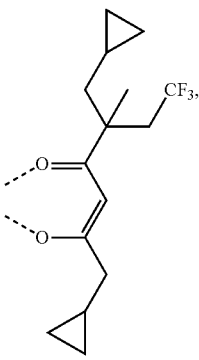 $L_{a1199}$
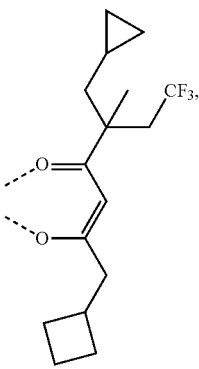 $L_{a1205}$
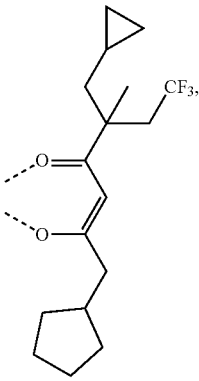 $L_{a1211}$

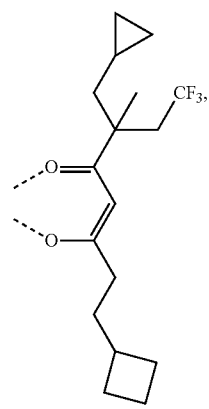 L$_{a1212}$
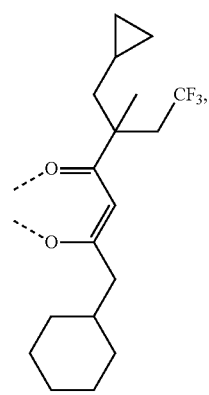 L$_{a1214}$
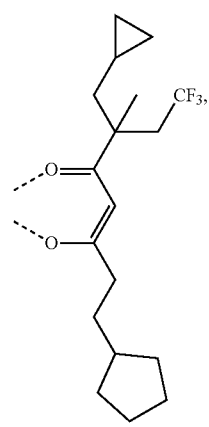 L$_{a1215}$
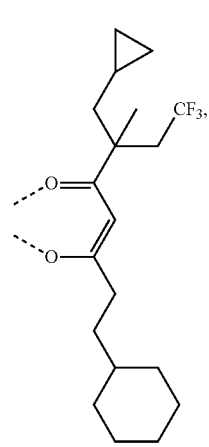 L$_{a1218}$
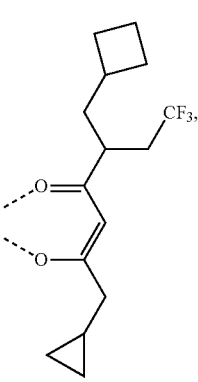 L$_{a1229}$
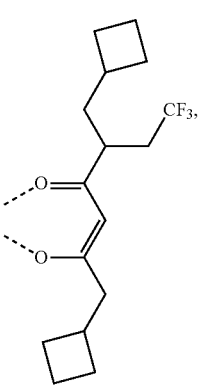 L$_{a1235}$
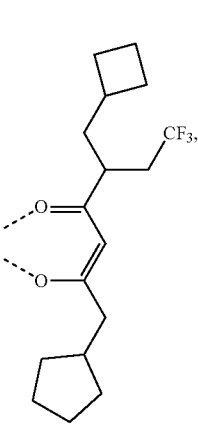 L$_{a1241}$
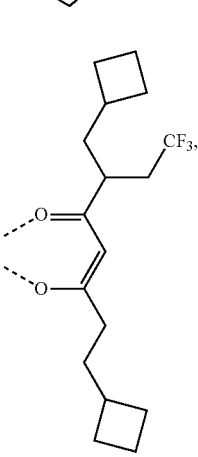 L$_{a1242}$ $L_{a1249}$
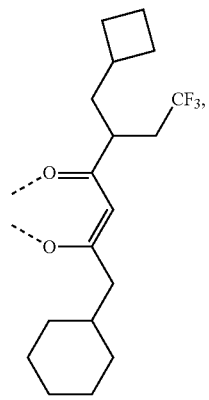
$L_{a1250}$
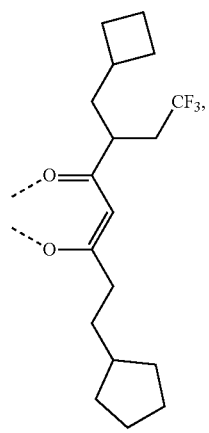
$L_{a1253}$
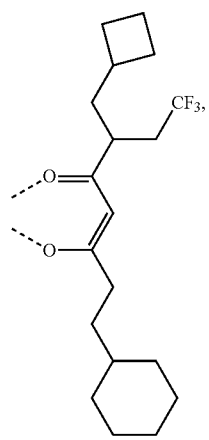
$L_{a1254}$
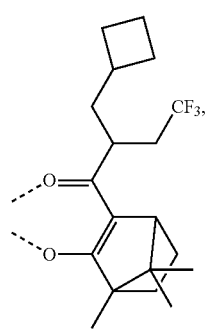
$L_{a1255}$
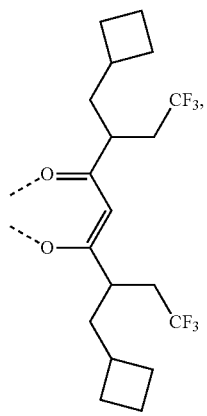
$L_{a1264}$
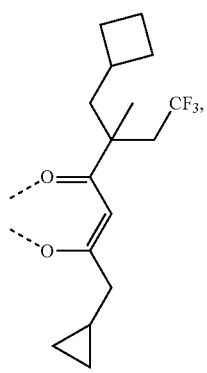
$L_{a1270}$
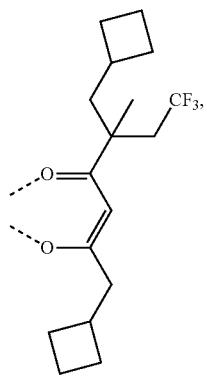
$L_{a1276}$
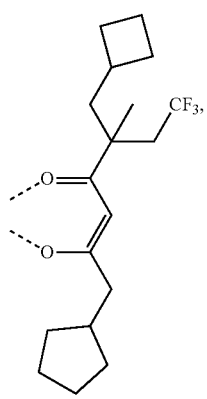

-continued
L$_{a1277}$
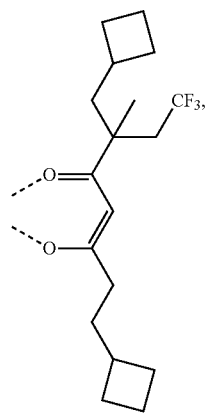
L$_{a1284}$
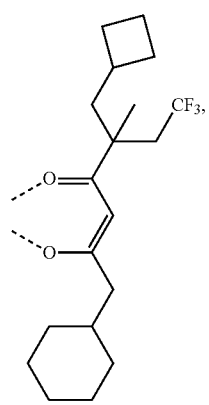
L$_{a1285}$
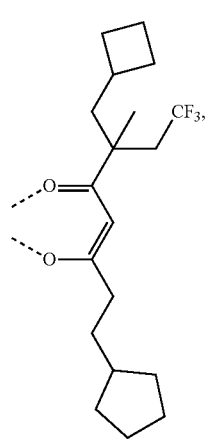
-continued
L$_{a1288}$
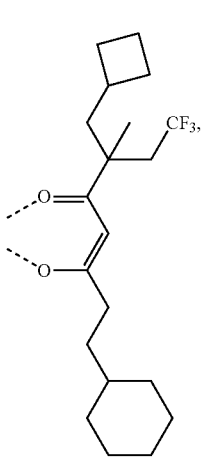
L$_{a1299}$
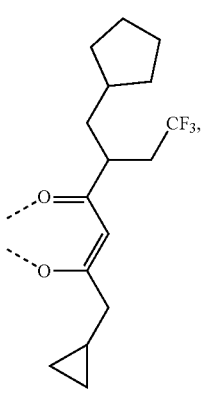
L$_{a1305}$
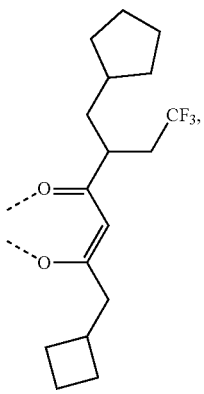
L$_{a1311}$
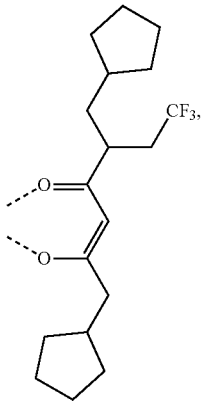

-continued
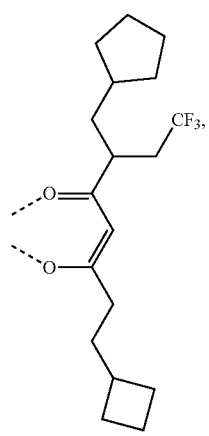
$L_{a1312}$
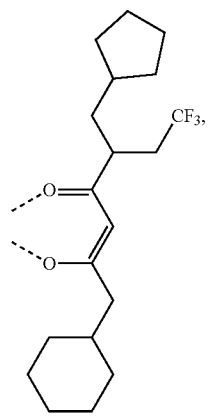
$L_{a1319}$
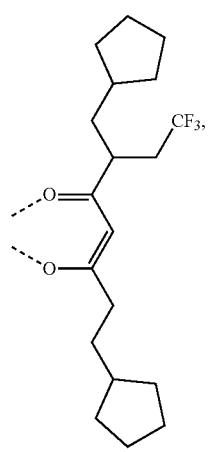
$L_{a1320}$
-continued
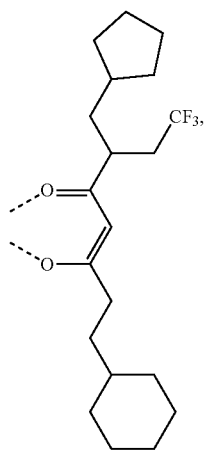
$L_{a1323}$
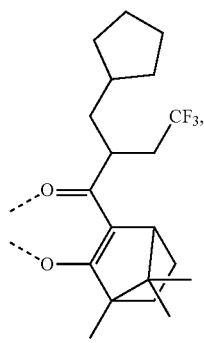
$L_{a1324}$
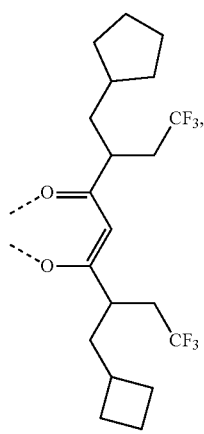
$L_{a1325}$
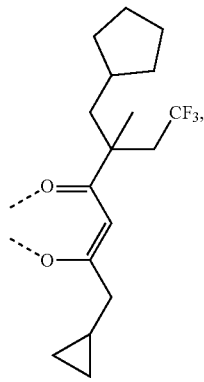
$L_{a1334}$

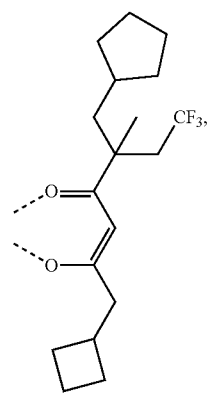
L<sub>a1340</sub>
L<sub>a1346</sub>
L<sub>a1347</sub>
L<sub>a1354</sub>
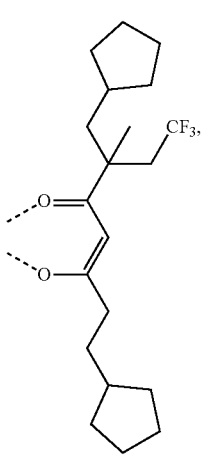
L<sub>a1355</sub>
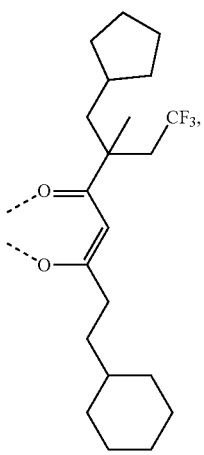
L<sub>a1358</sub>
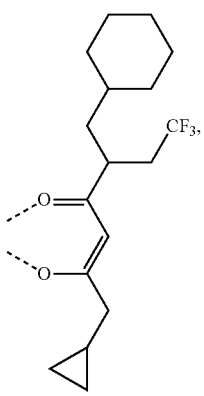
L<sub>a1369</sub>

L<sub>a1375</sub>
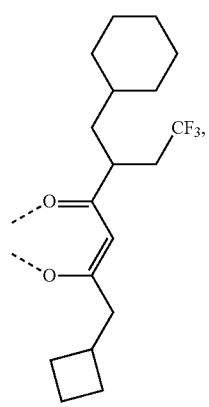
L<sub>a1381</sub>
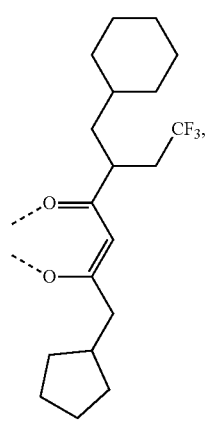
L<sub>a1382</sub>
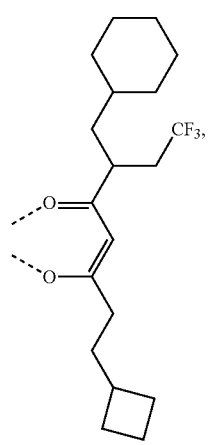
L<sub>a1389</sub>
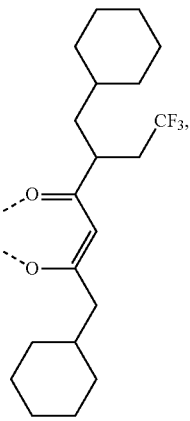
L<sub>a1390</sub>
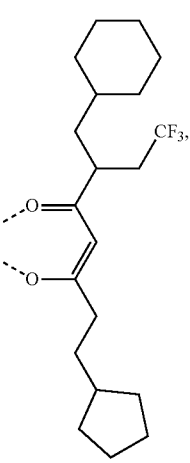
L<sub>a1393</sub>
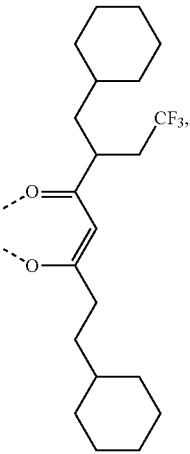

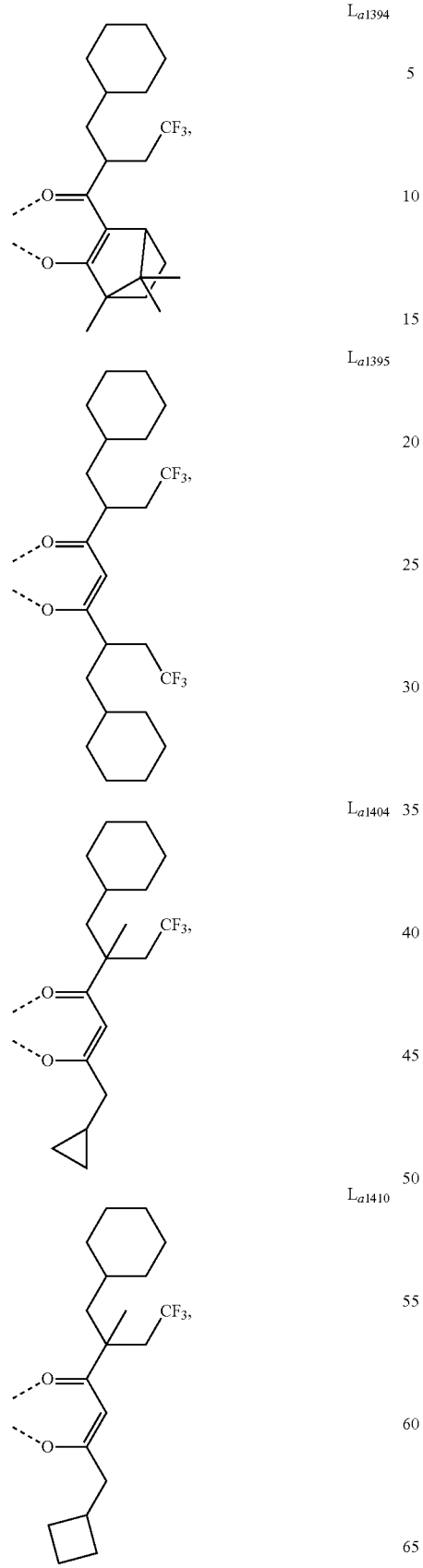
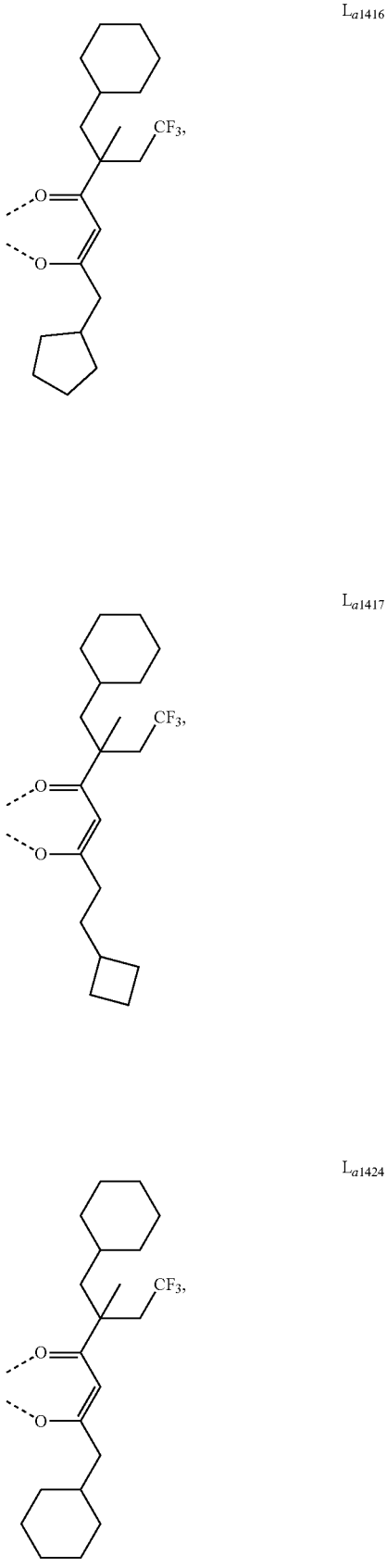

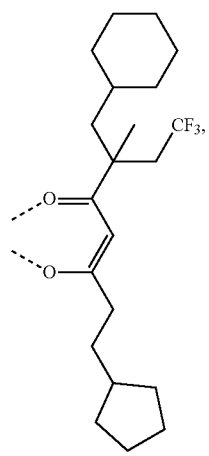 L_{a1425}
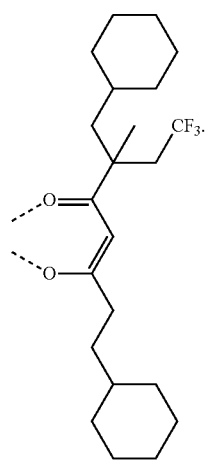 L_{a1428}
18. The metal complex of claim 17, wherein $L_b$ is, at each occurrence identically or differently, selected from the group consisting of following structures:
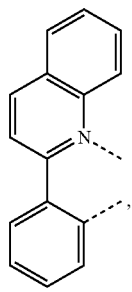 L_{b1}
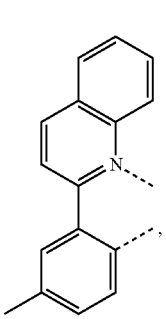 L_{b2}
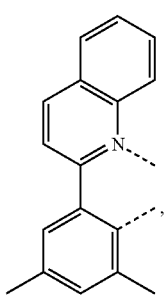 L_{b3}
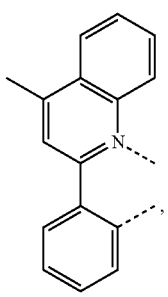 L_{b4}
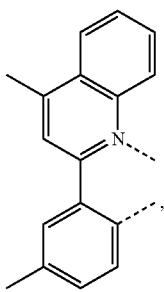 L_{b5}
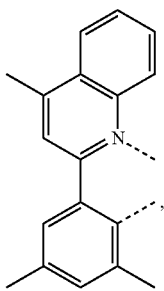 L_{b6}

L_{b7}
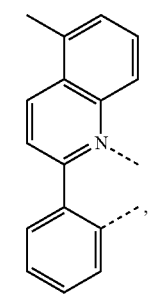
L_{b8}
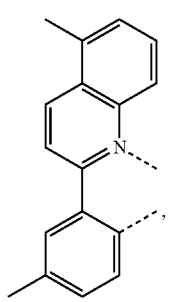
L_{b9}
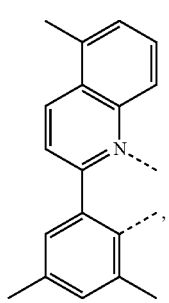
L_{b10}
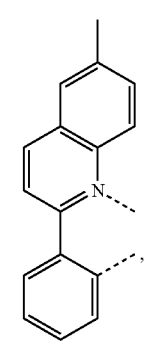
L_{b11}
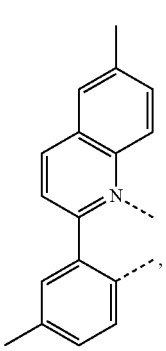
L_{b12}
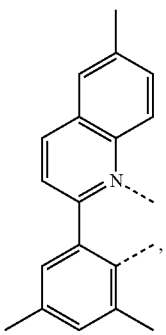
L_{b13}
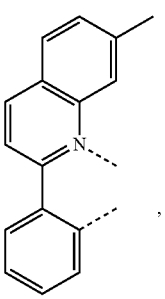
L_{b14}
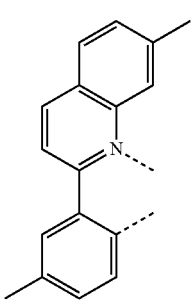
L_{b15}
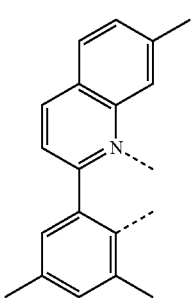
L_{b16}
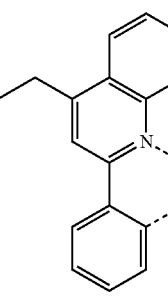

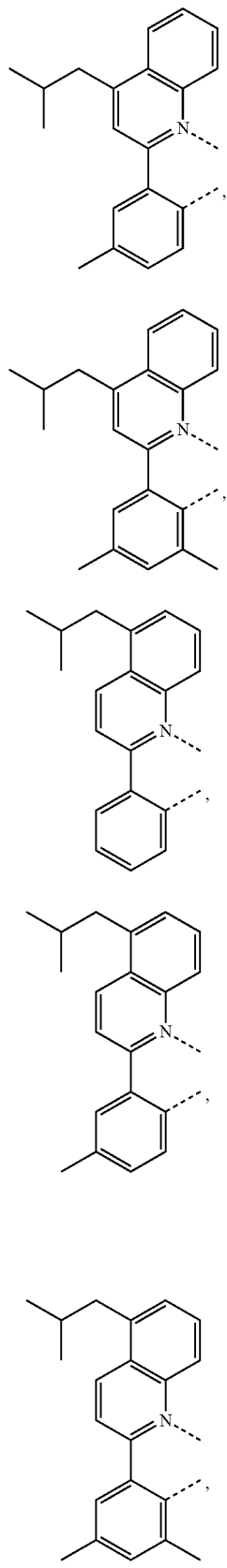
$L_{b17}$
$L_{b18}$
$L_{b19}$
$L_{b20}$
$L_{b21}$
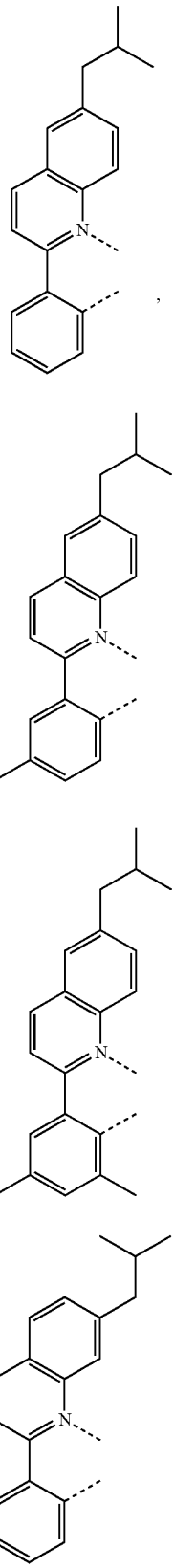
$L_{b22}$
$L_{b23}$
$L_{b24}$
$L_{b25}$ -continued
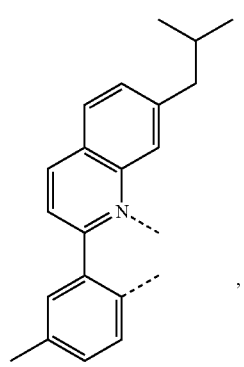 L<sub>b26</sub>
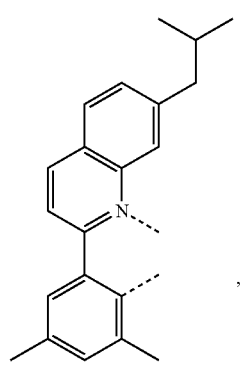 L<sub>b27</sub>
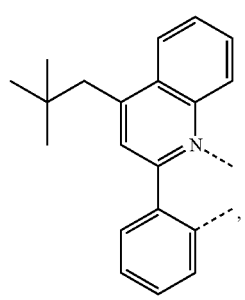 L<sub>b28</sub>
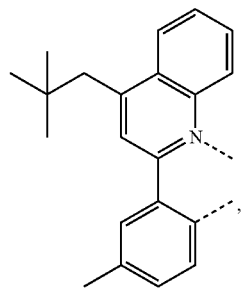 L<sub>b29</sub>
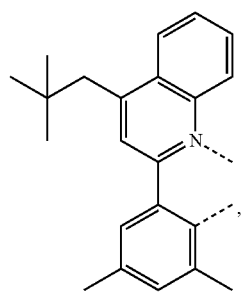 L<sub>b30</sub>
-continued
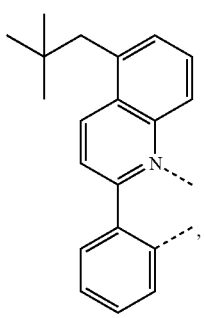 L<sub>b31</sub>
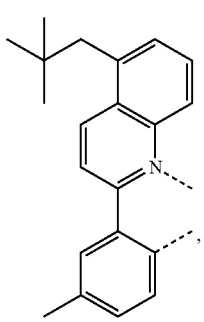 L<sub>b32</sub>
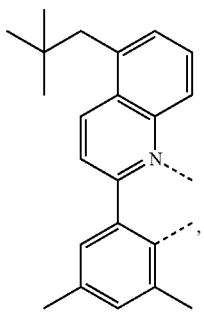 L<sub>b33</sub>
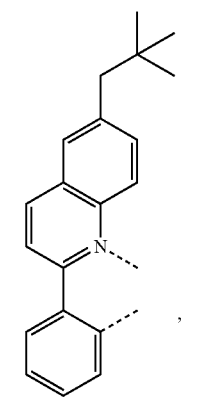 L<sub>b34</sub>

L<sub>b35</sub>
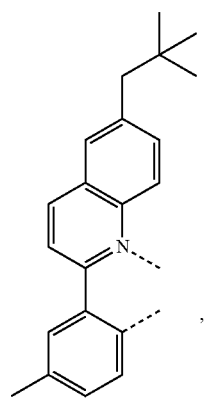
L<sub>b36</sub>
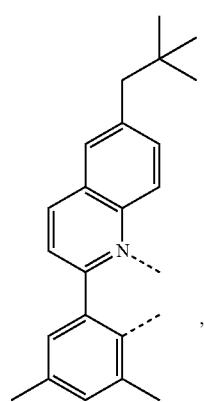
L<sub>b37</sub>
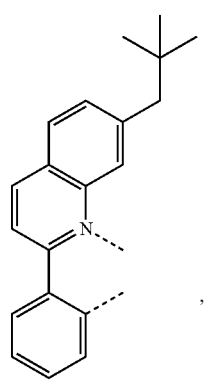
L<sub>b38</sub>
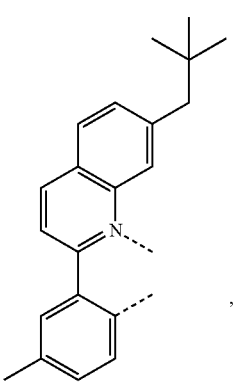
L<sub>b39</sub>
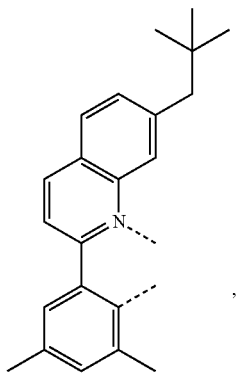
L<sub>b76</sub>
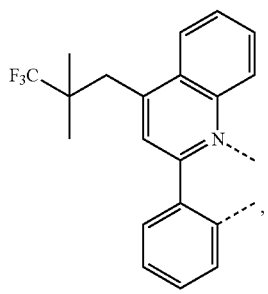
L<sub>b77</sub>
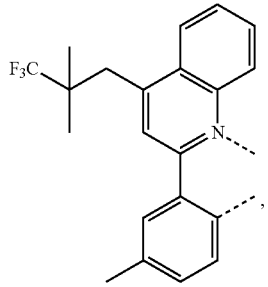
L<sub>b78</sub>
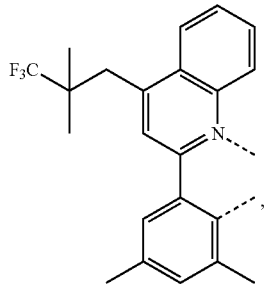
L<sub>b79</sub>
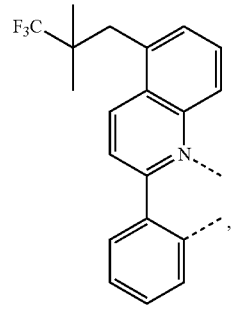

-continued
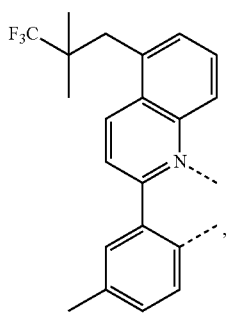
L_{b80}
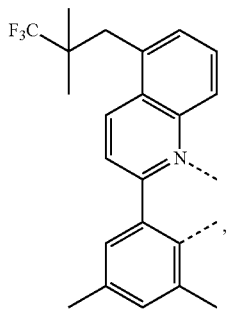
L_{b81}
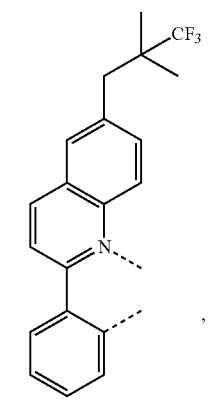
L_{b82}
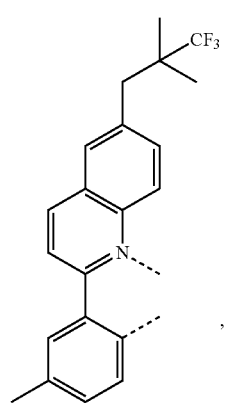
L_{b83}
-continued
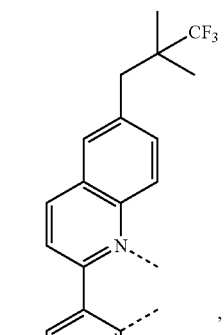
L_{b84}
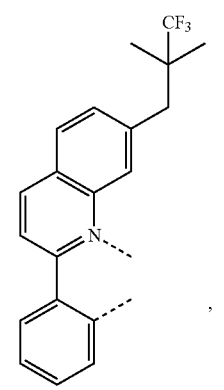
L_{b85}
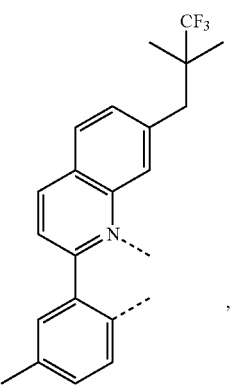
L_{b86}
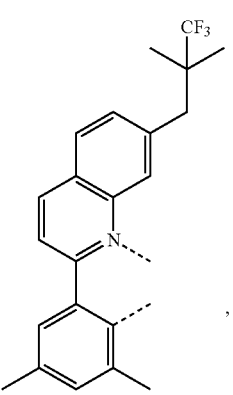
L_{b87}

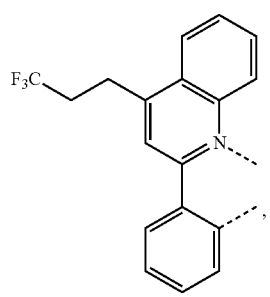 L_{b88}
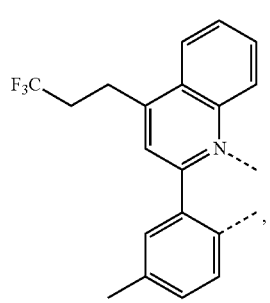 L_{b89}
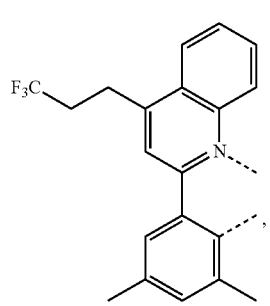 L_{b90}
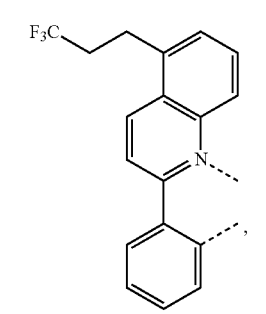 L_{b91}
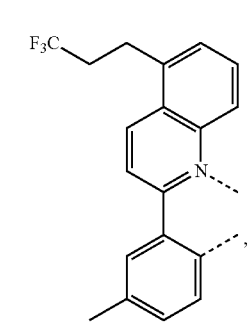 L_{b92}
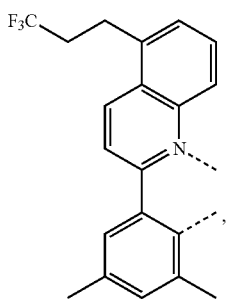 L_{b93}
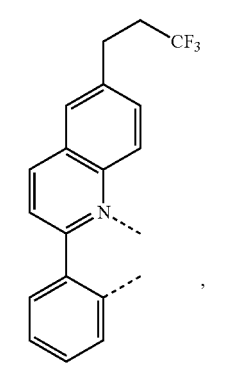 L_{b94}
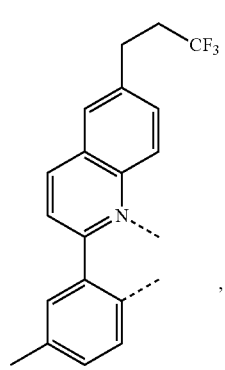 L_{b95}
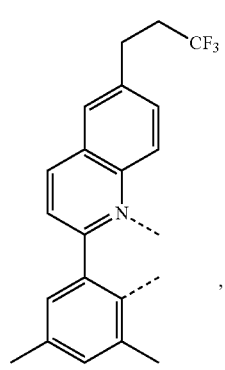 L_{b96}

L<sub>b</sub>97
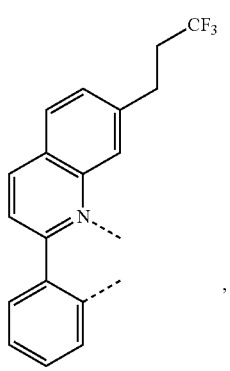
L<sub>b</sub>98
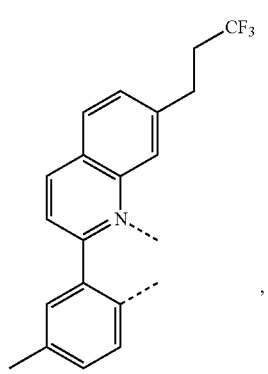
L<sub>b</sub>99
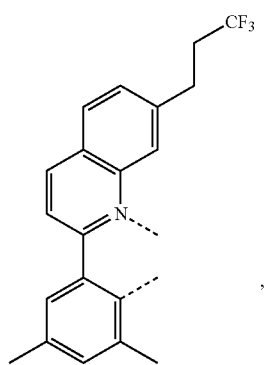
L<sub>b</sub>100
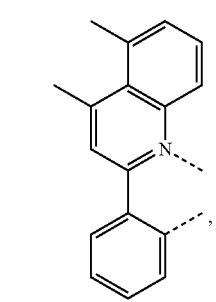
L<sub>b</sub>101
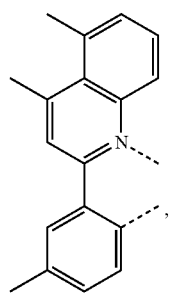
L<sub>b</sub>102
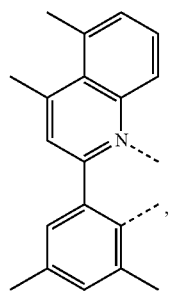
L<sub>b</sub>103
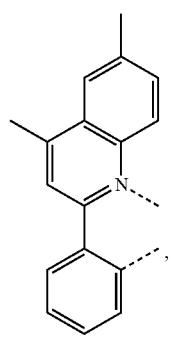
L<sub>b</sub>104
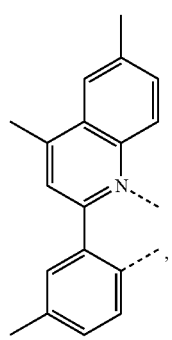
L<sub>b</sub>105
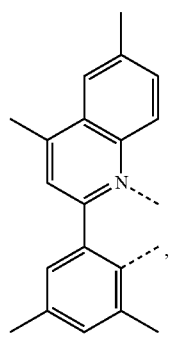

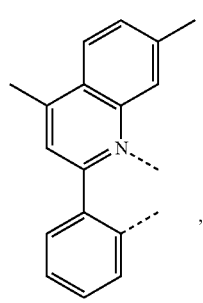 L<sub>b</sub>106
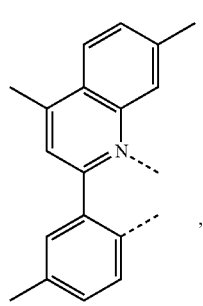 L<sub>b</sub>107
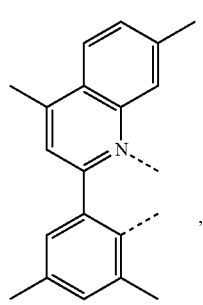 L<sub>b</sub>108
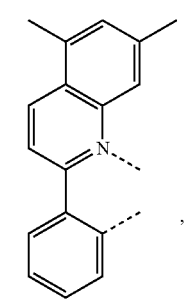 L<sub>b</sub>109
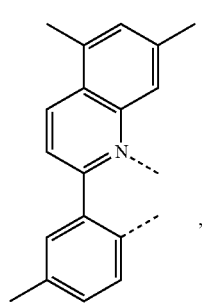 L<sub>b</sub>110
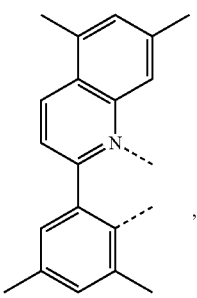 L<sub>b</sub>111
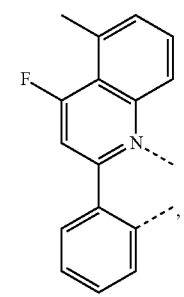 L<sub>b</sub>112
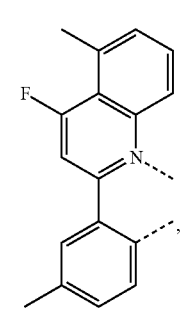 L<sub>b</sub>113
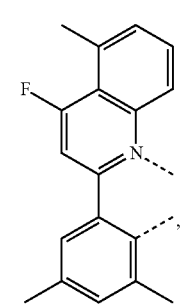 L<sub>b</sub>114
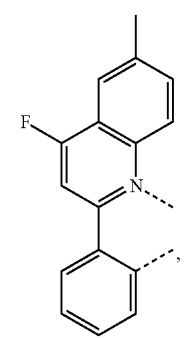 L<sub>b</sub>115

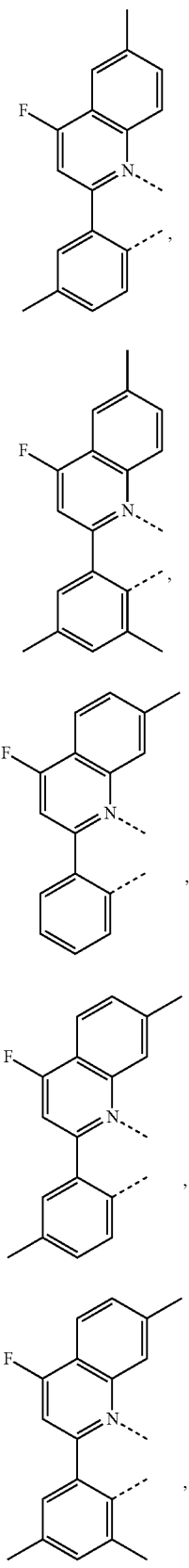
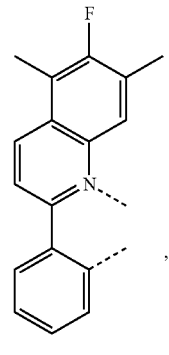
L_{b116}
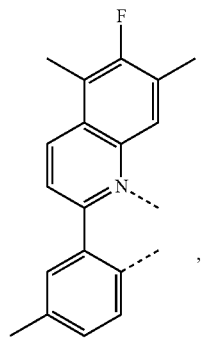
L_{b121}
L_{b117}
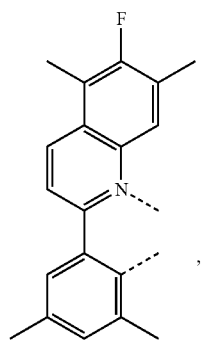
L_{b122}
L_{b118}
L_{b123}
L_{b119}
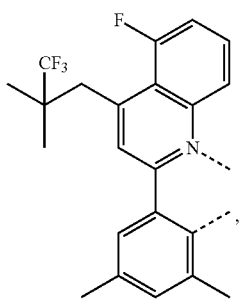
L_{b124}
L_{b120}

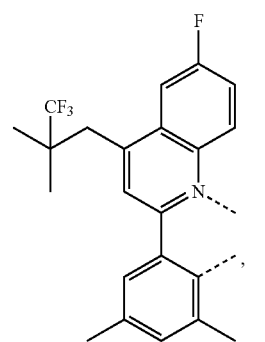 $L_{b125}$
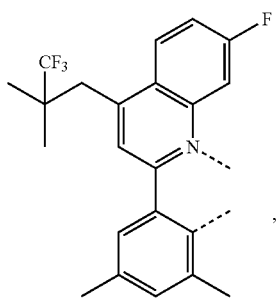 $L_{b126}$
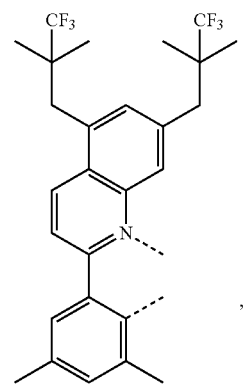 $L_{b127}$
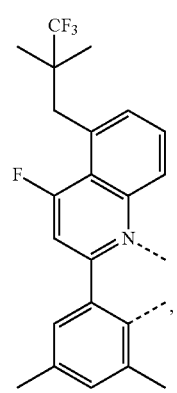 $L_{b128}$
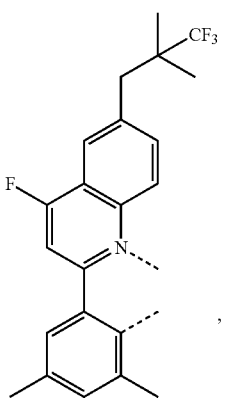 $L_{b129}$
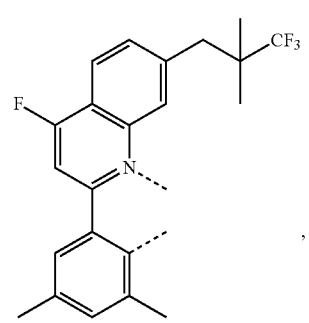 $L_{b130}$
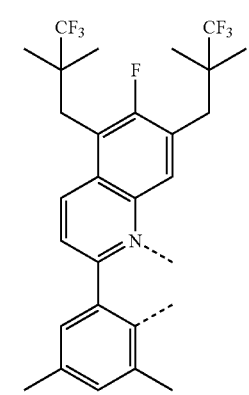 $L_{b131}$
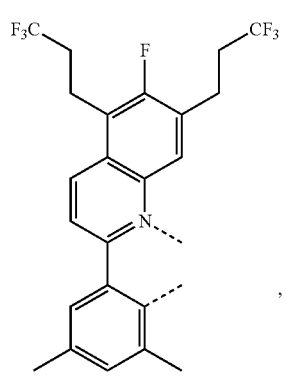 $L_{b132}$ -continued
L<sub>b133</sub>
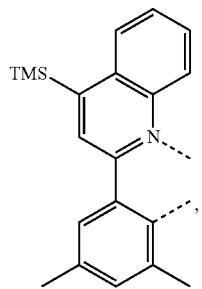
L<sub>b134</sub>
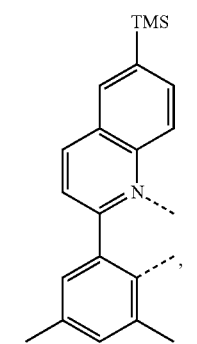
L<sub>b135</sub>
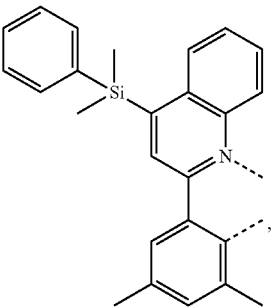
L<sub>b136</sub>
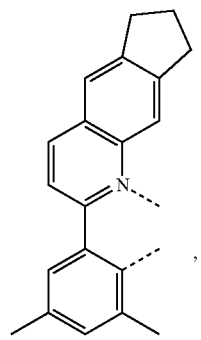
L<sub>b137</sub>
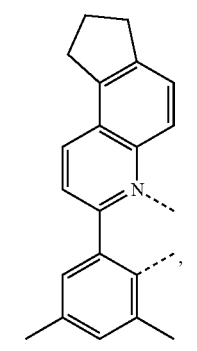
-continued
L<sub>b138</sub>
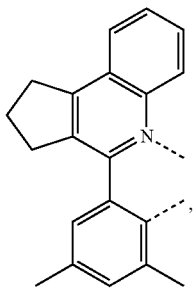
L<sub>b139</sub>
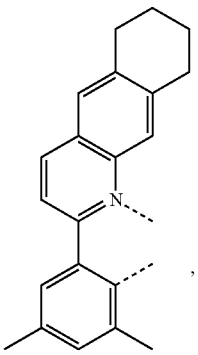
L<sub>b140</sub>
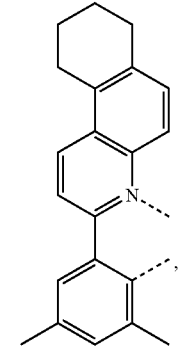
L<sub>b141</sub>
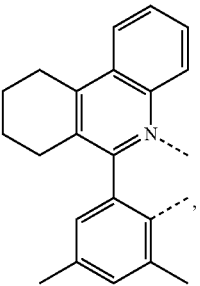
L<sub>b142</sub>
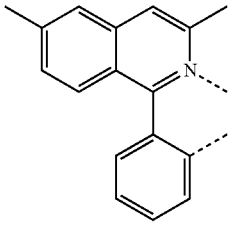

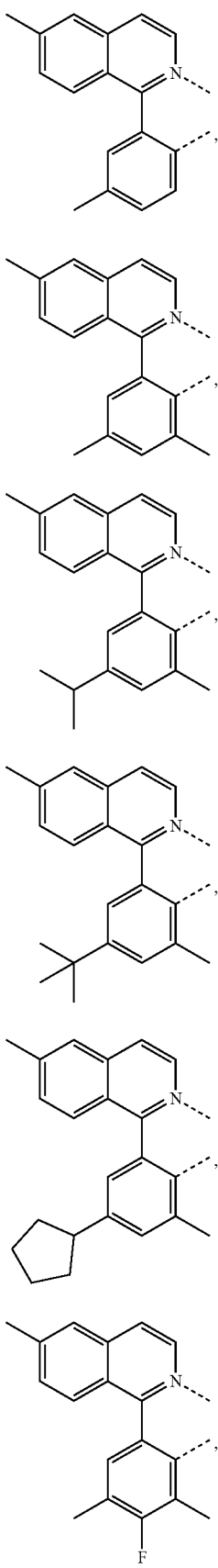
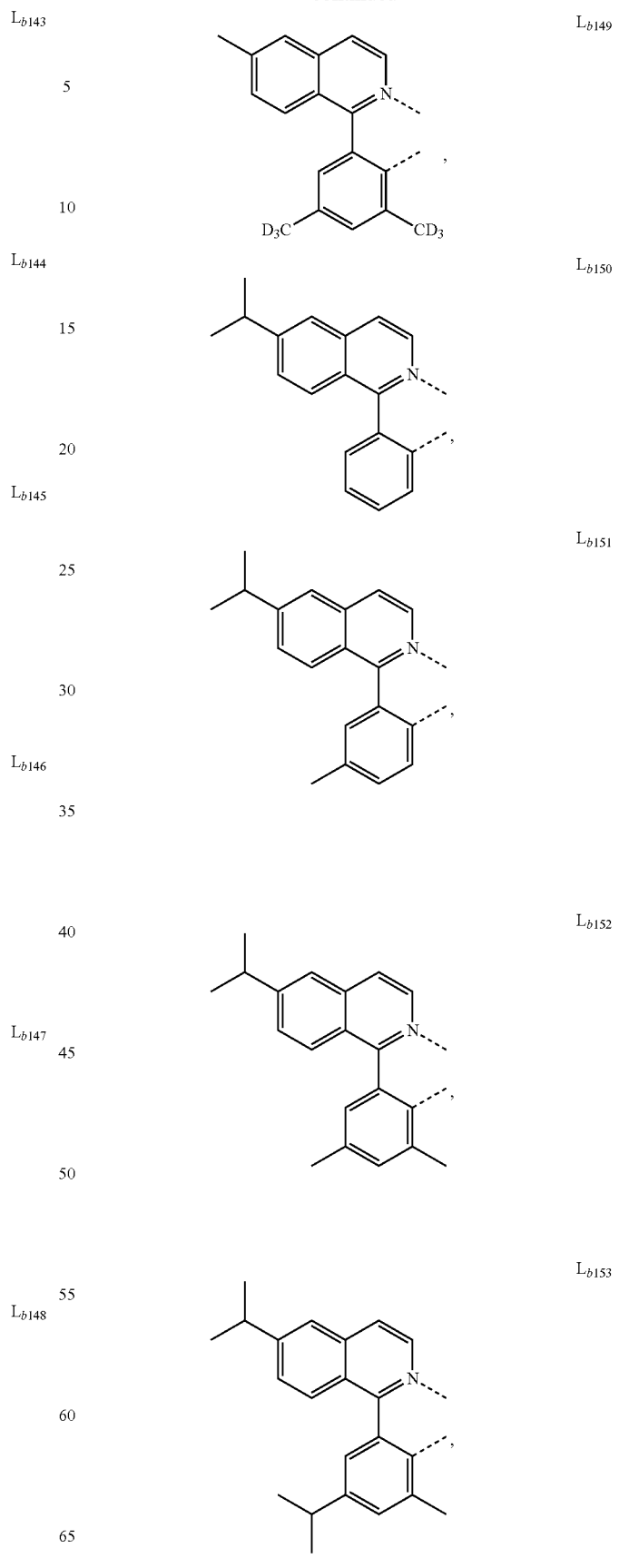

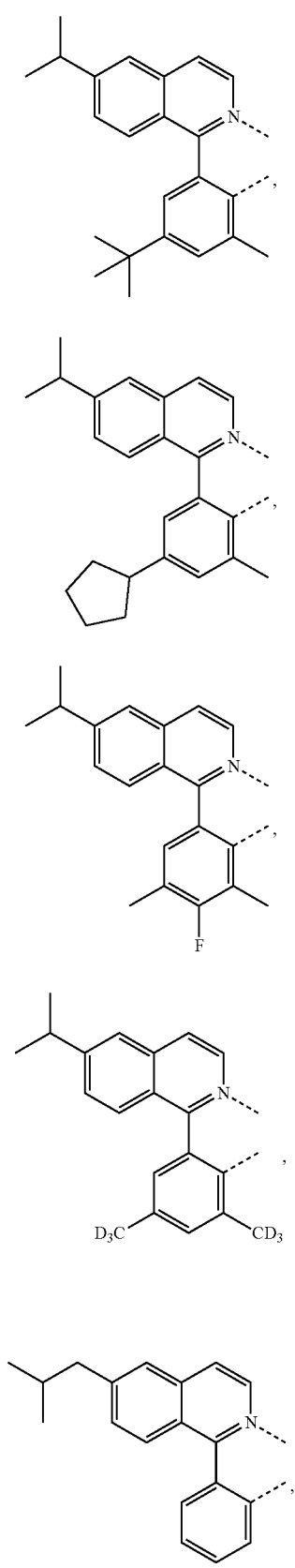
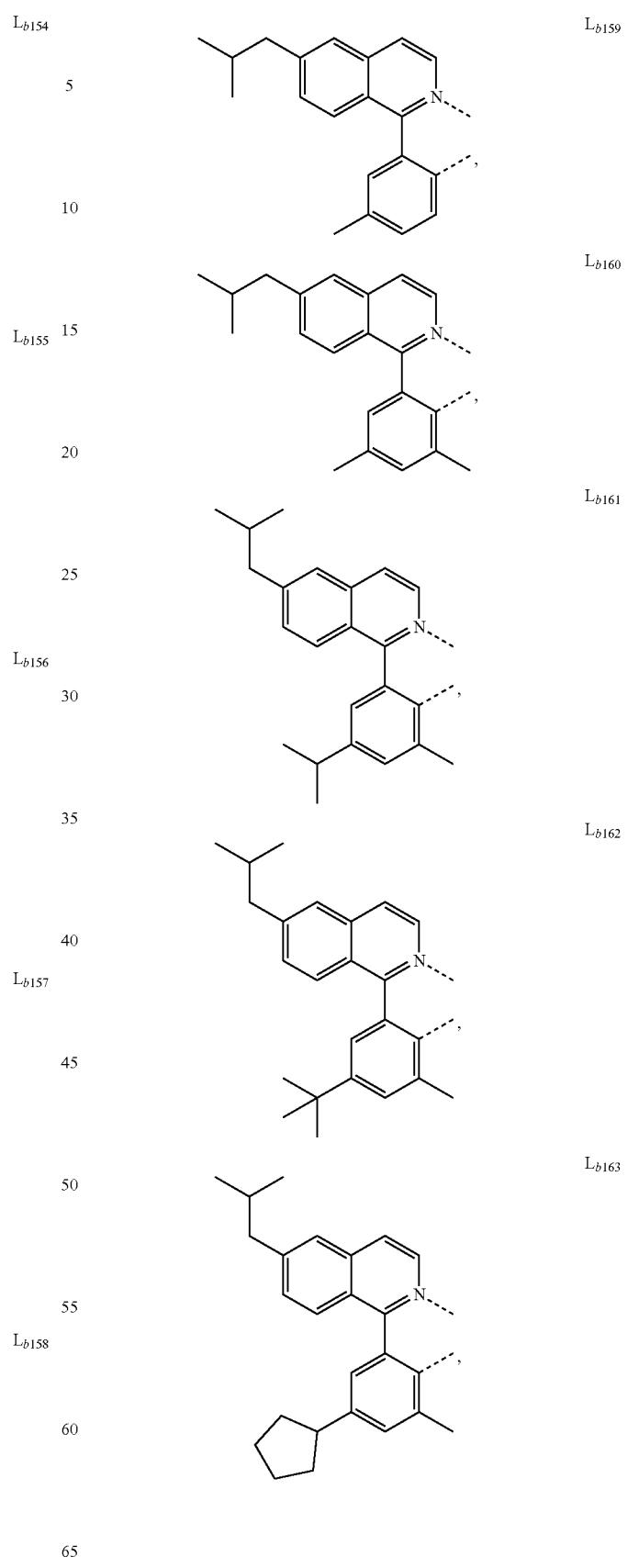

-continued
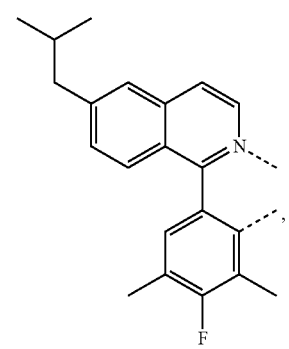
L_b164
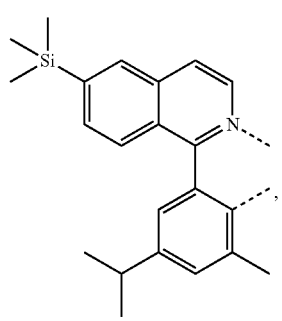
L_b185
L_b165
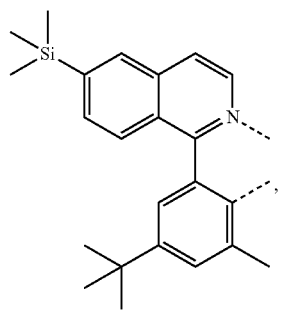
L_b186
L_b182
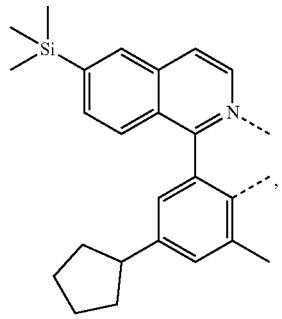
L_b187
L_b183
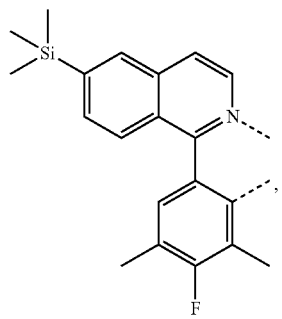
L_b188
L_b184
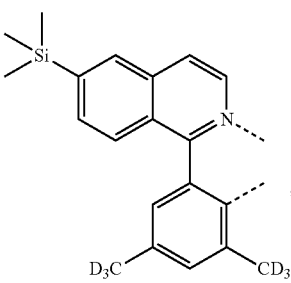
L_b189

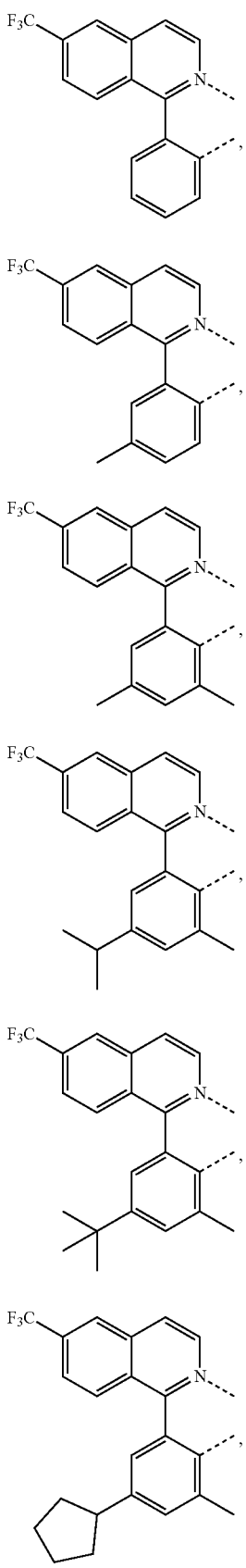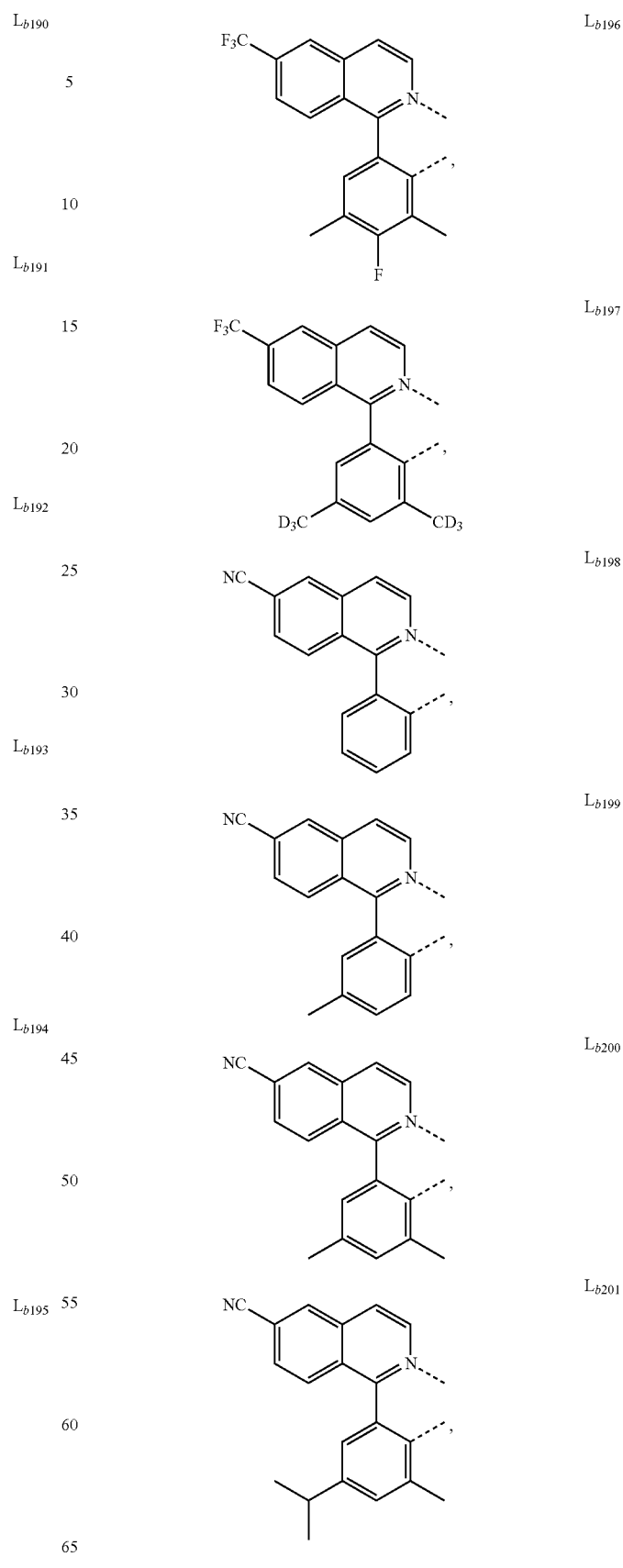

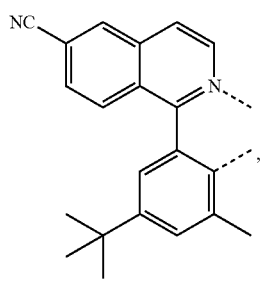 L<sub>b202</sub>
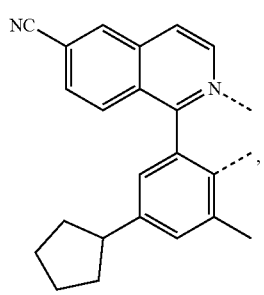 L<sub>b203</sub>
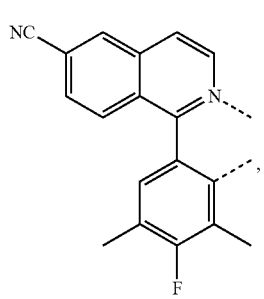 L<sub>b204</sub>
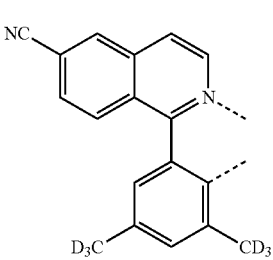 L<sub>b205</sub>
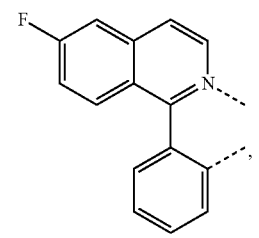 L<sub>b206</sub>
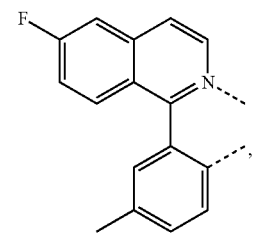 L<sub>b207</sub>
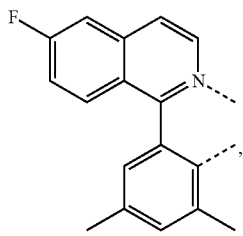 L<sub>b208</sub>
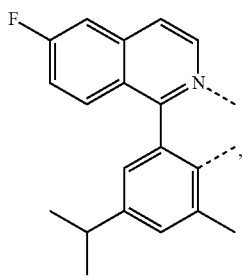 L<sub>b209</sub>
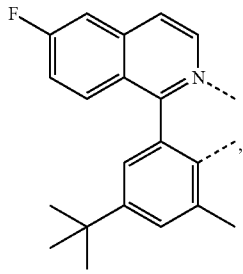 L<sub>b210</sub>
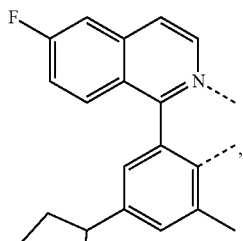 L<sub>b211</sub>
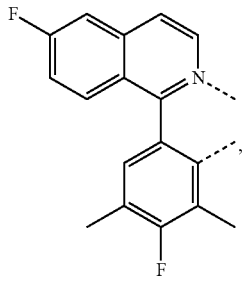 L<sub>b212</sub>
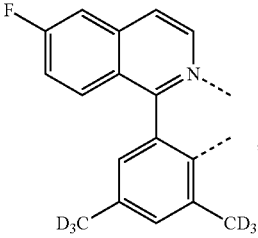 L<sub>b213</sub>

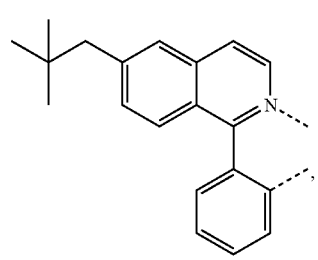
$L_{b214}$
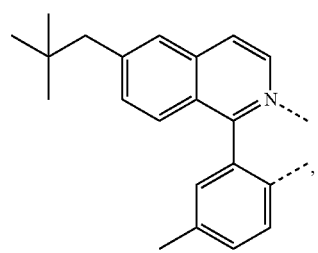
$L_{b215}$
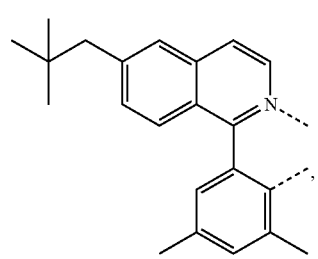
$L_{b216}$
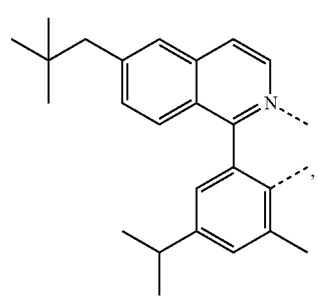
$L_{b217}$
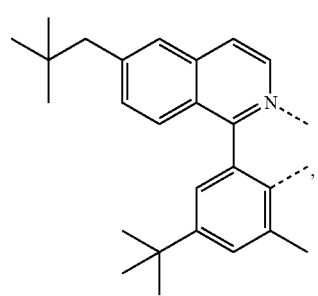
$L_{b218}$
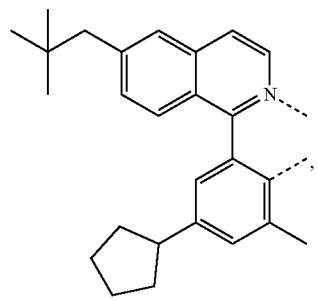
$L_{b219}$
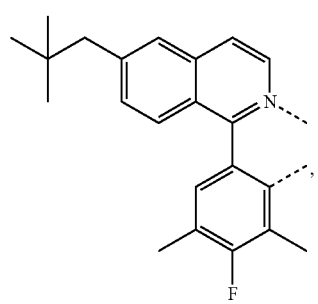
$L_{b220}$
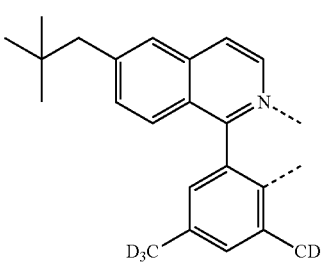
$L_{b221}$
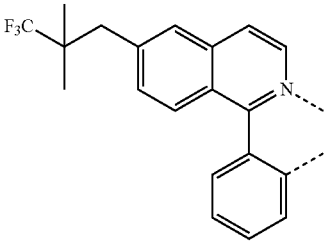
$L_{b222}$
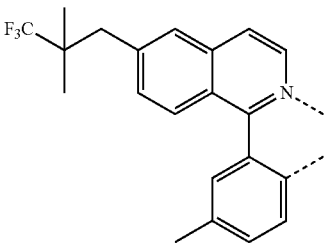
$L_{b223}$
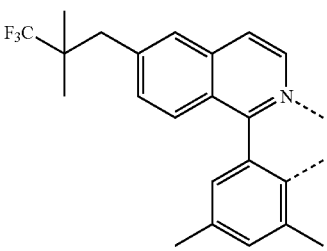
$L_{b224}$

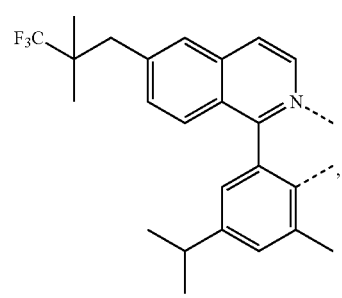 L_b225
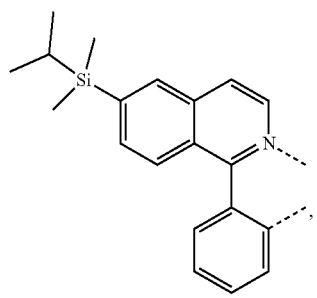 L_b246
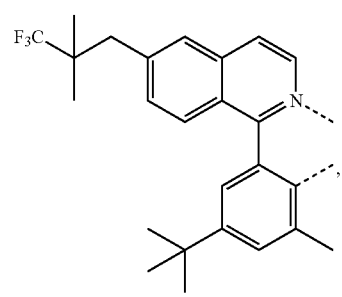 L_b226
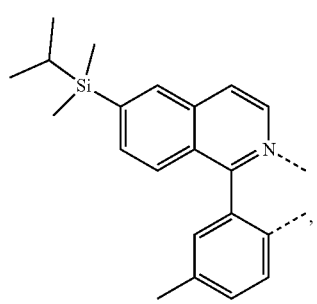 L_b247
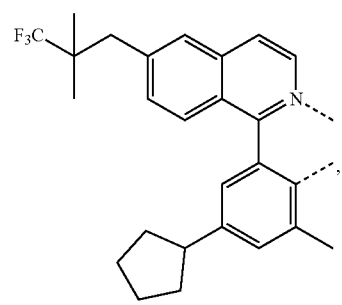 L_b227
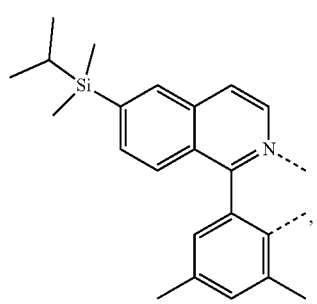 L_b248
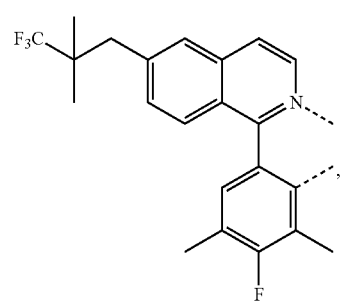 L_b228
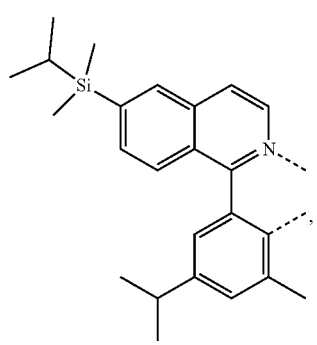 L_b249
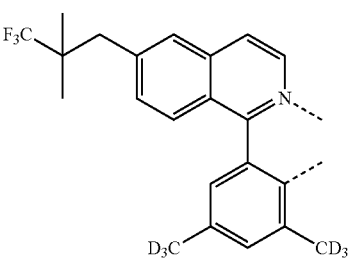 L_b229
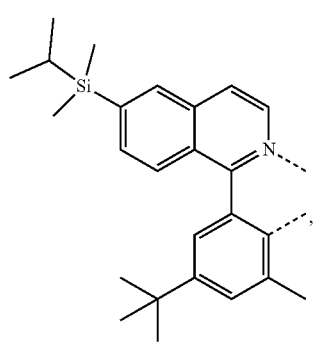 L_b250

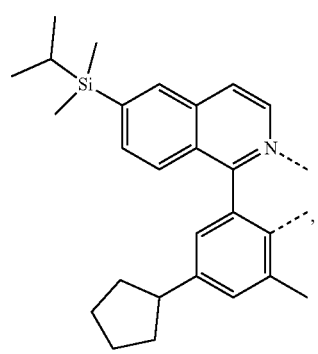
L<sub>b251</sub>
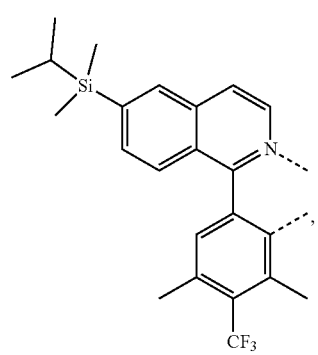
L<sub>b252</sub>
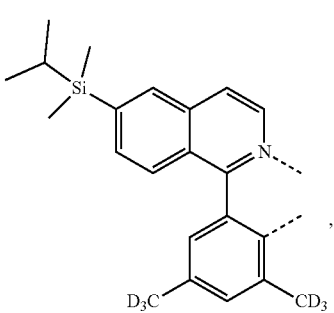
L<sub>b253</sub>
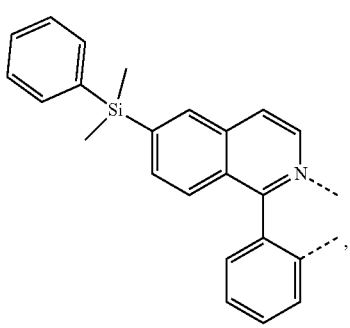
L<sub>b254</sub>
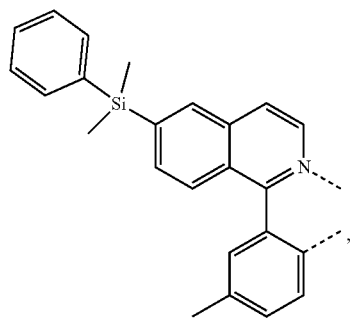
L<sub>b255</sub>
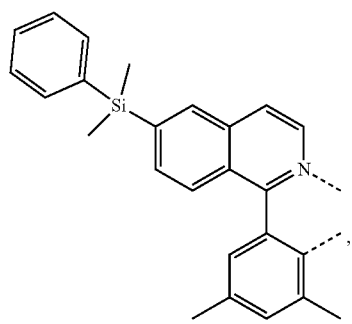
L<sub>b256</sub>
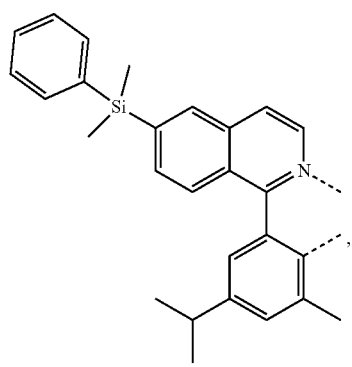
L<sub>b257</sub>
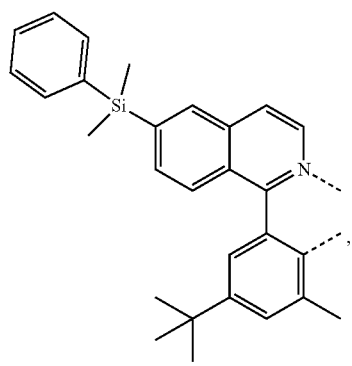
L<sub>b258</sub>

-continued
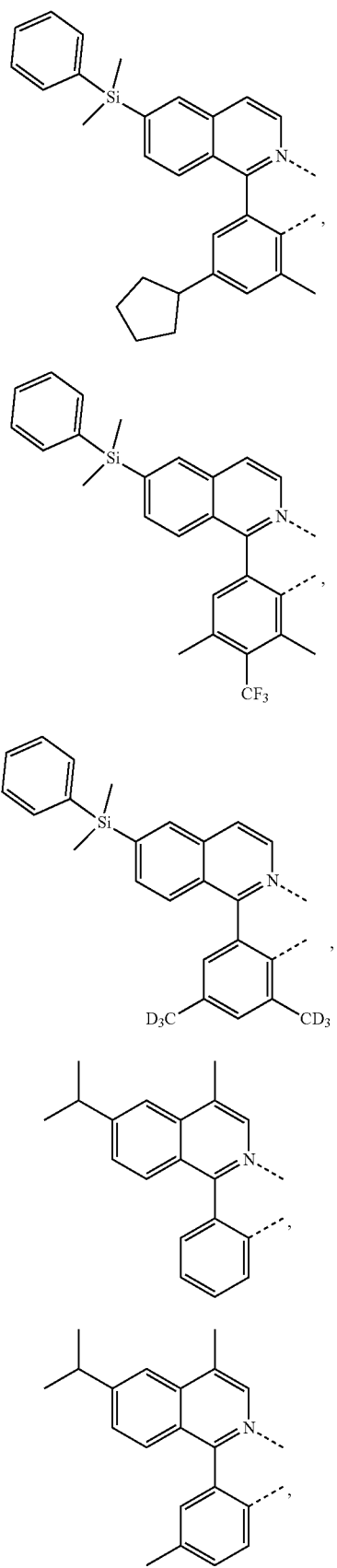
L$_{b259}$
L$_{b260}$
L$_{b261}$
L$_{b262}$
L$_{b263}$
-continued
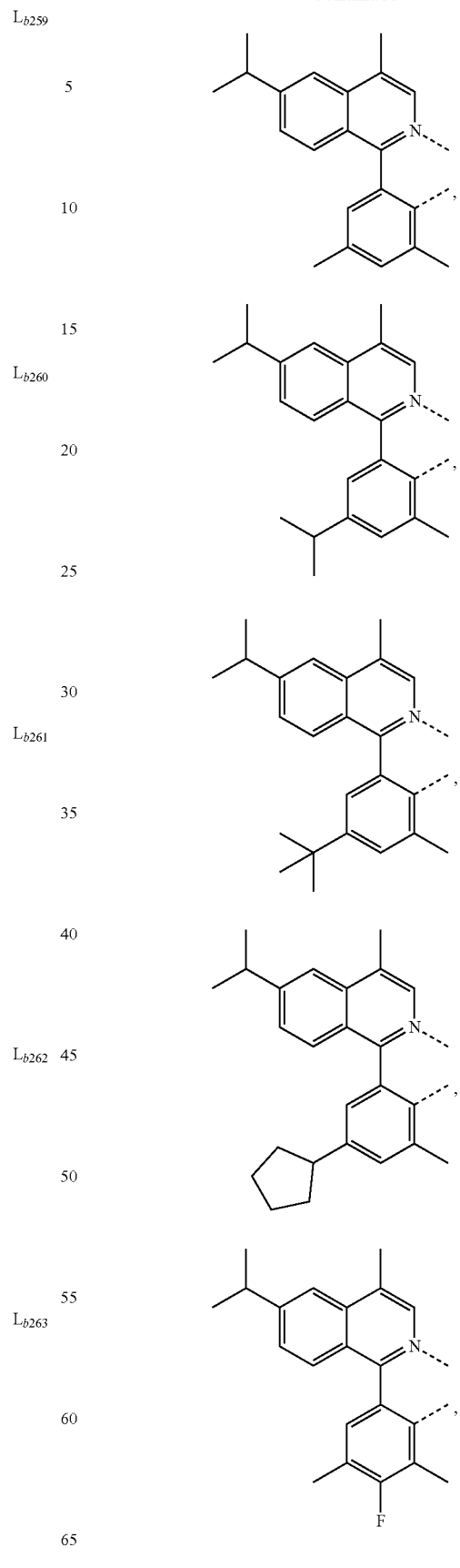
L$_{b264}$
L$_{b265}$
L$_{b266}$
L$_{b267}$
L$_{b268}$

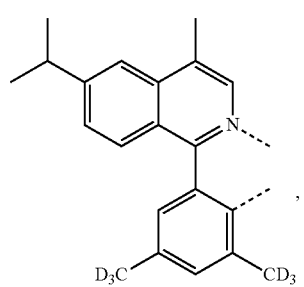
L_{b269}
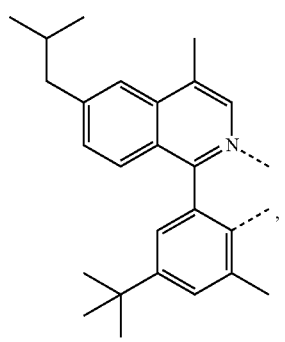
L_{b274}
L_{b270}
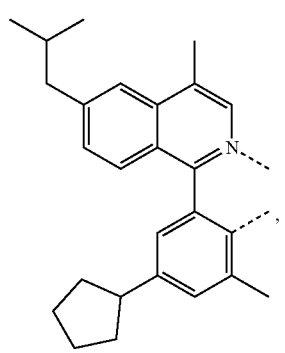
L_{b275}
L_{b271}
L_{b272}
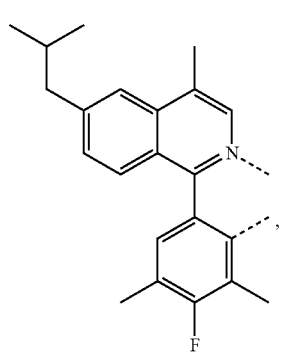
L_{b276}
L_{b273}
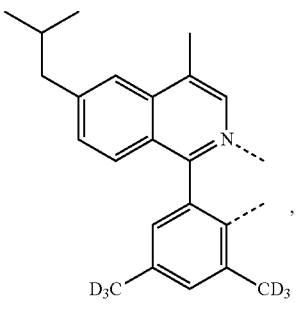
L_{b277}
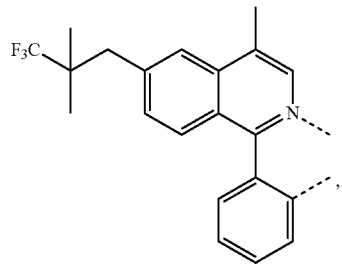
L_{b286}

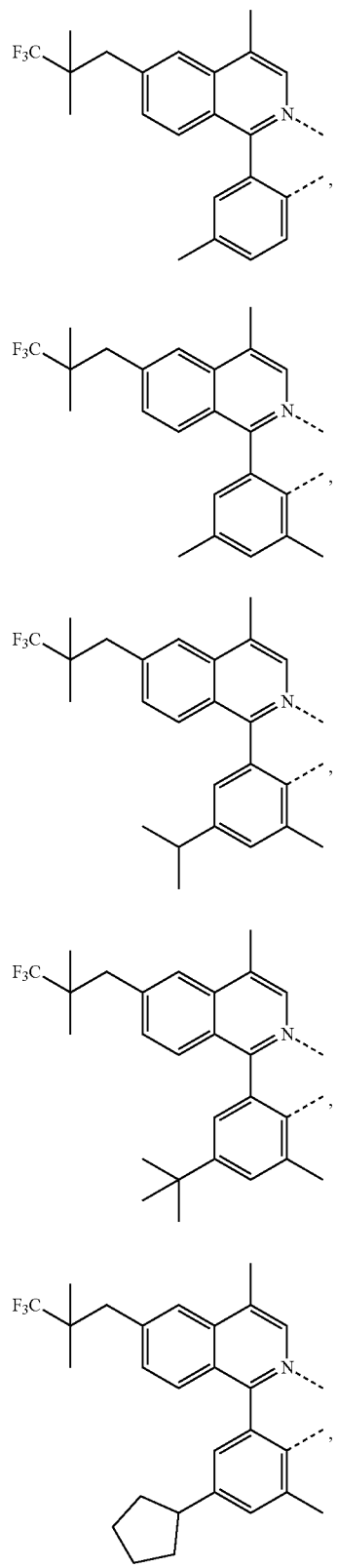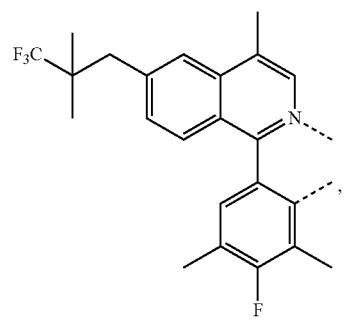

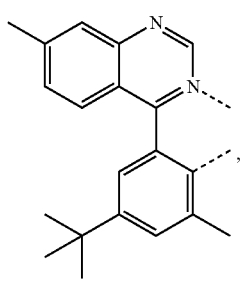 L_{b298}
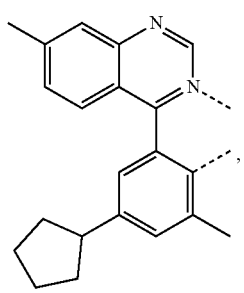 L_{b299}
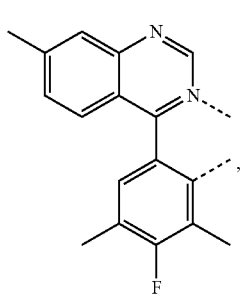 L_{b300}
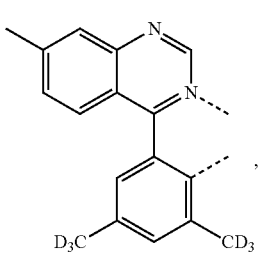 L_{b301}
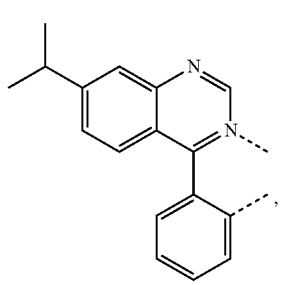 L_{b302}
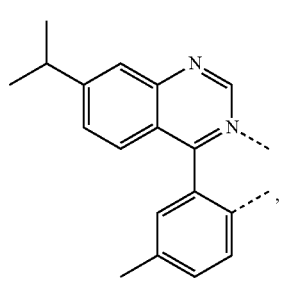 L_{b303}
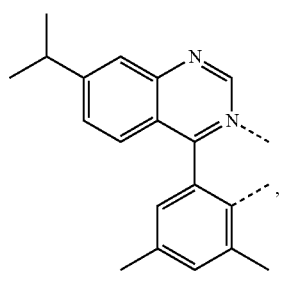 L_{b304}
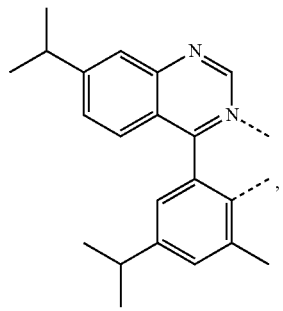 L_{b305}
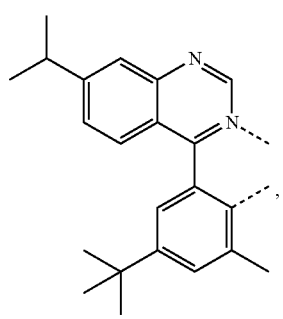 L_{b306}
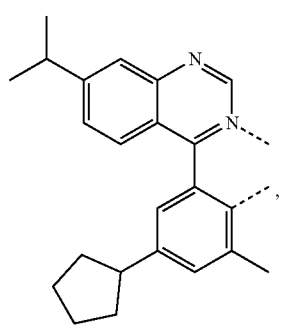 L_{b307}

$L_{b308}$ 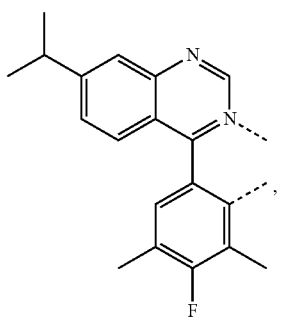
$L_{b309}$
$L_{b310}$
$L_{b311}$
$L_{b312}$
$L_{b313}$ 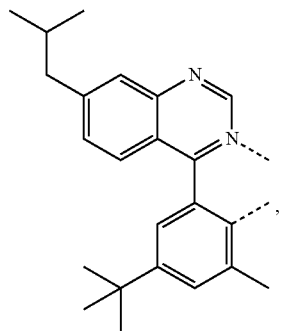
$L_{b314}$ 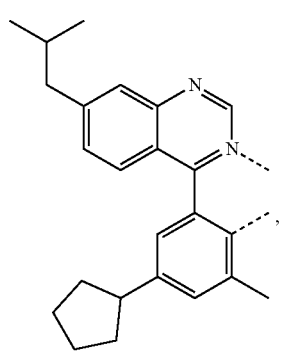
$L_{b315}$ 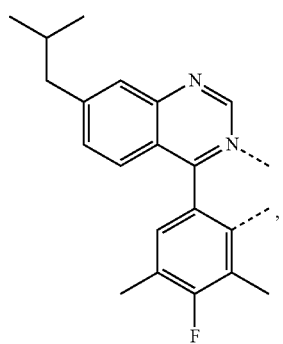
$L_{b316}$ 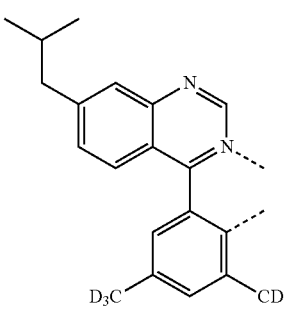
$L_{b325}$ 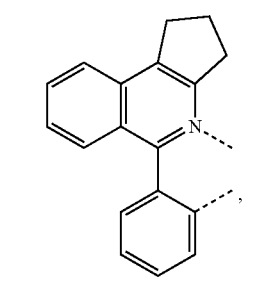

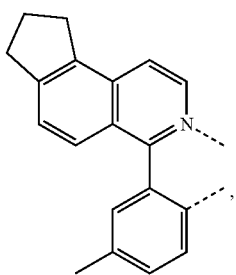 L_{b326}
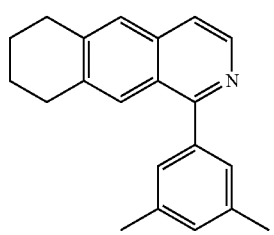 L_{b332}
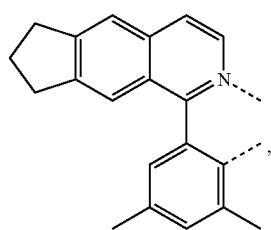 L_{b327}
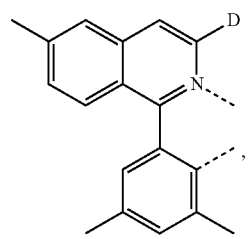 L_{b333}
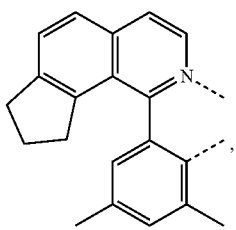 L_{b328}
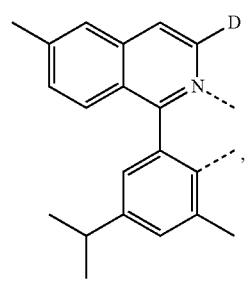 L_{b334}
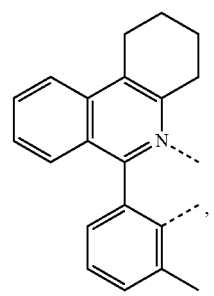 L_{b329}
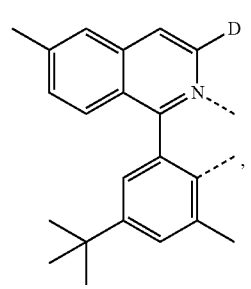 L_{b335}
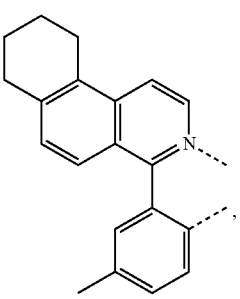 L_{b330}
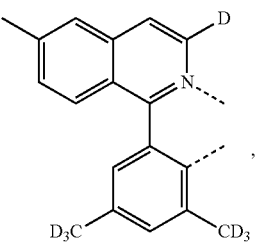 L_{b336}
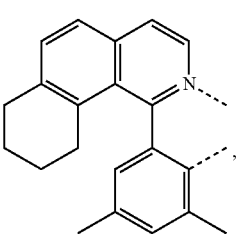 L_{b331}
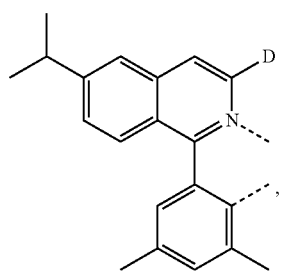 L_{b337}

-continued
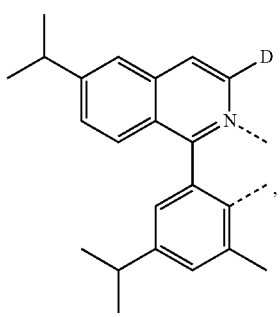
L<sub>b338</sub>
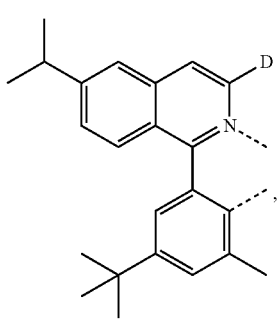
L<sub>b339</sub>
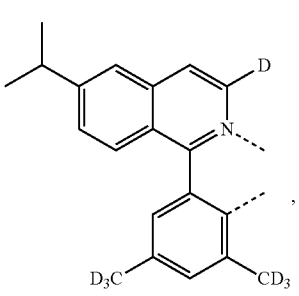
L<sub>b340</sub>
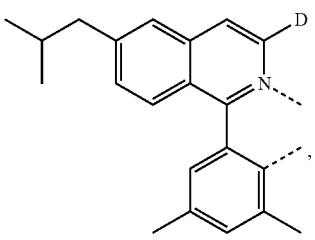
L<sub>b341</sub>
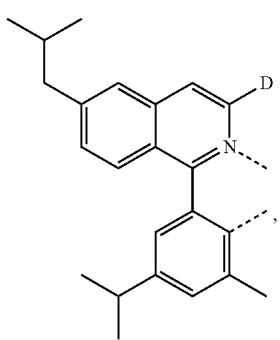
L<sub>b342</sub>
-continued
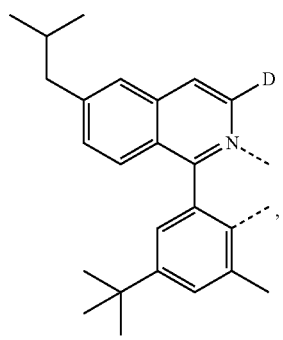
L<sub>b343</sub>
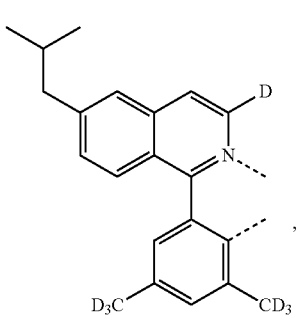
L<sub>b344</sub>
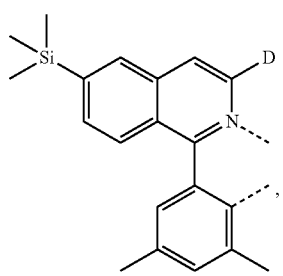
L<sub>b353</sub>
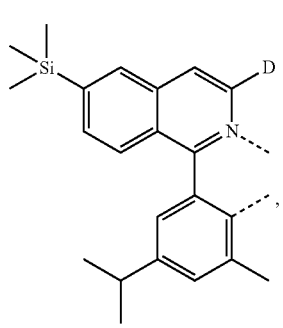
L<sub>b354</sub>
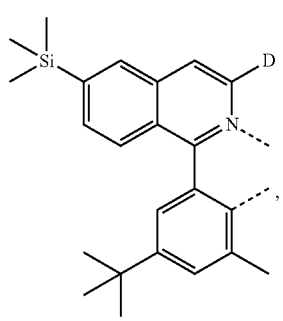
L<sub>b355</sub>

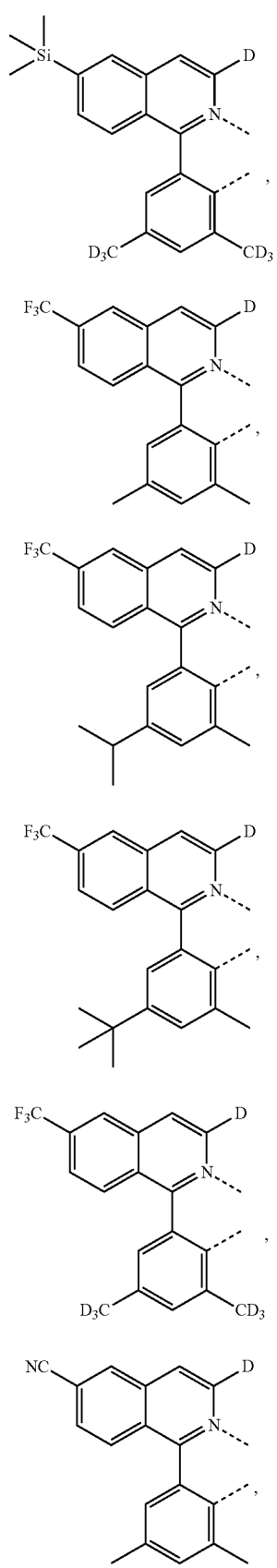
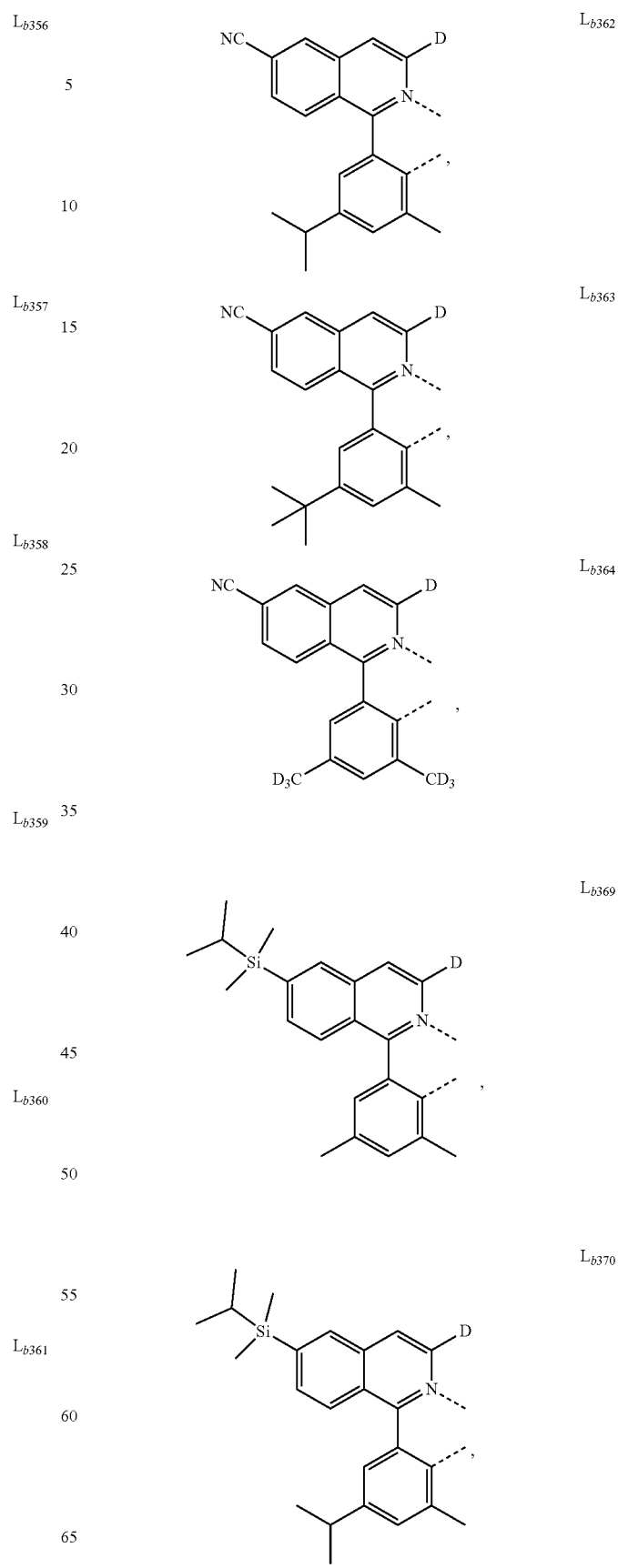

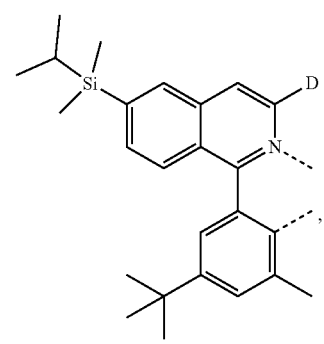 L*b*371
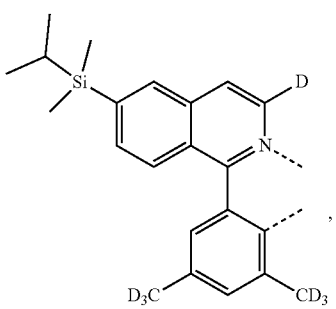 L*b*372
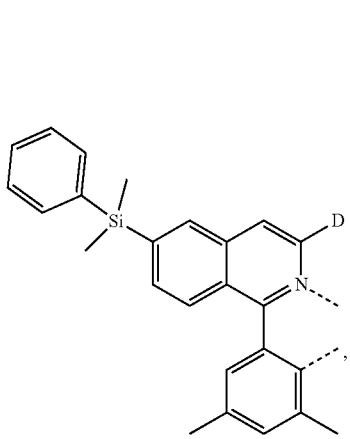 L*b*373
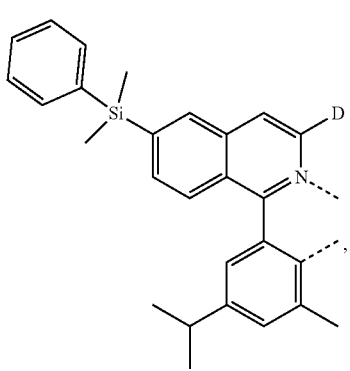 L*b*374
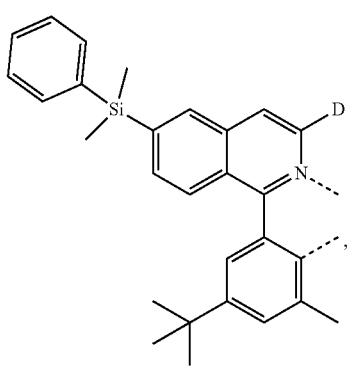 L*b*375
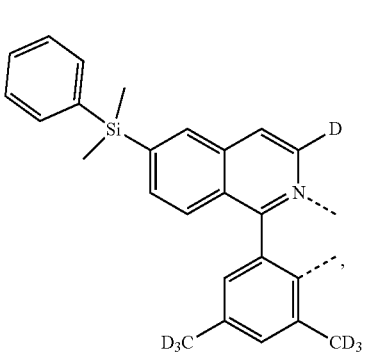 L*b*376
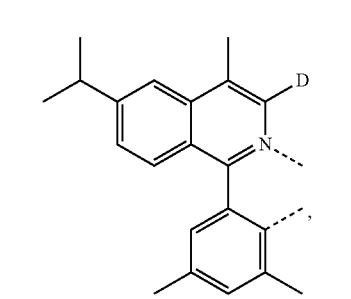 L*b*377
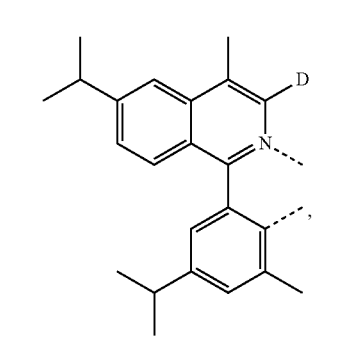 L*b*378
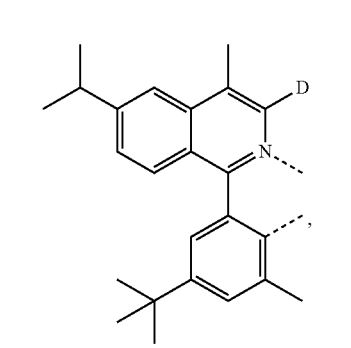 L*b*379

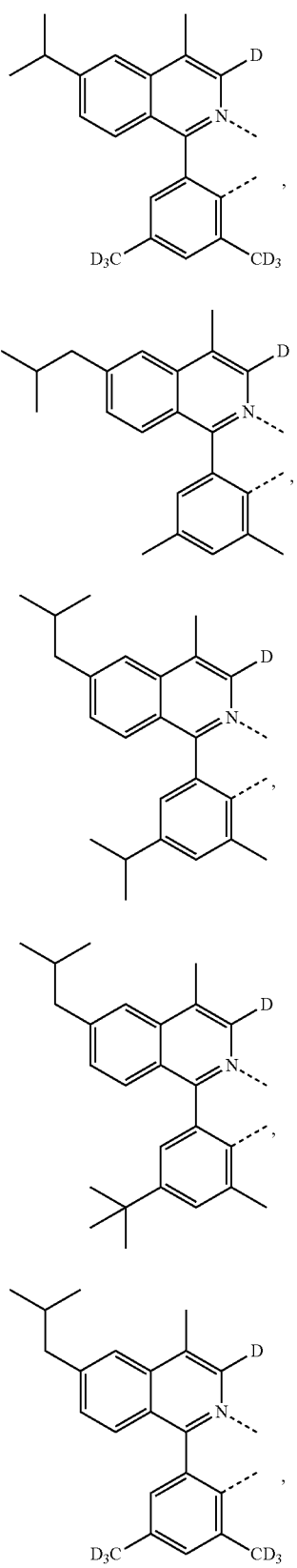
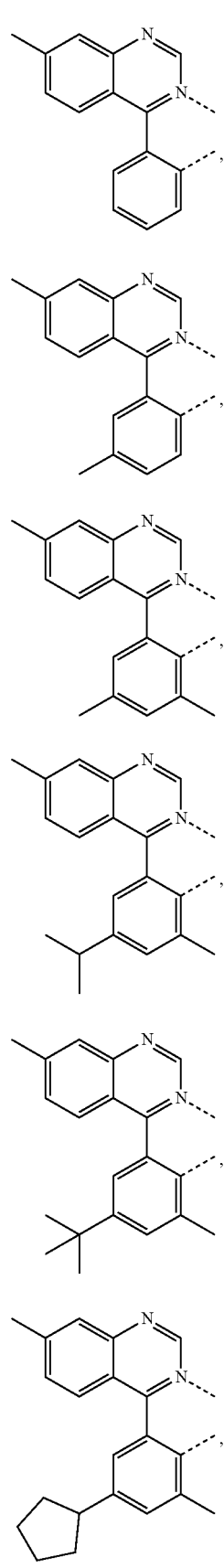

L<sub>b395</sub>
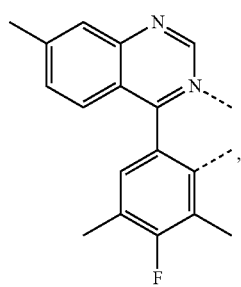
L<sub>b396</sub>
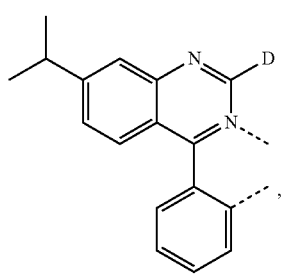
L<sub>b397</sub>
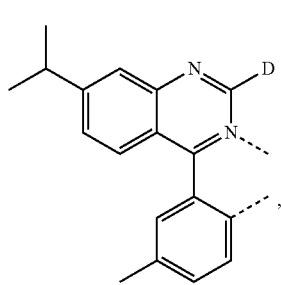
L<sub>b398</sub>
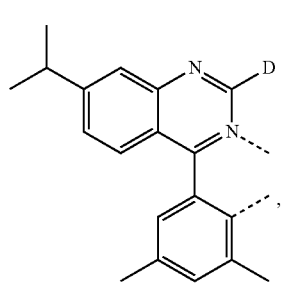
L<sub>b399</sub>
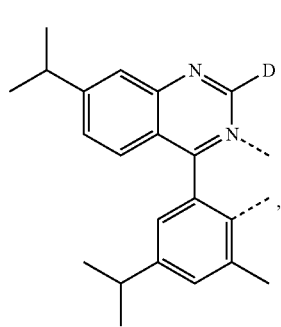
L<sub>b400</sub>
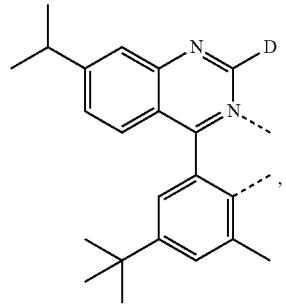
L<sub>b401</sub>
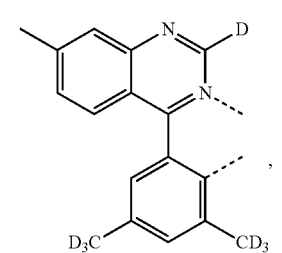
L<sub>b402</sub>
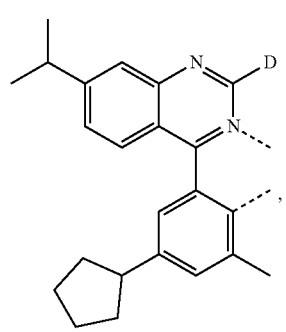
L<sub>b403</sub>
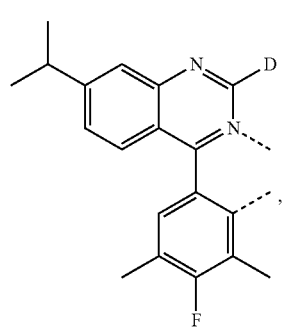
L<sub>b404</sub>
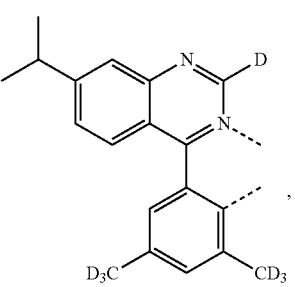

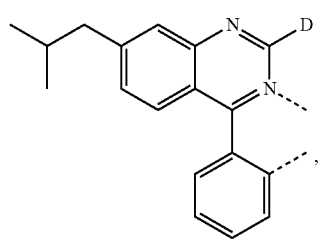
L<sub>b</sub>405
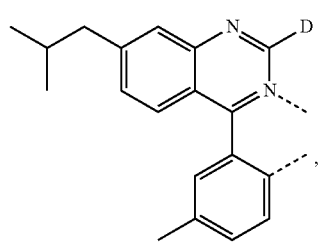
L<sub>b</sub>406
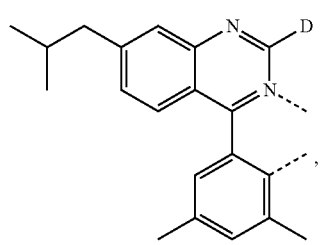
L<sub>b</sub>407
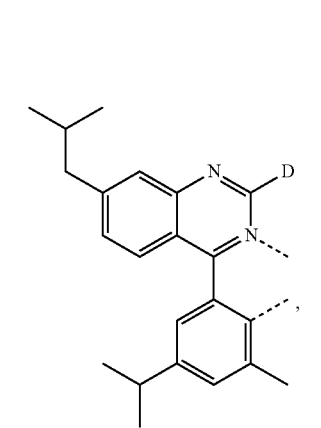
L<sub>b</sub>408
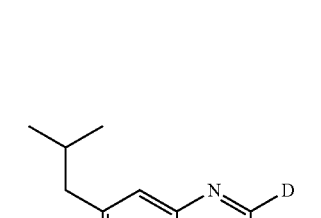
L<sub>b</sub>409
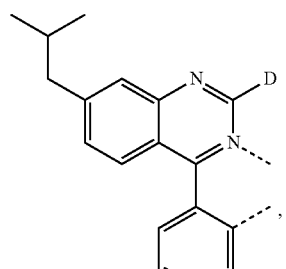
L<sub>b</sub>410
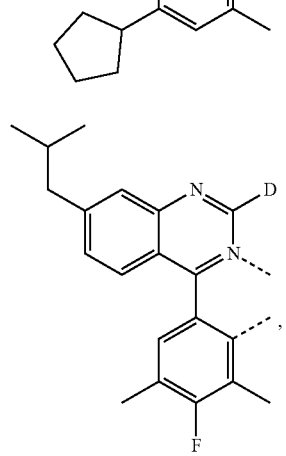
L<sub>b</sub>411
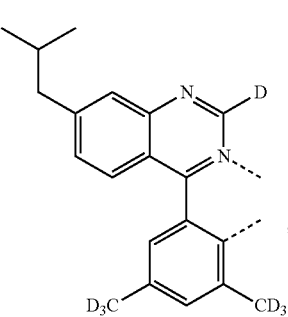
L<sub>b</sub>412
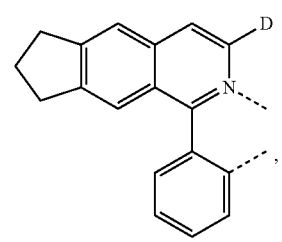
L<sub>b</sub>421
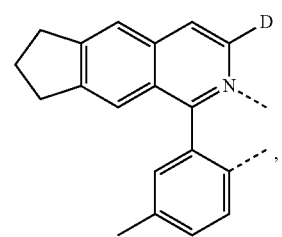
L<sub>b</sub>422

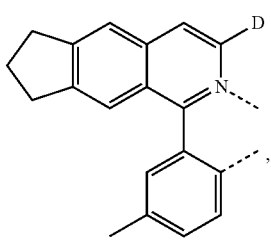 L$_{b423}$
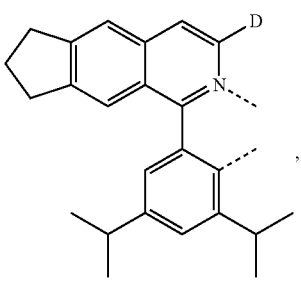 L$_{b424}$
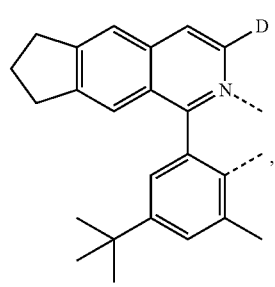 L$_{b425}$
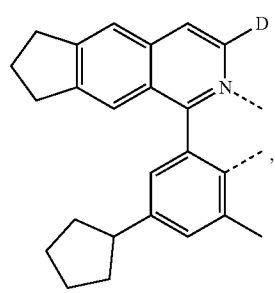 L$_{b426}$
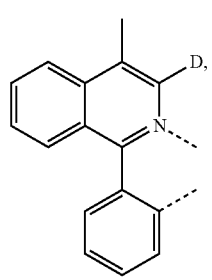 L$_{b427}$
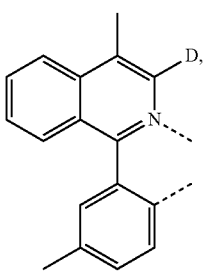 L$_{b428}$
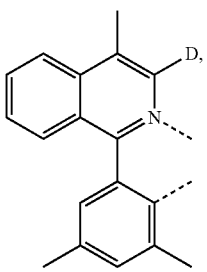 L$_{b429}$
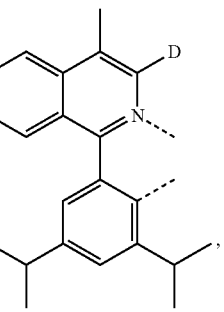 L$_{b430}$
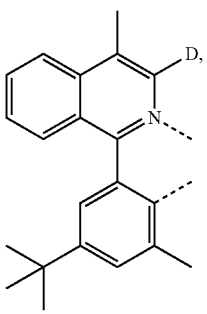 L$_{b431}$
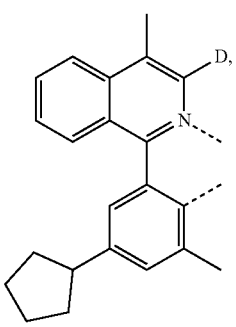 L$_{b432}$

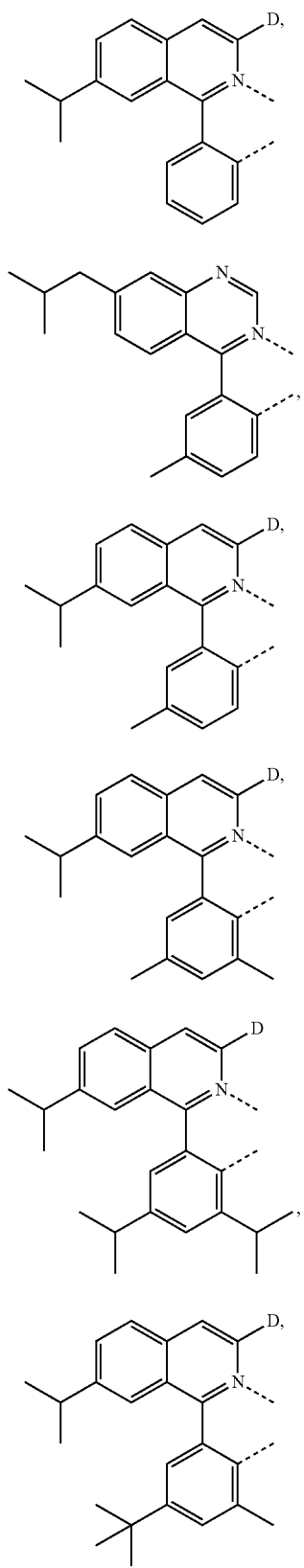
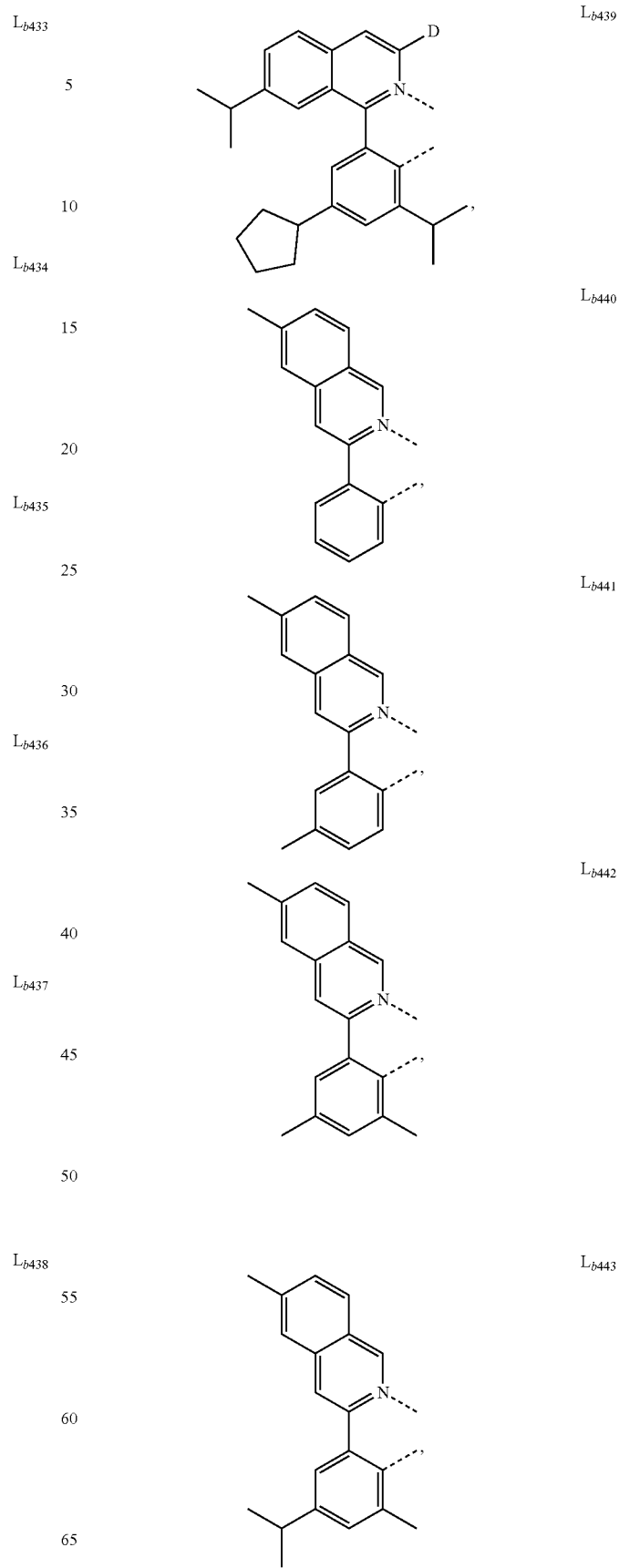

201
-continued
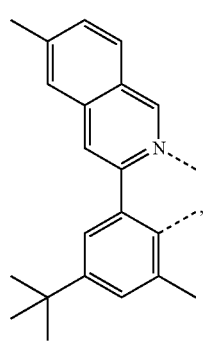
L<sub>b</sub>444
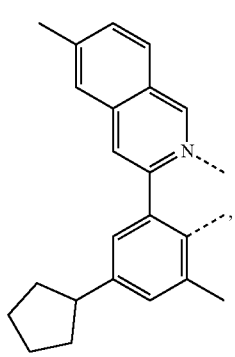
L<sub>b</sub>445
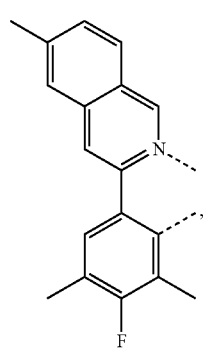
L<sub>b</sub>446
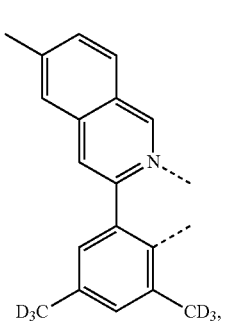
L<sub>b</sub>447
202
-continued
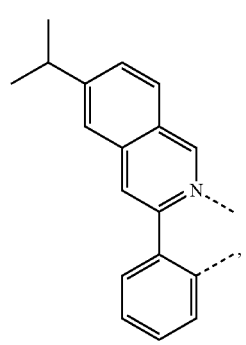
L<sub>b</sub>448
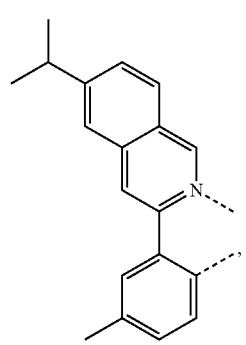
L<sub>b</sub>449
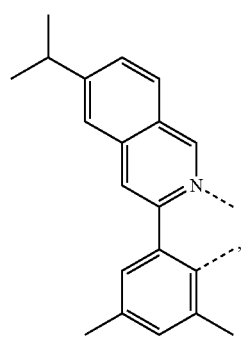
L<sub>b</sub>450
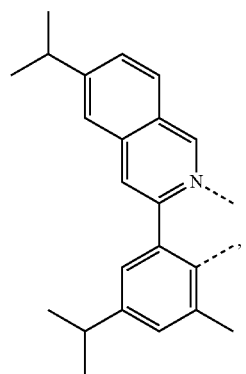
L<sub>b</sub>451

203
-continued
L<sub>b452</sub>
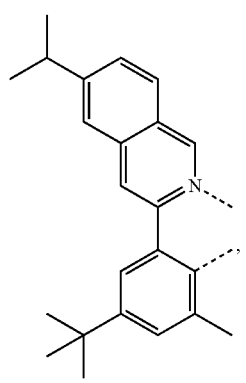
L<sub>b453</sub>
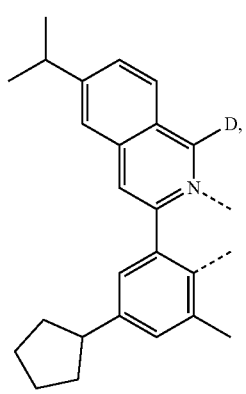
L<sub>b454</sub>
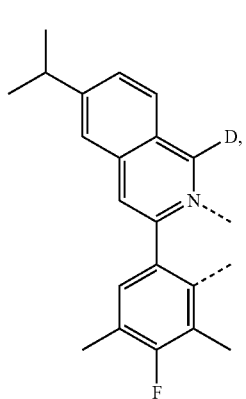
L<sub>b455</sub>
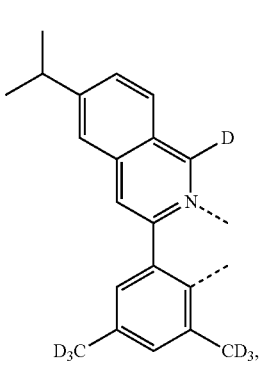
204
-continued
L<sub>b456</sub>
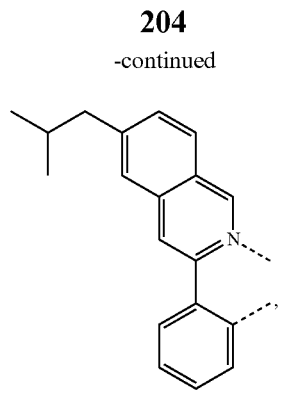
L<sub>b457</sub>
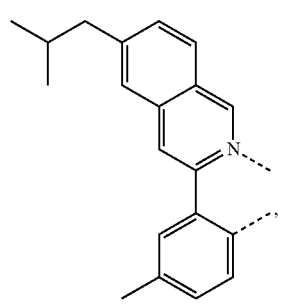
L<sub>b458</sub>
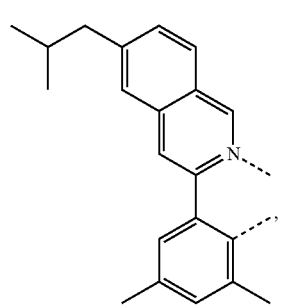
L<sub>b459</sub>
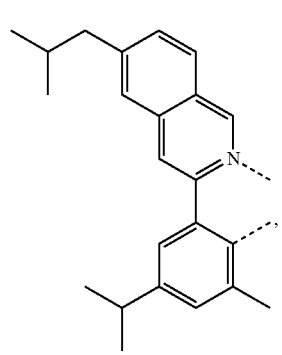
L<sub>b460</sub>
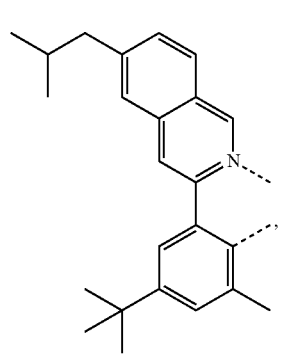

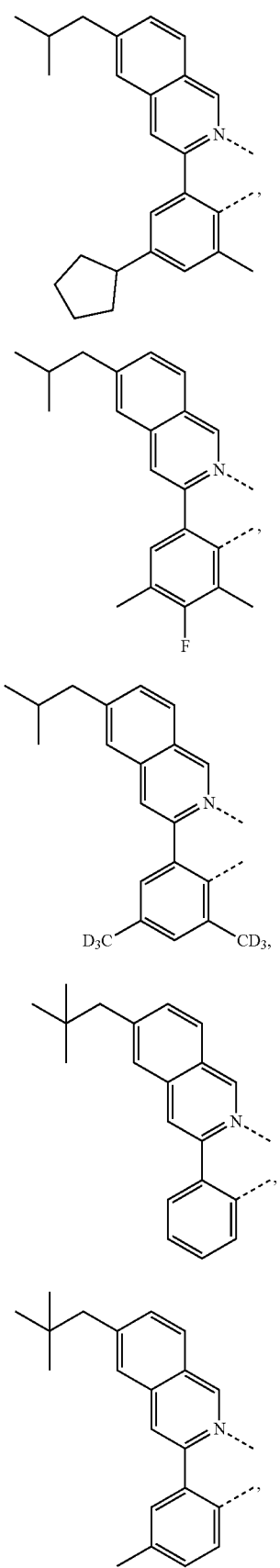
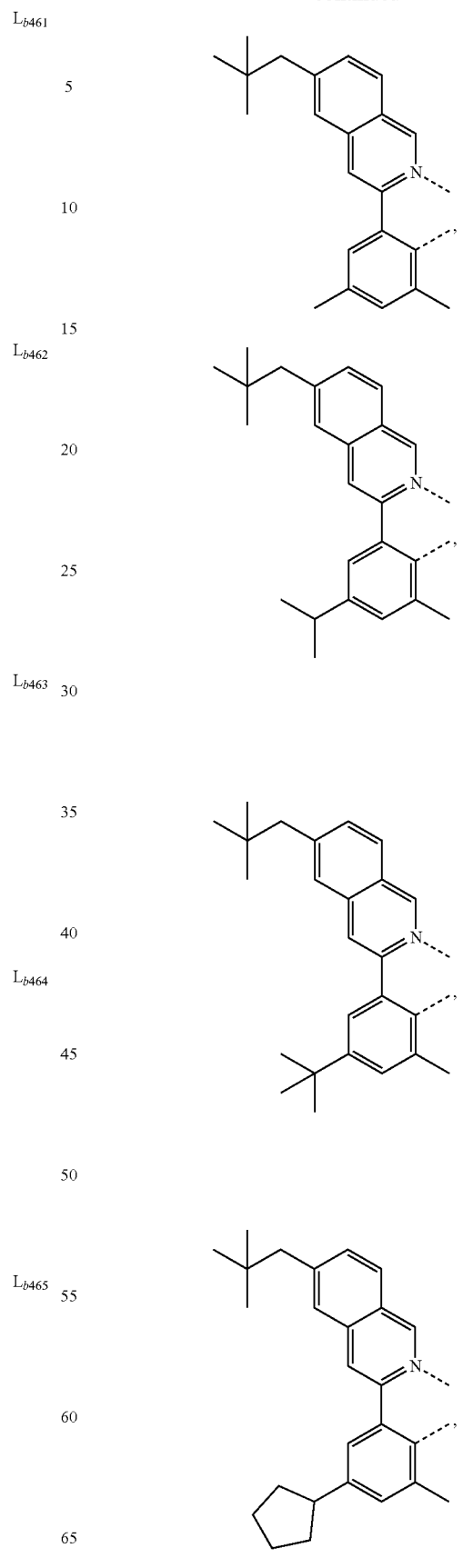

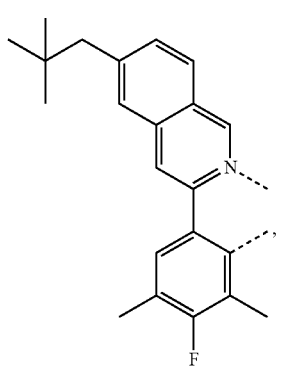 L_{b470}
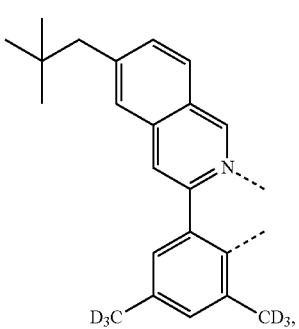 L_{b471}
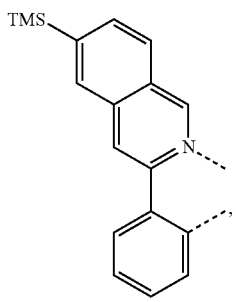 L_{b480}
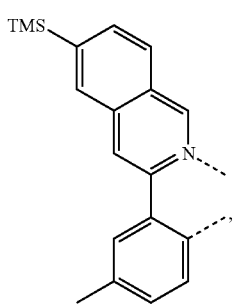 L_{b481}
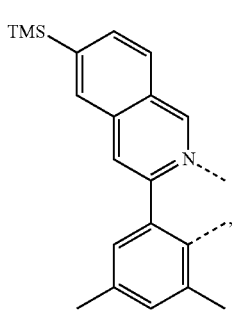 L_{b482}
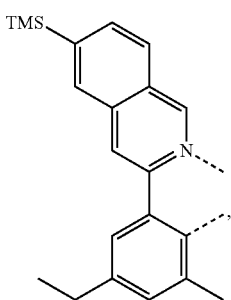 L_{b483}
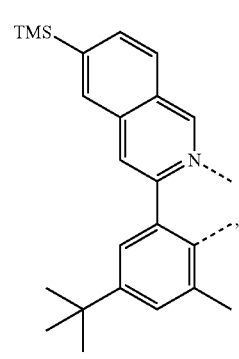 L_{b484}
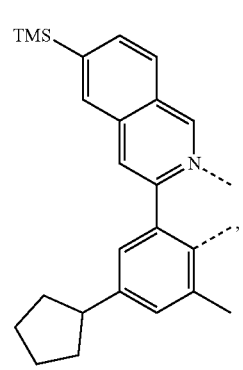 L_{b485}
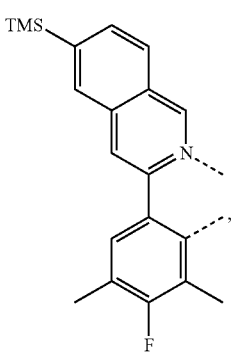 L_{b486}

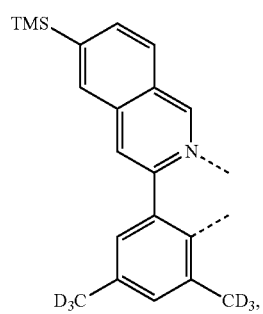 L<sub>b487</sub>
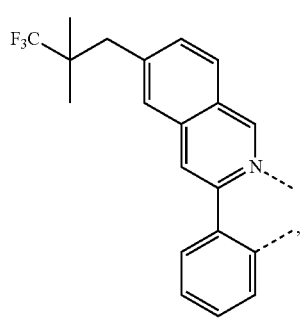 L<sub>b488</sub>
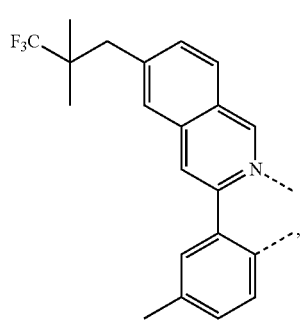 L<sub>b489</sub>
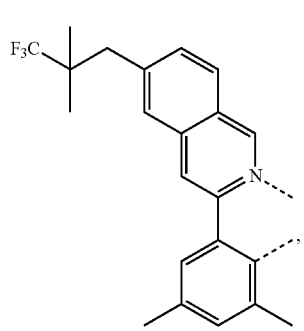 L<sub>b490</sub>
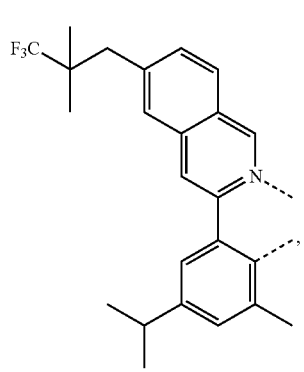 L<sub>b491</sub>
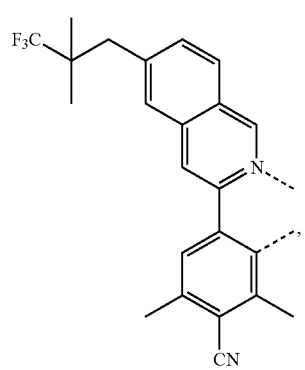 L<sub>b492</sub>
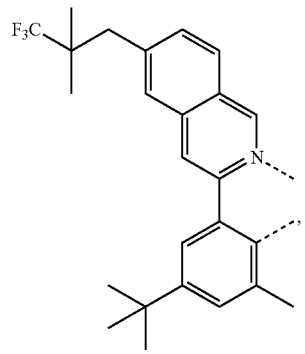 L<sub>b493</sub>
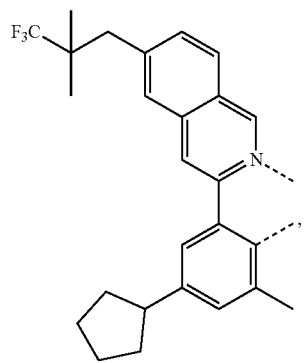 L<sub>b494</sub>
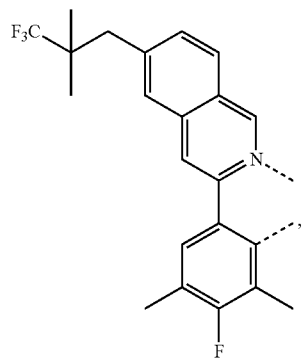 L<sub>b495</sub>

-continued
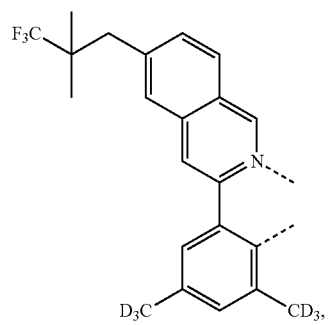
L<sub>b496</sub>
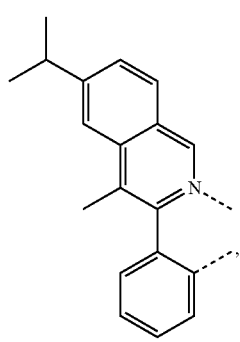
L<sub>b505</sub>
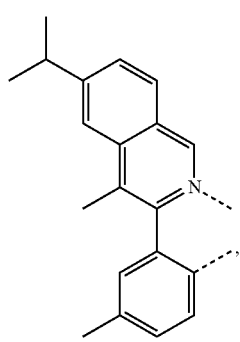
L<sub>b506</sub>
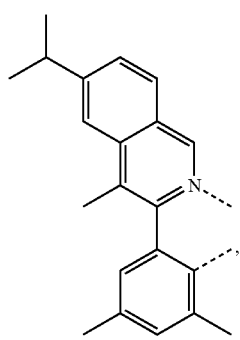
L<sub>b507</sub>
-continued
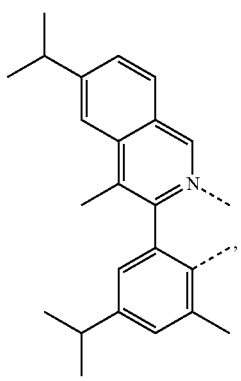
L<sub>b508</sub>
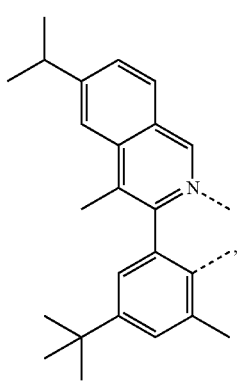
L<sub>b509</sub>
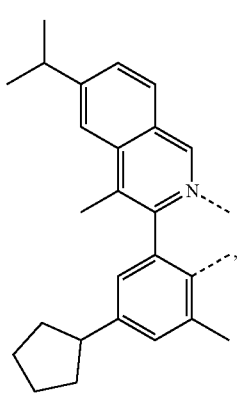
L<sub>b510</sub>
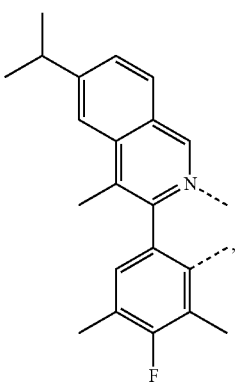
L<sub>b511</sub>

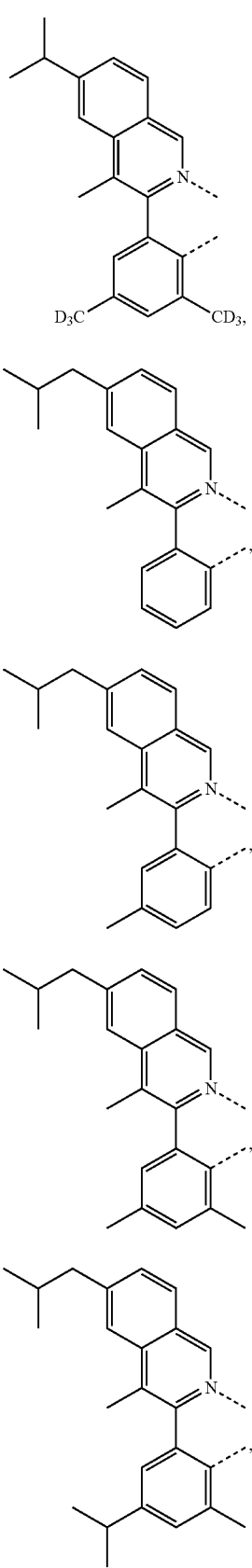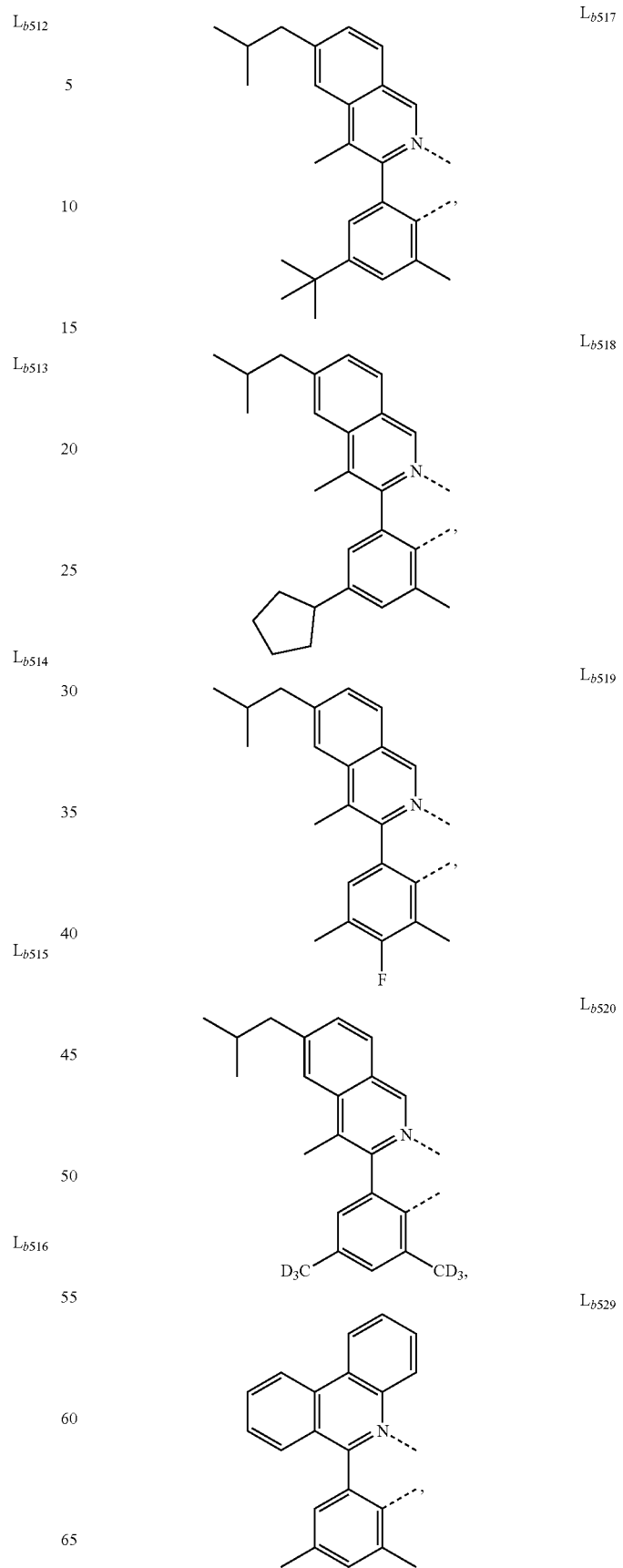

-continued

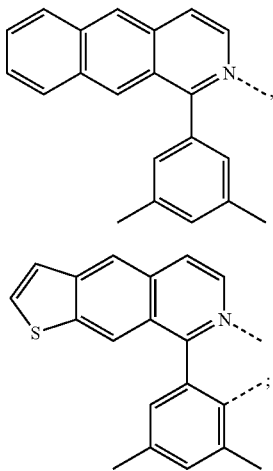

L$_{b530}$

L$_{b531}$ wherein -TMS is trimethylsilyl; and optionally, hydrogen in the above structures may be partially or fully substituted with deuterium.

19. The metal complex of claim 18, wherein Metal complex 1, Metal complex 2, Metal complex 5, Metal complex 7, Metal complex 8, Metal complex 11, Metal complex 25, Metal complex 26, Metal complex 30, Metal complex 49, Metal complex 50, Metal complex 54, Metal complex 61, Metal complex 62, Metal complex 66, Metal complex 73, Metal complex 74, Metal complex 78, Metal complex 85, Metal complex 86, Metal complex 90 to Metal complex 92, Metal complex 96, Metal complex 103, Metal complex 104, Metal complex 108 to Metal complex 110, Metal complex 114 to Metal complex 116, Metal complex 120 to Metal complex 122, Metal complex 126, Metal complex 169, Metal complex 170, and Metal complex 174 each has a structure of Ir(L$_a$)(L$_b$)$_2$, wherein both of L$_b$ are identical, and L$_a$ and L$_b$ respectively correspond to structures listed in the following table:

| Metal Complex | L$_a$ | L$_b$ | Metal Complex | L$_a$ | L$_b$ |
|---|---|---|---|---|---|
| 1 | L$_{a9}$ | L$_{b18}$ | 2 | L$_{a9}$ | L$_{b184}$ |
| 5 | L$_{a9}$ | L$_{b152}$ | | | |
| 7 | L$_{a132}$ | L$_{b18}$ | 8 | L$_{a132}$ | L$_{b184}$ |
| 11 | L$_{a132}$ | L$_{b152}$ | | | |
| 25 | L$_{a261}$ | L$_{b184}$ | 26 | L$_{a261}$ | L$_{b18}$ |
| | | | 30 | L$_{a261}$ | L$_{b152}$ |
| 49 | L$_{a405}$ | L$_{b184}$ | 50 | L$_{a405}$ | L$_{b18}$ |
| | | | 54 | L$_{a405}$ | L$_{b152}$ |
| 61 | L$_{a513}$ | L$_{b184}$ | 62 | L$_{a513}$ | L$_{b18}$ |
| | | | 66 | L$_{a513}$ | L$_{b152}$ |
| 73 | L$_{a609}$ | L$_{b184}$ | 74 | L$_{a609}$ | L$_{b18}$ |
| | | | 78 | L$_{a609}$ | L$_{b152}$ |
| 85 | L$_{a695}$ | L$_{b184}$ | 86 | L$_{a695}$ | L$_{b18}$ |
| | | | 90 | L$_{a695}$ | L$_{b152}$ |
| 91 | L$_{a709}$ | L$_{b184}$ | 92 | L$_{a709}$ | L$_{b18}$ |
| | | | 96 | L$_{a709}$ | L$_{b152}$ |
| 103 | L$_{a769}$ | L$_{b184}$ | 104 | L$_{a769}$ | L$_{b18}$ |
| | | | 108 | L$_{a769}$ | L$_{b152}$ |
| 109 | L$_{a839}$ | L$_{b184}$ | 110 | L$_{a839}$ | L$_{b18}$ |
| | | | 114 | L$_{a839}$ | L$_{b152}$ |
| 115 | L$_{a929}$ | L$_{b184}$ | 116 | L$_{a929}$ | L$_{b18}$ |
| | | | 120 | L$_{a929}$ | L$_{b152}$ |
| 121 | L$_{a1018}$ | L$_{b184}$ | 122 | L$_{a1018}$ | L$_{b18}$ |
| | | | 126 | L$_{a1018}$ | L$_{b152}$ |
| 169 | L$_{a1305}$ | L$_{b184}$ | 170 | L$_{a1305}$ | L$_{b18}$ |
| | | | 174 | L$_{a1305}$ | L$_{b152}$ | wherein Metal complex 181, Metal complex 182, Metal complex 187, Metal complex 188, Metal complex 191, Metal complex 192, Metal complex 197, Metal complex 198, Metal complex 202, and Metal complex 203 each has a structure of Ir(L$_a$)(L$_b$)$_2$, wherein both of L$_b$ are different, and L$_a$ and L$_b$ respectively correspond to structures listed in the following table:

| Metal Complex | L$_a$ | L$_b$ | L$_b$ | Metal Complex | L$_a$ | L$_b$ | L$_b$ |
|---|---|---|---|---|---|---|---|
| 181 | L$_{a132}$ | L$_{b152}$ | L$_{b18}$ | 182 | L$_{a132}$ | L$_{b152}$ | L$_{b184}$ |
| 187 | L$_{a405}$ | L$_{b152}$ | L$_{b18}$ | 188 | L$_{a405}$ | L$_{b152}$ | L$_{b184}$ |
| 191 | L$_{a1018}$ | L$_{b152}$ | L$_{b18}$ | 192 | L$_{a1018}$ | L$_{b152}$ | L$_{b184}$ |
| 197 | L$_{a261}$ | L$_{b152}$ | L$_{b18}$ | 198 | L$_{a261}$ | L$_{b152}$ | L$_{b184}$ |
| | | | | 202 | L$_{a839}$ | L$_{b152}$ | L$_{b184}$ |
| 203 | L$_{a839}$ | L$_{b152}$ | L$_{b18}$. | | | | |

20. A compound formulation, comprising the metal complex of claim 1.

21. An electroluminescent device, comprising an anode, a cathode, and an organic layer disposed between the anode and the cathode, wherein the organic layer comprises the metal complex of claim 1.

22. The electroluminescent device of claim 21, wherein the organic layer is a light-emitting layer and the metal complex is a light-emitting material.

23. The electroluminescent device of claim 22, wherein the light-emitting layer further comprises at least one host material; wherein the at least one host material comprises at least one chemical group selected from the group consisting of: benzene, pyridine, pyrimidine, triazine, carbazole, azacarbazole, indolocarbazole, dibenzothiophene, aza-dibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene, azaphenanthrene, and combinations thereof.

24. The electroluminescent device of claim 22, wherein the metal complex is doped as a doped material in the light-emitting layer at a weight percentage of 1‰ to 20%.

25. The electroluminescent device of claim 21, wherein the electroluminescent device emits red or white light.

26. The metal complex of claim 1, wherein R$_{Ar}$ is selected from hydrogen, deuterium, methyl, isopropyl, t-butyl, cyclopentyl, cyclohexyl, phenyl, or a combination thereof, and at least one R$_{Ar}$ is not hydrogen.

* * * * *